(12) United States Patent
Song et al.

(10) Patent No.: US 12,293,714 B2
(45) Date of Patent: May 6, 2025

(54) DISPLAY DEVICE

(71) Applicant: Samsung Display Co., LTD., Yongin-si (KR)

(72) Inventors: Hee Rim Song, Yongin-si (KR); Hee Jean Park, Yongin-si (KR); Yu Jin Lee, Yongin-si (KR); Cheol Gon Lee, Yongin-si (KR); Mu Kyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/108,823

(22) Filed: Feb. 13, 2023

(65) Prior Publication Data

US 2023/0343289 A1 Oct. 26, 2023

(30) Foreign Application Priority Data

Apr. 25, 2022 (KR) ........................ 10-2022-0050809

(51) Int. Cl.
*G09G 3/3233* (2016.01)
*G06V 40/13* (2022.01)
(Continued)

(52) U.S. Cl.
CPC ....... *G09G 3/3233* (2013.01); *G06V 40/1318* (2022.01); *H10K 39/34* (2023.02);
(Continued)

(58) Field of Classification Search
CPC ...... G06F 3/0412; G06F 3/0443; G06F 3/046; G06F 2203/04102; G06F 2203/04103; G06F 2203/04105; G06F 2203/04107; G06F 2203/04112; G06F 3/0446; G06F 3/045; G06V 10/17; G06V 40/1306; G06V 40/1318; H01L 27/1214; H01L 27/1222;
(Continued)

(56) References Cited

U.S. PATENT DOCUMENTS

2018/0284927 A1* 10/2018 Kim ................. H10K 59/126
2021/0200366 A1* 7/2021 Bok ................... G06V 10/17
2022/0019757 A1* 1/2022 Han ................... H10K 59/65

FOREIGN PATENT DOCUMENTS

CN 104103239 10/2014
CN 106875892 6/2017
(Continued)

*Primary Examiner* — Nelson M Rosario
(74) *Attorney, Agent, or Firm* — KILE PARK REED & HOUTTEMAN PLLC

(57) ABSTRACT

A display device includes display pixels each including a light emitting part including a light emitting element and a pixel driver applying a driving current to the light emitting element, and light sensing pixels each including a light sensing part including an optical element and a sensing driver, the sensing driver applying a sensing current to a sensing line according to a photocurrent of the optical element. The sensing driver includes a first sensing transistor controlling the sensing current flowing through the sensing line according to a voltage of a first electrode of the optical element, and a second sensing transistor initializing the first electrode of the optical element to a first level voltage. A channel layer of the first sensing transistor and a channel layer of the second sensing transistor are made of different materials.

22 Claims, 41 Drawing Sheets

(51) Int. Cl.
*H10K 39/34* (2023.01)
*H10K 59/131* (2023.01)

(52) U.S. Cl.
CPC ... *H10K 59/131* (2023.02); *G09G 2300/0426* (2013.01); *G09G 2300/0819* (2013.01); *G09G 2300/0842* (2013.01); *G09G 2310/08* (2013.01); *G09G 2360/14* (2013.01)

(58) Field of Classification Search
CPC ............ H01L 27/1225; H01L 27/1248; H01L 29/786; H01L 31/1055; H01L 31/12; H04R 7/04; H04R 1/025; H04R 2499/11; H04R 2499/15; H10K 50/844; H10K 50/856; H10K 50/868; H10K 59/1213; H10K 59/122; H10K 59/123; H10K 59/1315; H10K 59/352; H10K 59/353; H10K 59/60; H10K 59/65; H10K 59/873; H10K 59/878; H10K 59/8793; H10K 77/00
See application file for complete search history.

(56) References Cited

FOREIGN PATENT DOCUMENTS

| | | |
|---|---:|---:|
| CN | 110462837 | 11/2019 |
| KR | 10-1541886 | 8/2015 |
| KR | 10-2018-0006704 | 1/2018 |
| KR | 10-2019-0090241 | 8/2019 |
| KR | 10-2020-0034890 | 4/2020 |
| KR | 10-2021-0086907 | 7/2021 |
| KR | 10-2321652 | 11/2021 |
| KR | 10-2022-0009562 | 1/2022 |

* cited by examiner

ACT1: D4, CH4, S4, D5, CH5, S5
GTL1: G4, G5
GTL2: SHE1
ACT2: S2, CH2, D2
GTL3: G2
DTL1: BE5, BE6, BE1
DTL2: VDL, ANDE

GTL1: GBL1
GTL2: SHE1, RS2
ACT2: RD2, RCH2, RS2, GILk
GTL3: RG2
DTL1: VIL2, GWLk, RCE4", GBL2
DTL2: ANDE2"

DISPLAY DEVICE

CROSS-REFERENCE TO RELATED APPLICATION(S)

This application claims priority to and the benefits of Korean Patent Application No. 10-2022-0050809 under 35 U.S.C. § 119, filed on Apr. 25, 2022, in the Korean Intellectual Property Office (KIPO), the entire contents of which are incorporated by reference herein.

BACKGROUND

1. Technical Field

One or more embodiments of the disclosure relate to a display device.

2. Description of the Related Art

A display device is applied to various electronic devices such as a smart phone, a tablet, a notebook computer, a monitor, and a TV. Recently, due to the development of mobile communication technology, the use of portable electronic devices such as smartphones, tablets, and notebook computers has greatly increased. Since privacy information is stored in a portable electronic device, fingerprint authentication for authenticating a user's biometric fingerprint is used to protect personal information in the portable electronic device.

For example, the display device may authenticate the user's fingerprint using an optical method, an ultrasonic method, a capacitive method, or the like. The optical method may authenticate the user's fingerprint by detecting light reflected from the user's fingerprint. The display device may include a display panel including display pixels for displaying an image and light sensing pixels for sensing light in order to optically authenticate a user's fingerprint.

SUMMARY

Aspects and features of embodiments of the disclosure provide a display device capable of reducing a decrease in fingerprint sensing capability due to an off-leakage current of a reset transistor of a light sensing pixel.

However, embodiments of the disclosure are not limited to those set forth herein. The above and other embodiments of the disclosure will become more apparent to one of ordinary skill in the art to which the disclosure pertains by referencing the detailed description of the disclosure given below.

According to one or more embodiments of the disclosure, a display device may include display pixels each including a light emitting part including a light emitting element and a pixel driver applying a driving current to the light emitting element, and light sensing pixels each including a light sensing part including an optical element and a sensing driver, the sensing driver applying a sensing current to a sensing line according to a photocurrent of the optical element. The sensing driver may include a first sensing transistor controlling the sensing current flowing through the sensing line according to a voltage of a first electrode of the optical element, and a second sensing transistor initializing the first electrode of the optical element to a first level voltage. A channel layer of the first sensing transistor and a channel layer of the second sensing transistor may be made of different materials.

The channel layer of the first sensing transistor may be made of polysilicon, and the channel layer of the second sensing transistor may be made of an oxide semiconductor.

The first sensing transistor may be formed of a P-type MOSFET, and the second sensing transistor may be formed of an N-type MOSFET.

The sensing driver may further include a third sensing transistor applying the sensing current of the first sensing transistor to the sensing line. A channel layer of the third sensing transistor and the channel layer of the second sensing transistor may be made of a same material.

The channel layer of the third sensing transistor may be formed of an oxide semiconductor.

The third sensing transistor may be formed of an N-type MOSFET.

The display device may further include scan write lines to which scan write signals are respectively applied, scan initialization lines to which scan initialization signals are respectively applied, and scan control lines to which scan control signals are respectively applied. The second sensing transistor may electrically connect the first electrode of the optical element to a k-1$^{th}$ scan initialization line among the scan initialization lines according to a k$^{th}$ scan control signal of a k$^{th}$ (k is a positive integer of 2 or more) scan control line.

The third sensing transistor may electrically connect a first electrode of the first sensing transistor to the sensing line according to a k$^{th}$ scan initialization signal of a k$^{th}$ scan initialization line among the scan initialization lines.

The pixel driver may include a driving transistor controlling the driving current according to a voltage of a gate electrode of the driving transistor, a first transistor applying a data voltage of a data line to a first electrode of the driving transistor according to a k$^{th}$ scan write signal of a k$^{th}$ scan write line among the scan write lines, a second transistor electrically connecting the gate electrode of the driving transistor and a second electrode of the driving transistor according to the k$^{th}$ scan control signal of the k$^{th}$ scan control line, and a third transistor applying a first initialization voltage of a first initialization line to the gate electrode of the driving transistor according to the k$^{th}$ scan initialization signal of the k$^{th}$ scan initialization line.

The sensing driver may further include a third sensing transistor applying the sensing current of the first sensing transistor to the sensing line. A channel layer of the third sensing transistor and the channel layer of the first sensing transistor may be made of a same material.

The channel layer of the third sensing transistor may be made of polysilicon.

The third sensing transistor may be formed of a P-type MOSFET.

The display device may further include scan write lines to which scan write signals are respectively applied, scan initialization lines to which scan initialization signals are respectively applied, scan control lines to which scan control signals are respectively applied, and light emitting lines to which light emitting signals are respectively applied. The second sensing transistor may electrically connect the first electrode of the optical element to a k-1$^{th}$ scan initialization line among the scan initialization lines according to a k$^{th}$ scan control signal of a k$^{th}$ (k is a positive integer greater than or equal to 2) scan control line among the scan control lines. The third sensing transistor may electrically connect a first electrode of the first sensing transistor to the sensing line according to a k+1$^{th}$ light emitting signal of a k+1$^{th}$ light emitting line among the light emitting lines.

The pixel driver may include a driving transistor controlling the driving current according to a voltage of a gate electrode of the driving transistor, a first transistor applying a data voltage of a data line to a first electrode of the driving transistor according to a $k^{th}$ scan write signal of a $k^{th}$ scan write line among the scan write lines, a second transistor electrically connecting the gate electrode of the driving transistor and a second electrode of the driving transistor according to the $k^{th}$ scan control signal of the $k^{th}$ scan control line, a third transistor applying a first initialization voltage of a first initialization line to the gate electrode of the driving transistor according to a $k^{th}$ scan initialization signal of a $k^{th}$ scan initialization line among the scan initialization lines, and a fourth transistor electrically connecting the first electrode of the driving transistor to a first power supply line to which a first power voltage is applied according to a $k^{th}$ light emitting signal of a $k^{th}$ light emitting line among the light emitting lines.

The display device may further include scan write lines to which scan write signals are respectively applied, scan initialization lines to which scan initialization signals are respectively applied, scan control lines to which scan control signals are respectively applied, and scan bias lines to which scan bias signals are respectively applied. The second sensing transistor may electrically connect the first electrode of the optical element to a $k+1^{th}$ scan initialization line among the scan initialization lines according to a $k+1^{th}$ scan control signal of a $k+1^{th}$ (k is a positive integer greater than or equal to 2) scan control line among the scan control lines. The third sensing transistor may electrically connect a first electrode of the first sensing transistor to the sensing line according to a $k^{th}$ scan bias signal among the scan bias lines.

The pixel driver may include a driving transistor controlling the driving current according to a voltage of a gate electrode of the driving transistor, a first transistor applying a data voltage of a data line to a first electrode of the driving transistor according to a $k^{th}$ scan write signal of a $k^{th}$ scan write signal among the scan write lines, a second transistor electrically connecting the gate electrode of the driving transistor and a second electrode of the driving transistor according to a $k^{th}$ scan control signal of a $k^{th}$ scan control line among the scan control lines, a third transistor applying a first initialization voltage of a first initialization line to the gate electrode of the driving transistor according to a $k^{th}$ scan initialization signal of a $k^{th}$ scan initialization line among the scan initialization lines, and a fourth transistor applying a second initialization voltage of a second initialization line to a first electrode of the light emitting element according to the $k^{th}$ scan bias signal.

The sensing driver of one of the light sensing pixels may be disposed on a side of the pixel driver of one of the display pixels.

The display device may further include scan write lines, scan initialization lines, scan control lines, and light emitting lines extending in a first direction, and data lines and sensing lines extending in a second direction intersecting the first direction. The sensing driver and the pixel driver may overlap one of the scan write lines, one of the scan initialization lines, one of the scan control lines, and one of the light emitting lines in a third direction intersecting the first direction and the second direction. The sensing driver may overlap one of the sensing lines in the third direction. The pixel driver may overlap one of the data lines in the third direction.

The sensing driver of one of the light sensing pixels may be disposed on a side of the pixel driver of each of two display pixels that are adjacent to each other in an extension direction of the sensing line.

The display device may further include scan write lines, scan initialization lines, scan control lines, and light emitting lines extending in a first direction, and data lines and sensing lines extending in a second direction intersecting the first direction. The sensing driver may overlap two of the scan write lines, two of the scan initialization lines, two of the scan control lines, and two of the light emitting lines in a third direction intersecting the first direction and the second direction.

According to one or more embodiments of the disclosure, a display device may include scan write lines, scan initialization lines, scan control lines, and light emitting lines extending in a first direction, data lines and sensing lines extending in a second direction intersecting the first direction, display pixels each including a light emitting part including a light emitting element and a pixel driver applying a driving current to the light emitting element according to a data voltage of one of the data lines, and light sensing pixels each including a light sensing part including an optical element and a sensing driver, the sensing driver applying a sensing current to one of the sensing lines according to a photocurrent of the optical element. The sensing driver of a first light sensing pixel among the light sensing pixels may be disposed on a side of the pixel driver of a first display pixel among the display pixels. The sensing driver of the first light sensing pixel may overlap at least one of the scan write lines, at least one of the scan initialization lines, at least one of the scan control lines, at least one of the light emitting lines, and at least one of the sensing lines in a third direction intersecting the first direction and the second direction.

The pixel driver of a second display pixel among the display pixels may be disposed on another side of the pixel driver of the first display pixel. The sensing driver of a second light sensing pixel among the light sensing pixels may be disposed on a side of the pixel driver of the second display pixel.

The sensing driver of the first light sensing pixel, the sensing driver of the second light sensing pixel, the pixel driver of the first display pixel, and the pixel driver of the second display pixel may overlap a first scan write line among the scan write lines, a first scan initialization line among the scan initialization lines, a first scan control line among the scan control lines, and a first light emitting line among the light emitting lines in the third direction.

The sensing driver of a second light sensing pixel among the light sensing pixels may be disposed on another side of the pixel driver of the first display pixel. The pixel driver of a second display pixel among the display pixels may be disposed on a side of the sensing driver of the second light sensing pixel.

The pixel driver of a second display pixel among the display pixels may be disposed on a side of the sensing driver of the first light sensing pixel. The pixel driver of the first display pixel and the pixel driver of the second display pixel may be arranged in the second direction.

A length of the sensing driver of the first light sensing pixel in the second direction may be greater than a length of the pixel driver of the first display pixel and a length of the pixel driver of the second display pixel in the second direction.

The sensing driver of the first light sensing pixel may overlap a first scan write line and a second scan write line among the scan write lines, a first scan initialization line and a second scan initialization line among the scan initialization lines, a first scan control line and a second scan control line among the scan control lines, and a first light emitting line and a second light emitting line among the light emitting lines in the third direction.

The pixel driver of the first display pixel may overlap the first scan write line, the first scan initialization line, the first scan control line, and the first light emitting line in the third direction. The pixel driver of the second display pixel may overlap the second scan write line, the second scan initialization line, the second scan control line, and the second light emitting line in the third direction.

The sensing driver may include a first sensing transistor controlling the sensing current flowing through one of the sensing lines according to a voltage of a first electrode of the optical element, and a second sensing transistor initializing the first electrode of the optical element to a first level voltage.

A channel layer of the first sensing transistor and a channel layer of the second sensing transistor may be made of different materials.

According to the aforementioned and other embodiments of the disclosure, since light sensing pixels for fingerprint detection are disposed in the entire display area, the display device may perform fingerprint authentication even if the user places a finger anywhere in the display area of the display panel.

According to the aforementioned and other embodiments of the disclosure, as the sensing driver is added, despite an increase in the number of pixels per unit area of the display panel, areas of each of the first to fourth pixel may be minimized because the area of the sensing driver is minimized.

According to the aforementioned and other embodiments of the disclosure, since the second transistor and the third transistor of the pixel driver are formed of an N-type MOSFET, at least one of the second sensing transistor and the third sensing transistor may be formed of an N-type MOSFET without a separate process. Therefore, by forming at least one of the second sensing transistor and the third sensing transistor as an N-type MOSFET, it is possible to reduce the decrease of the fingerprint sensing capability due to the off-leakage current of the second sensing transistor and/or the off-leakage current of the third sensing transistor.

According to the aforementioned and other embodiments of the disclosure, the pixel driver and a sensing driver may share at least one of a scan control line, a scan initialization line, a light emitting line, and a scan bias line, a first power supply line, and a second power supply line. Therefore, there is an advantage in that there is no need for a separate wire to which a separate signal for driving the sensing driver is applied even though the sensing driver is added.

BRIEF DESCRIPTION OF THE DRAWINGS

The above and other embodiments and features of the disclosure will become more apparent by describing embodiments thereof with reference to the attached drawings.

DETAILED DESCRIPTION OF THE EMBODIMENTS

Figure 1:
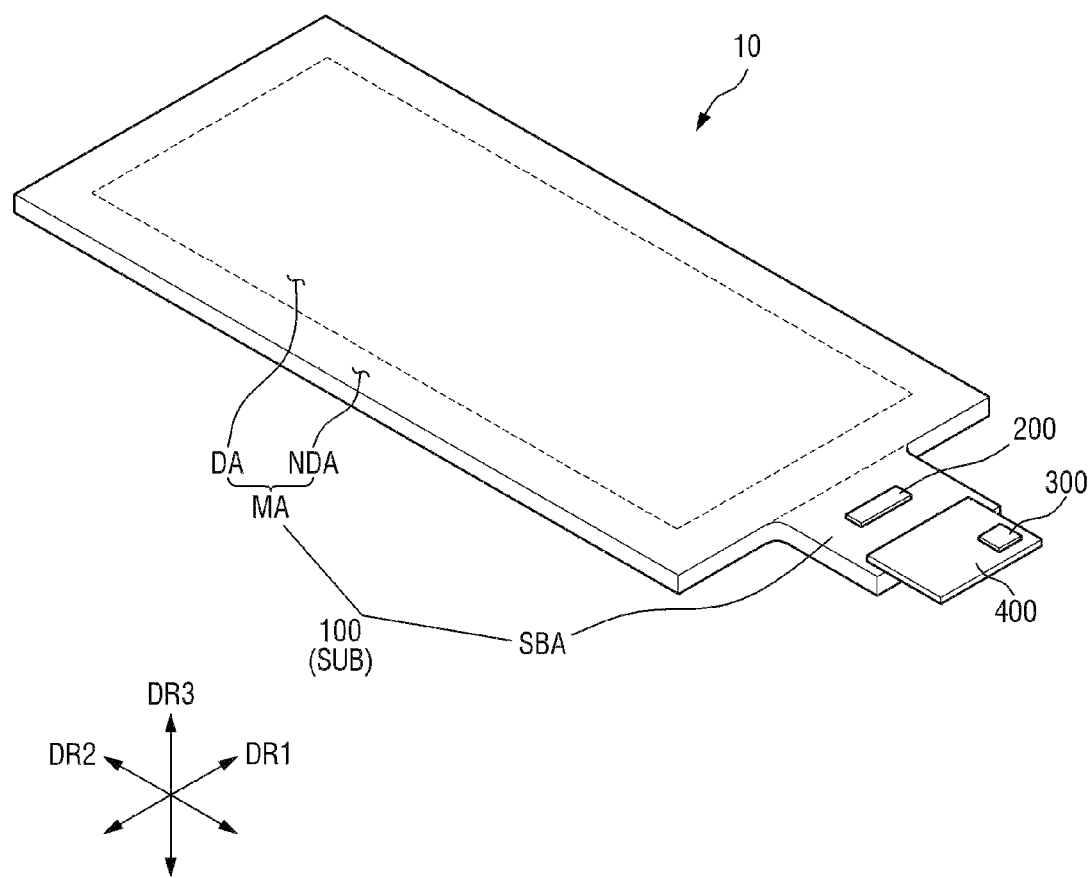
FIG. 1 is a perspective view illustrating a display device according to one or more embodiments.

Aspects and features of embodiments of the disclosure and methods of accomplishing the same may be understood more readily by reference to the detailed description of embodiments and the accompanying drawings.

Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be more thorough and complete, and will more fully convey the aspects and features of the disclosure to those skilled in the art. Accordingly, processes, elements, and techniques that are not necessary to those having ordinary skill in the art for a complete understanding of the aspects and features of the disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the disclosure. Thus, embodiments disclosed herein should not be construed as limited to the particular illustrated shapes of regions, but are to include deviations in shapes that result from, for instance, manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "in a plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," "one of," and "selected from," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." Further, the use of "may" when describing embodiments of the disclosure refers to "one or more embodiments of the disclosure".

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the disclosure.

In the disclosure, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "approximately" may mean within one or more standard deviations, or within +30%, 20%, 10%, 5% of the stated value.

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, for example, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112 (a) and 35 U.S.C. § 132 (a).

The electronic or electric devices and/or any other relevant devices or components according to embodiments of the disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the disclosure.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning for example consistent with their meaning in the context of the relevant art and/or the specification, and should not be interpreted in an idealized or overly formal sense, unless expressly so defined herein.

FIG. 1 is a perspective view illustrating a display device according to one or more embodiments.

Referring to FIG. 1, a display device 10 may be a device for displaying a moving image or a still image. The display device may be used as a display screen of various products such as televisions, laptop computers, monitors, billboards, and the Internet of Things (IoT) as well as portable electronic devices such as mobile phones, smart phones, tablet personal computer (tablet PC), smart watches, watch phones, mobile communication terminals, electronic notebooks, electronic books, portable multimedia players (PMPs), navigation systems, and ultra mobile PCs (UMPCs).

The display device 10 may be a light emitting display device such as an organic light emitting display device using an organic light emitting diode, a quantum dot light emitting display including a quantum dot light emitting layer, an inorganic light emitting display including an inorganic semiconductor, and a micro or nano light emitting display device using a micro or nano light emitting diode (micro LED or nano LED). Hereinafter, the display device 10 has been described as an organic light emitting display device, but the disclosure is not limited thereto.

The display device 10 may include a display panel 100, a display driving circuit 200, and a circuit board 400.

The display panel 100 may be formed in a rectangular plane having a short side in a first direction DR1 and a long side in a second direction DR2 intersecting the first direction DR1. A corner where a short side of the first direction DR1 and a long side of the second direction DR2 meet may be formed at a right angle or may be rounded to have a curvature. A planar shape of the display panel 100 is not limited to a quadrangle, and may be formed in other polygons, circles, or ovals. The display panel 100 may be formed to be flat but is not limited thereto. For example, the display panel 100 may include curved portions having a constant curvature or a varying curvature at left and right ends. The display panel 100 may be flexibly formed to be curved, crooked, bent, folded, or rolled.

A substrate SUB of the display panel 100 may include a main area MA and a sub area SBA.

The main area MA may include a display area DA displaying an image and a non-display area NDA that is a peripheral area of the display area DA.

The display area DA may include display pixels (PX of FIG. 2) that display an image. The display area DA may include light sensing pixels (PS of FIG. 2) that sense light to display an image and also detect a user's fingerprint. The display area DA may occupy most of the main area MA. The display area DA may be disposed in the center of the main area MA.

The non-display area NDA may be disposed adjacent to the display area DA. The non-display area NDA may be an area outside the display area DA. The non-display area NDA may be disposed to surround the display area DA. The non-display area NDA may be an edge area of the display panel 100.

The sub area SBA may protrude from one side of the main area MA in the second direction DR2. A length of the sub area SBA in the second direction DR2 may be smaller than a length of the main area MA in the second direction DR2. A length of the sub area SBA in the first direction DR1 may be less than a length of the main area MA in the first direction DR1 or may be substantially the same as the length of the main area MA in the first direction DR1.

FIG. 1 shows that a sub-region SBA is unfolded, but the sub-region SBA may be bent. Also, the sub-region SBA may overlap the main area MA after the sub-region SBA is placed under the main area MA.

The display driving circuit 200 may generate signals and voltages for driving the display panel 100. The display driving circuit 200 may be formed of an integrated circuit (IC) and may be attached to a sub-area SBA of the display panel 100 using a chip on glass (COG) method, a chip on plastic (COP) method, or an ultrasonic bonding method, but is not limited thereto. For example, the display driving circuit 200 may be attached on the circuit board 400 using a chip on film (COF) method.

A sensor driving circuit 300 may be formed of an integrated circuit (IC) and attached to the circuit board 400. The sensor driving circuit 300 may be connected to the light sensing pixels (PS of FIG. 2) through sensing lines (RL of FIG. 2). Although FIG. 1 illustrates that the sensor driving circuit 300 has a configuration separate from the display driving circuit 200, but the embodiment of the specification is not limited thereto. The sensor driving circuit 300 may be formed integrally with the display driving circuit 200.

The circuit board 400 may be attached to one end of the sub area SBA of the display panel 100. Accordingly, the circuit board 400 may be electrically connected to the display panel 100 and the display driving circuit 200. The display panel 100 and the display driving circuit 200 may receive digital video data, timing signals, and driving voltages through the circuit board 400. The circuit board 400 may be a flexible film such as a flexible printed circuit board, a printed circuit board, or a chip on film.

Figure 2:
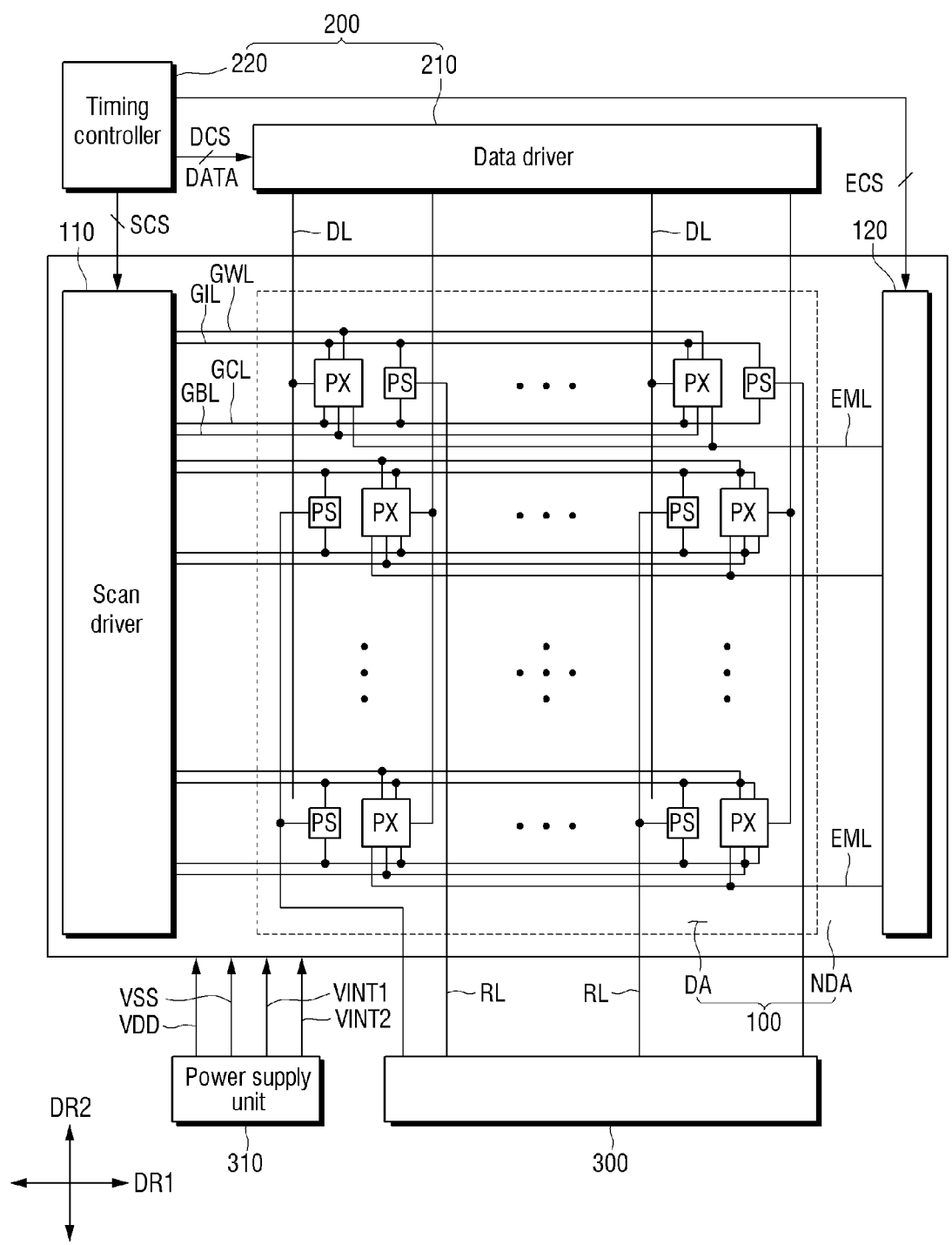
FIG. 2 is a block diagram illustrating a display device according to one or more embodiments.

FIG. 2 is a block diagram illustrating a display device according to one or more embodiments.

Referring to FIG. 2, the display device 10 according to an embodiment may include a display panel 100, a scan driving unit (or scan driver) 110, a light emitting driving unit 120, a display driving circuit 200, the sensor driving circuit 300, and a power supply unit 310. The display driving circuit 200 may include a data driving unit 210 and a timing control unit 220.

The display panel 100 may include display pixels PX, light sensing pixels PS, scan write lines GWL, scan initialization lines GIL, scan control lines GCL, scan bias lines GBL, light emitting lines EML, data lines DL, and sensing lines RL that are disposed in the display area DA. The display panel 100 may further include a scan driving unit 110 and a light emitting driving unit 120 disposed in the non-display area NDA.

The scan write lines GWL, the scan initialization lines GIL, the scan control lines GCL, and the light emitting lines EML may extend in the first direction DR1. The data lines DL and the sensing lines RL may extend in the second direction DR2.

The display pixels PX and the light sensing pixels PS may be disposed in the display area DA. Each of the display pixels PX may be connected to one of the scan write lines GWL, one of the scan initialization lines GIL, one of the scan control lines GCL, one of the scan bias lines GBL, one of the light emitting lines EML, and one of the data lines DL.

Each of the display pixels PX may be controlled by a scan write signal of the scan write line GWL, a scan initialization signal of the scan initialization line GIL, a scan control signal of the scan control line GCL, a scan bias signal of the scan bias line GBL, and light emitting signal of the light emitting line EML, and thereby may be supplied the data voltage of the data line DL and may emit light by applying a driving current to the light emitting element according to the data voltage.

Each of the light sensing pixels PS may be connected to one of the scan initialization lines GIL, one of the scan control lines GCL, and one of the sensing lines RL. Each of the light sensing pixels PS may be controlled by the scan initialization signal of the scan initialization line GIL and the scan control signal of the scan control line GCL, so that the sensing current may be applied to the sensing line RL according to the photocurrent of the optical element.

The sensor driving circuit 300 may be connected to the sensing lines RL. The sensor driving circuit 300 may sense sensing voltages charged in the sensing lines RL according to sensing currents of the light sensing pixels PS. FIG. 2 illustrates that the display driving circuit 200 is disposed above the display panel 100 and the sensor driving circuit 300 is disposed below the display panel 100, but the embodiment of the specification is not limited thereto. In case that the sensor driving circuit 300 is integrally formed with the display driving circuit 200, both the display driving circuit 200 and the sensor driving circuit 300 may be disposed above or below the display panel 100.

The scan driving unit (or scan driver) 110 may be connected to the scan write lines GWL, the scan initialization lines GIL, the scan control lines GCL, and the scan bias lines GBL. The scan driving unit 110 may receive a scan control signal SCS from the timing control unit (or timing controller) 220. The scan control signal SCS may include first to fourth scan control signals. The scan driving unit 110 may generate scan write signals according to the first scan control signal and output them to the scan write lines GWL. Also, the scan driving unit 110 may generate scan initialization signals according to the second scan control signal and output them to the scan initialization lines GIL. Also, the scan driving unit 110 may generate scan control signals according to the third scan control signal and output them to the scan control lines GCL. Furthermore, the scan driving unit 110 may generate scan bias signals according to the fourth scan control signal and output them to the scan bias lines GBL.

The light emitting driving unit (or light emitting driver) 120 may be connected to the light emitting lines EML. The light emitting driving unit 120 may receive an emitting control signal ECS from the timing control unit 220. The light emitting driving unit 120 may generate light emitting signals according to the emitting control signal ECS and output them to the display light emitting lines EML.

The data driving unit (or data driver) 210 may convert a digital video data DATA into data voltages and outputs them to the data lines DL. The data driving unit 210 may output data voltages in synchronization with the scan write signals. Therefore, the display pixels PX may be selected by the scan write signals of the scan driving unit 110, and the data voltage may be supplied to each of the selected display pixels PX.

The timing control unit 220 may receive the digital video data DATA and timing signals from an external graphic device. For example, the external graphic device may be a graphic card of a computer, a set-top box, an application processor of a smart phone or a mobile phone, and the like, but embodiments of the specification are not limited thereto.

The timing control unit 220 may generate a scan control signal SCS and an emitting control signal ECS for controlling the operation timing of the scan driving unit 110 according to the timing signals. Also, the timing control unit

220 may generate a data control signal DCS for controlling the operation timing of the data driving unit 210 according to the timing signals.

The timing control unit 220 may output the scan control signal SCS to the scan driving unit 110, and may output the emitting control signal ECS to the light emitting driving unit 120. The timing control unit 220 may output the digital video data DATA and the data control signal DCS to the data driving unit 210.

A power supply unit 310 may generate multiple driving voltages and output them to the display panel 100. A power supply unit 310 may output a first power voltage VDD, a second power voltage VSS, a first initialization voltage VINT1, and a second initialization voltage VINT2 to the display panel 100. The first power voltage VDD may be a high potential driving voltage, and the second power voltage VSS may be a low potential driving voltage.

As shown in FIG. 2, since the light sensing pixels PS for fingerprint detection are disposed in the entire display area DA, no matter where the user places the fingerprint of his or her finger in the display area DA of the display panel 100, the display device 10 may perform fingerprint authentication.

Figure 3:
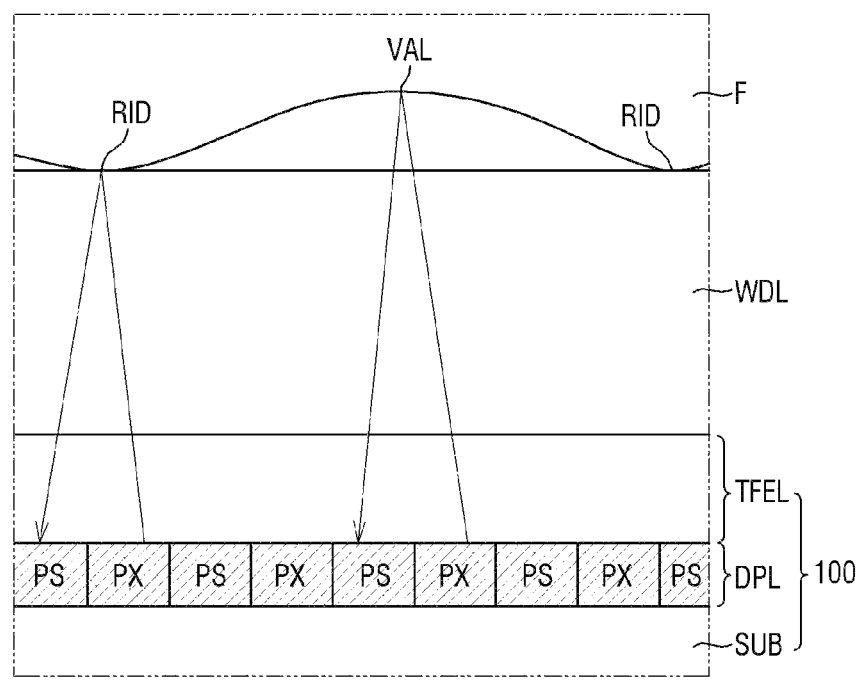
FIG. 3 is a schematic diagram illustrating fingerprint detection by a display device according to one or more embodiments.

FIG. 3 is a schematic diagram illustrating fingerprint detection by a display device according to one or more embodiments.

Referring to FIG. 3, the display device 10 may further include a cover window WDL disposed on the display panel 100. The display panel 100 may be disposed on the substrate SUB and may include a display layer DPL including display pixels PX and light sensing pixels PS, and an encapsulation layer TFEL disposed on the display layer DPL.

The light output from the display pixels PX of the display panel 100 may be reflected from a ridge RID and a valley VAL of the fingerprint of the user's finger F. The ridge RID of the fingerprint may be in contact with the cover window WDL, whereas the valley VAL of the fingerprint may not contact the cover window WDL. Therefore, the amount of light reflected from the ridge RID of the fingerprint and the amount of light reflected from the valley VAL may be different. For example, most of the light output from the display pixels PX of the display panel 100 may be reflected from the ridge RID of the fingerprint, and less reflected from the valley VAL of the fingerprint. Therefore, the light current of the optical element of a light sensing pixel PS may be different depending on whether the light is reflected from the ridge RID of the finger or the light is reflected from the valley VAL of the finger. Accordingly, the sensing current flowing to the sensing line RL may be different depending on whether the light is reflected from the ridge RID of the fingerprint of the finger F or the light is reflected from the valley VAL of the fingerprint of the finger F. Accordingly, the sensor driving circuit 300 may detect the sensing voltages charged in the sensing lines RL by the sensing current, and thus the detected fingerprint pattern may be compared with a pre-stored fingerprint pattern. For example, fingerprint authentication may be possible using the display device 10.

Figure 4A:
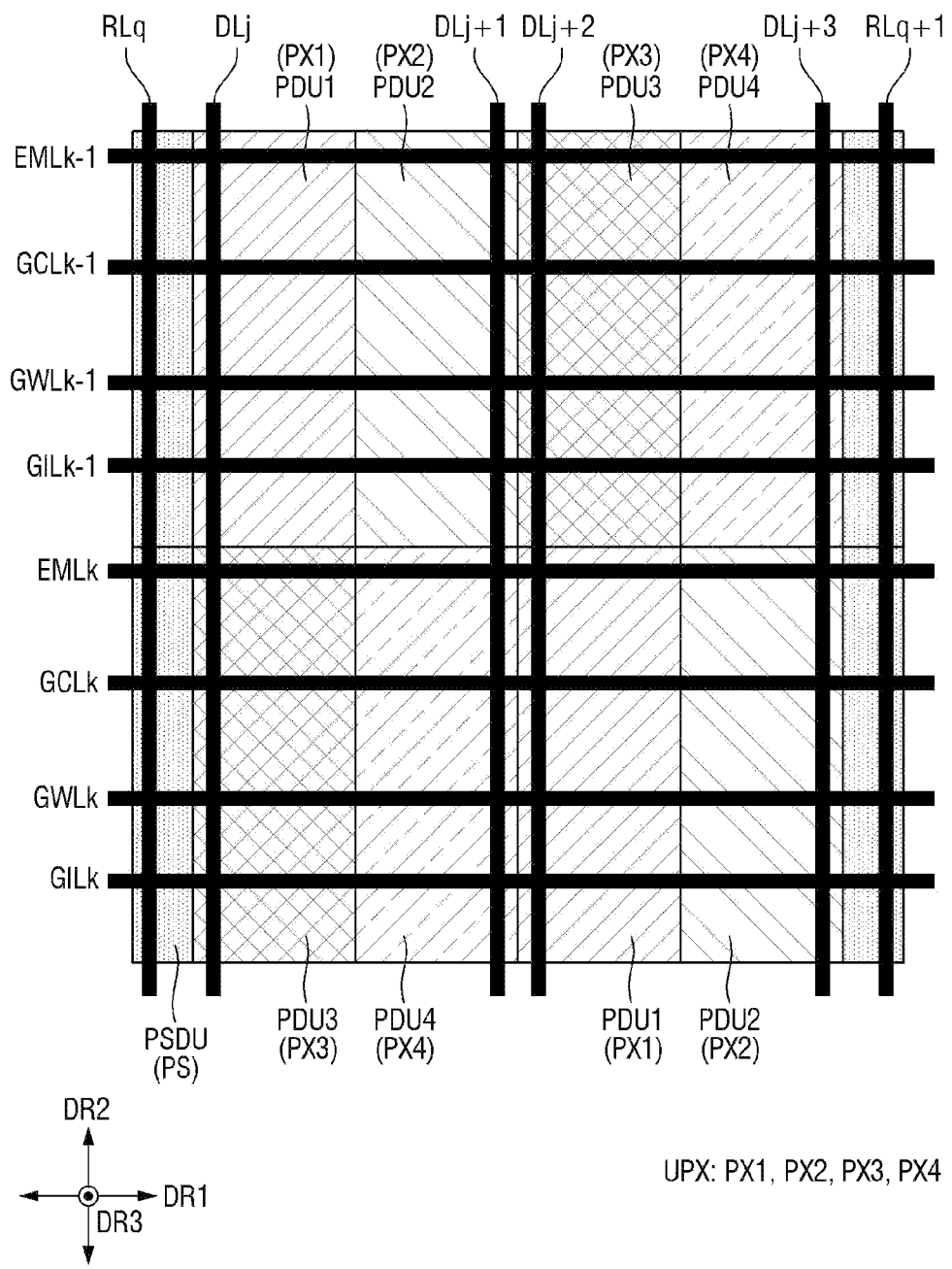
FIG. 4A is a schematic diagram illustrating pixel driving units, sensing driving data lines, and sensing lines according to one or more embodiments.
Figure 4B:
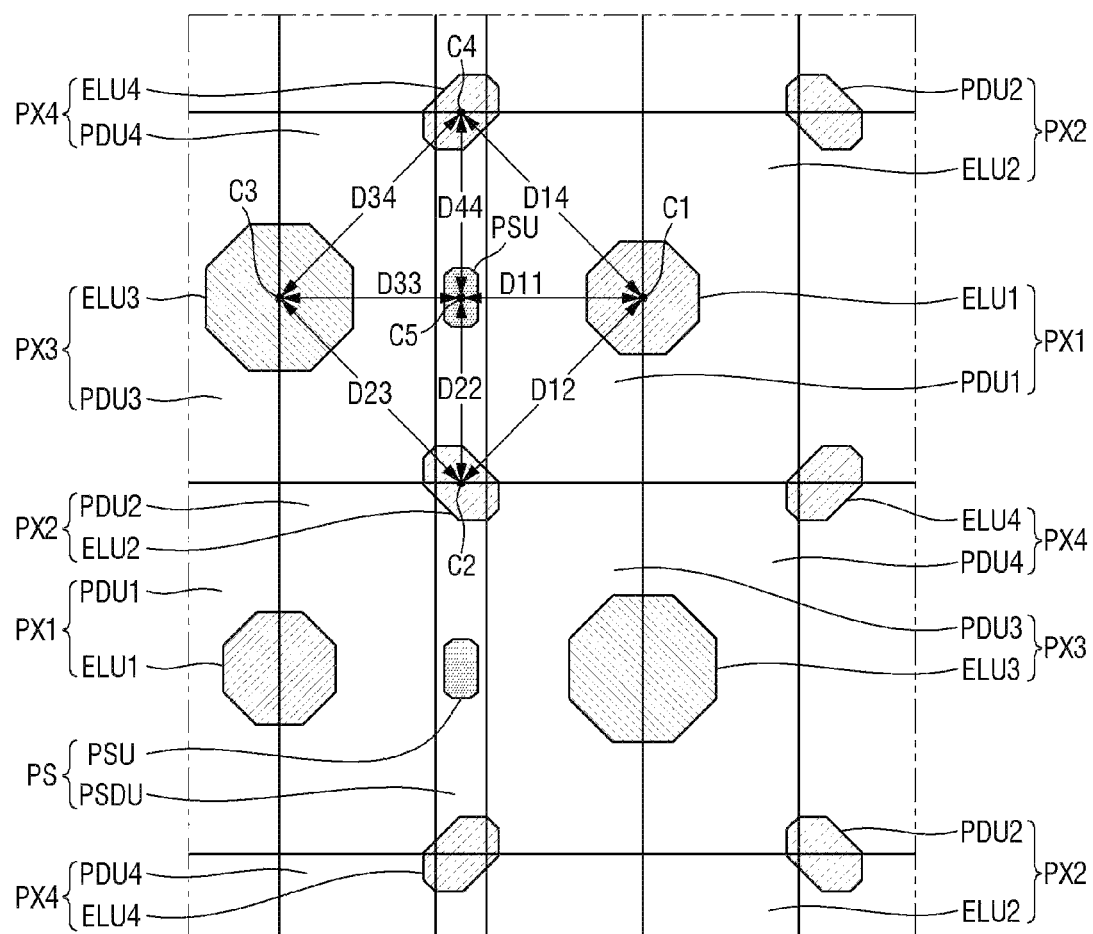
FIG. 4B is a layout diagram illustrating display pixels and light sensing pixels in a display area of a display panel according to one or more embodiments.

FIG. 4A is a schematic diagram illustrating pixel driving units, sensing driving units, scan write lines, scan initialization lines, scan control lines, light emitting lines, data lines, and sensing lines according to one or more embodiments. FIG. 4B is a layout diagram illustrating display pixels and light sensing pixels in a display area of a display panel according to one or more embodiments.

Referring to 4A and 4B, the display area DA may include a first display pixels PX1, a second display pixels PX2, a third display pixels PX3, and a fourth display pixel PX4. The display pixels PX may be divided into first display pixels PX1, second display pixels PX2, third display pixels PX3, and fourth display pixels PX4.

Each of the unit pixels UPX may include a first display pixel PX1, a second display pixel PX2, a third display pixel PX3, and a fourth display pixel PX4. The first display pixel PX1, the second display pixel PX2, the third display pixel PX3, and the fourth display pixel PX4 may be defined as a unit pixel UPX. The unit pixel UPX may be defined as the smallest unit of display pixels capable of displaying white color.

The first display pixel PX1 may include a first light emitting unit (or a first light emitting part) ELU1 that emits first light and a first pixel driving unit (or a first pixel driver) PDU1 that applies a driving current to the light emitting element of the first light emitting unit ELU1. The first light may be light of a red wavelength band. For example, the main peak wavelength of the first light may be located at approximately 600 nm to approximately 750 nm.

The second display pixel PX2 may include a second light emitting unit (or a second light emitting part) ELU2 that emits second light and a second pixel driving unit (or a second pixel driver) PDU2 that applies a driving current to the light emitting element of the second light emitting unit ELU2. The second light may be light of a green wavelength band. For example, the main peak wavelength of the second light may be located at approximately 480 nm to approximately 560 nm.

The third display pixel PX3 may include a third light emitting unit (or a third light emitting part) ELU3 that emits a third light and a third pixel driving unit (or a third pixel driver) PDU3 that applies a driving current to the light emitting device of the third light emitting unit ELU3. The third light may be light of a blue wavelength band. For example, the main peak wavelength of the third light may be located at approximately 370 nm to approximately 460 nm.

The fourth display pixel PX4 may include a fourth light emitting unit (or a fourth light emitting part) ELU4 that emits the second light and a fourth pixel driving unit (or a fourth pixel driver) PDU4 that applies a driving current to the light emitting element of the fourth light emitting unit ELU4.

In the unit display pixel UPX, the first pixel driving unit PDU1 and the second pixel driving unit PDU2 may be arranged in the first direction DR1, and the third pixel driving unit PDU3 and the fourth pixel driving unit PDU4 may be arranged in the first direction DR1. In the unit pixel UPX, the first pixel driving unit PDU1 and the third pixel driving unit PDU3 may be arranged in the second direction DR2, and the second pixel driving unit PDU2 and the fourth pixel driving unit PDU4 may be arranged in the second direction DR2.

The first light emitting unit ELU1 may overlap the first pixel driving unit PDU1 and the second pixel driving unit PDU2, and the third light emitting unit ELU3 may overlap the third pixel driving unit PDU3 and the fourth pixel driving unit PDU4. Each of the second light emitting unit ELU2 and the fourth light emitting unit ELU4 may overlap the first to fourth pixel driving units PDU1, PDU2, PDU3, and PDU4 and the sensing driving unit PSDU.

The first light emitting unit ELU1, the second light emitting unit ELU2, the third light emitting unit ELU3, and the fourth light emitting unit ELU4 may have an octagonal planar shape but are not limited thereto. The first light emitting unit ELU1, the second light emitting unit ELU2, the third light emitting unit ELU3, and the fourth light emitting unit ELU4 may have a rectangular planar shape such as a rhombus, or a polygonal planar shape other than a square and an octagon.

Each of the light sensing pixels PS may include a light sensing unit (or a light sensing part) PSU and a sensing driving unit (or a sensing driver) PSDU. The light sensing unit PSU may be disposed between the first light-emitting unit ELU1 and the third light-emitting unit ELU3 adjacent in the first direction DR1, and may be disposed between the second light-emitting unit ELU2 and the fourth light-emitting unit ELU4 adjacent in the second direction DR2. The light sensing unit PSU may overlap the sensing driving unit PSDU.

Each of the light sensing units PSU may have an octagonal planar shape but is not limited thereto. Each of the light sensing units PSU may have a rectangular planar shape such as a rhombus, or a polygonal planar shape other than a quadrangle and an octagon.

Due to the arrangement position and planar shape of the first light emitting unit ELU1, the second light emitting unit ELU2, the third light emitting unit ELU3, and the fourth light emitting unit ELU4, a distance D12 between the center C1 of the first light emitting units ELU1 and the center C2 of the second light emitting units ELU2 adjacent to each other, a distance D23 between the center C2 of the second light emitting units ELU2 and the center C3 of the third light emitting unit ELU3 adjacent to each other, a distance D14 between the center C1 of the first light emitting unit ELU1 and the center C4 of the fourth light emitting unit ELU4 adjacent to each other, and a distance D34 between the center C3 of the third light emitting unit ELU3 and the center C4 of the fourth light emitting unit ELU4 adjacent to each other may be substantially the same.

Due to the arrangement position and planar shape of the first light emitting unit ELU1, the second light emitting unit ELU2, the third light emitting unit ELU3, the fourth light emitting unit ELU4, and the light sensing unit PSU, a distance D11 between the center C1 of the first light emitting units ELU1 and the center C5 of the light sensing unit PSU adjacent to each other, a distance D22 between the center C2 of the second light emitting unit ELU2 and the center C5 of the light sensing unit PSU adjacent to each other, a distance D33 between the center C3 of the third light emitting unit ELU3 and the center C5 of the light sensing unit PSU adjacent to each other, and a distance D44 between the center C4 of the fourth light emitting unit ELU4 and the center C5 of the light sensing unit PSU adjacent to each other may be substantially the same.

The scan write lines GWLk−1 and GWLk, the scan initialization lines GILk-1 and GILk, the scan control lines GCLk-1 and GCLK, and the light emitting lines EMLk-1 and EMLk may extend in the direction DR1. The data lines DLj, DLj+1, DLj+2, and DLj+3 and the sensing lines RLq and RLq+1 may extend in the second direction DR2.

Each of the sensing driving unit PSDU may overlap one of the scan write lines GWLk−1 and GWLk, one of the scan initialization lines GILk-1 and GILk, one of the scan control lines GCLk-1 and GCLk, one of the light emitting lines EMLk-1 and EMLk, and one of the sensing lines RLq and RLq+1. Each of the first to fourth pixel driving units PDU1, PDU2, PDU3, and PDU4 may overlap one of the scan write lines GWLk−1 and GWLk, one of the scan initialization lines GILk-1 and GILk, one of the scan control lines GCLk-1 and GCLk, one of the light emitting lines EMLk-1 and EMLk, and one of the data lines DLj, DLj+1, DLj+2, DLj+3.

The sensing driving unit PSDU may be disposed between the first pixel driving unit PDU1 and the fourth pixel driving unit PDU4 in the first direction DR1. For example, the sensing driving unit PSDU and the pixel driving units PDU1, PDU2, PDU3, and PDU4 may be repeatedly arranged in the order of the sensing driving unit PSDU, the first pixel driving unit PDU1, the second pixel driving unit PDU2, the third pixel driving unit PDU3, and the fourth pixel driving unit PDU4 in the first direction DR1.

The sensing driving unit PSDU may extend in the second direction DR2. The first pixel driving unit PDU1 and the third pixel driving unit PDU3 may be alternately disposed in the second direction DR2. The second pixel driving unit PDU2 and the fourth pixel driving unit PDU4 may be alternately disposed in the second direction DR2.

Figure 4C:
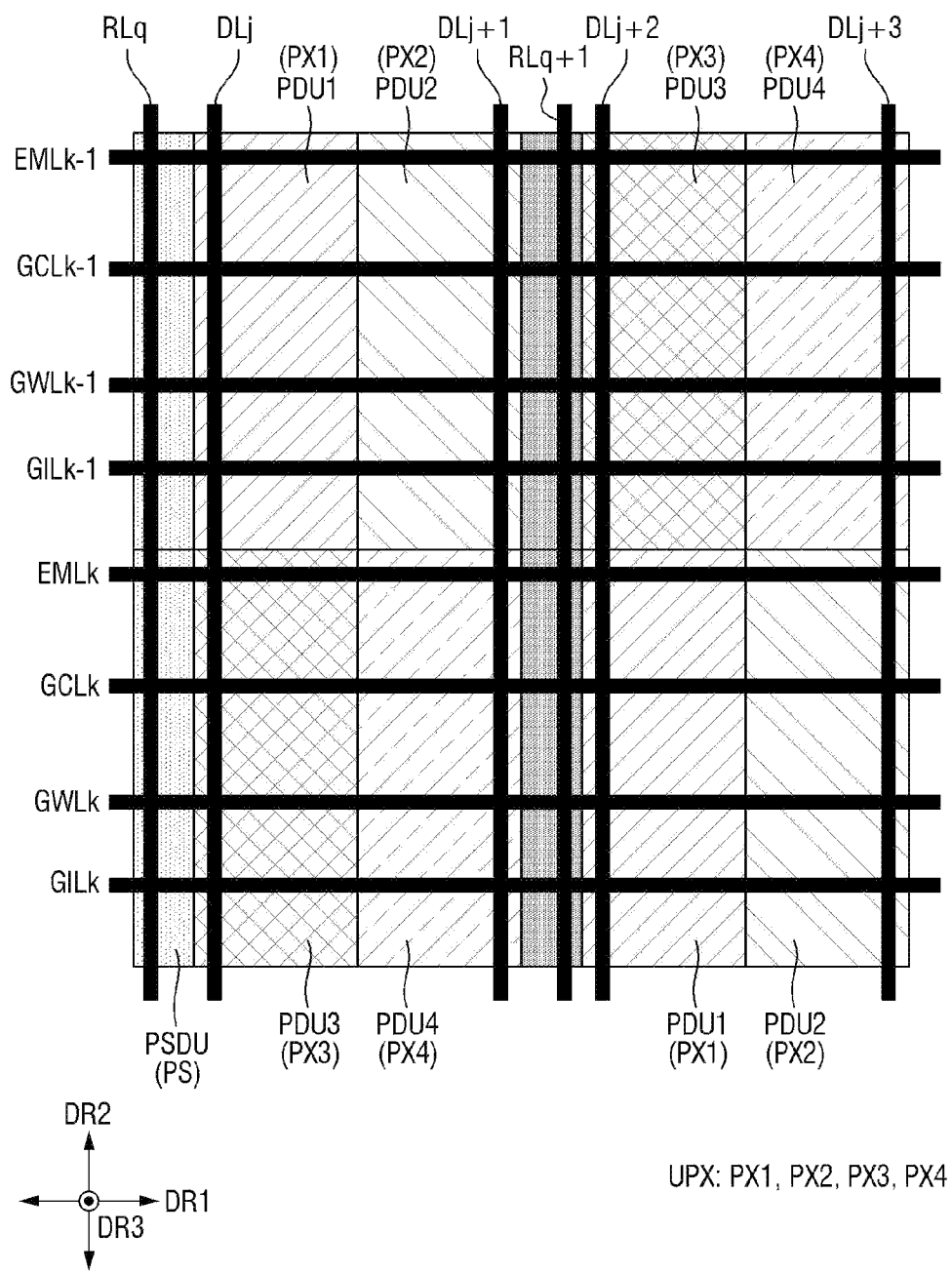
FIG. 4C is a schematic diagram illustrating pixel driving units, sensing driving units, scan write lines, scan initialization lines, scan control lines, light emitting lines, data lines, and sensing lines according to one or more embodiments.
Figure 4D:
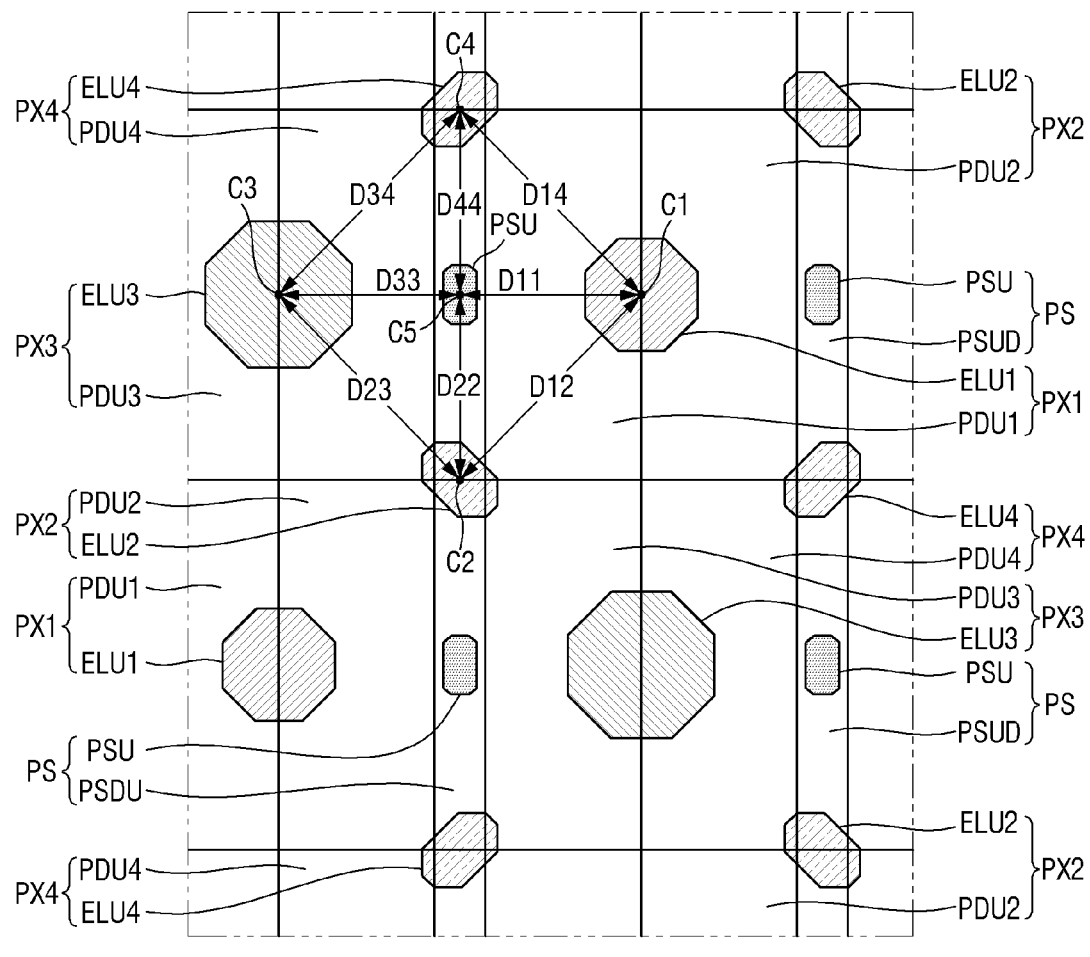
FIG. 4D is a layout diagram illustrating display pixels and light sensing pixels in a display area of a display panel according to one or more embodiments.

FIG. 4C is a schematic diagram illustrating pixel driving units, sensing driving units, scan write lines, scan initialization lines, scan control lines, light emitting lines, data lines, and sensing lines according to one or more embodiments. FIG. 4D is a layout diagram illustrating display pixels and light sensing pixels in a display area of a display panel according to one or more embodiments.

The embodiment of FIGS. 4C and 4D is different from the embodiment of FIGS. 4A and 4B in that the arrangement positions of the sensing driving unit PDU are changed. In FIGS. 4C and 4D, descriptions overlapping those of the embodiment of FIGS. 4A and 4B will be omitted.

Referring to 4C and 4D, the sensing driving unit PSDU may be disposed between the first pixel driving unit PDU1 and the fourth pixel driving unit PDU4 in the first direction DR1 or between the second pixel driving unit PDU2 and the third pixel driving unit PDU3 in the first direction DR1. For example, the sensing driving unit PSDU and the pixel driving units PDU1, PDU2, PDU3, and PDU4 may be repeatedly arranged in the order of the sensing driving unit PSDU, the first pixel driving unit PDU1, the second pixel driving unit PDU2, the sensing driving unit PSDU, the third pixel driving unit PDU3 and the fourth pixel driving unit PDU4 in the first direction DR1.

Figure 4E:
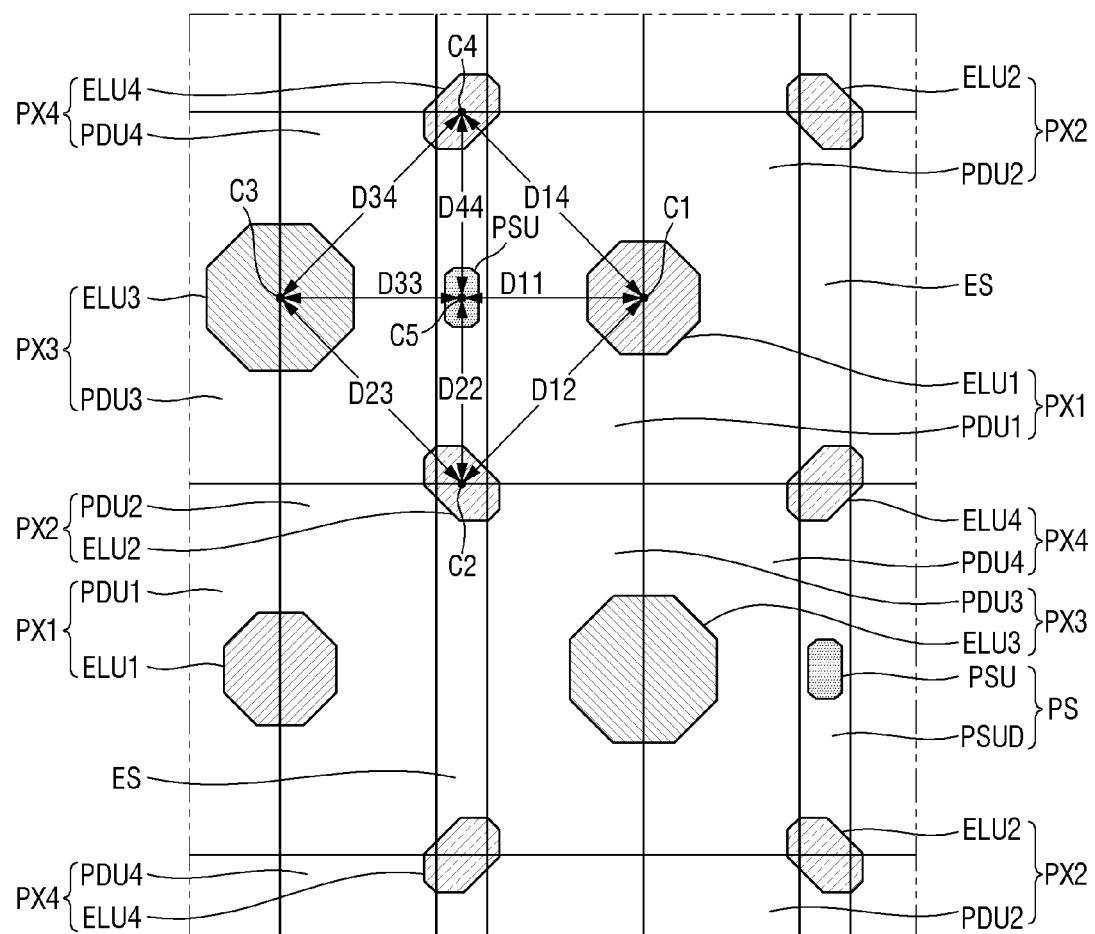
FIG. 4E is a schematic diagram illustrating pixel driving units, sensing driving units, scan write lines, scan initialization lines, scan control lines, light emitting lines, data lines, and sensing lines according to one or more embodiments.
Figure 4F:
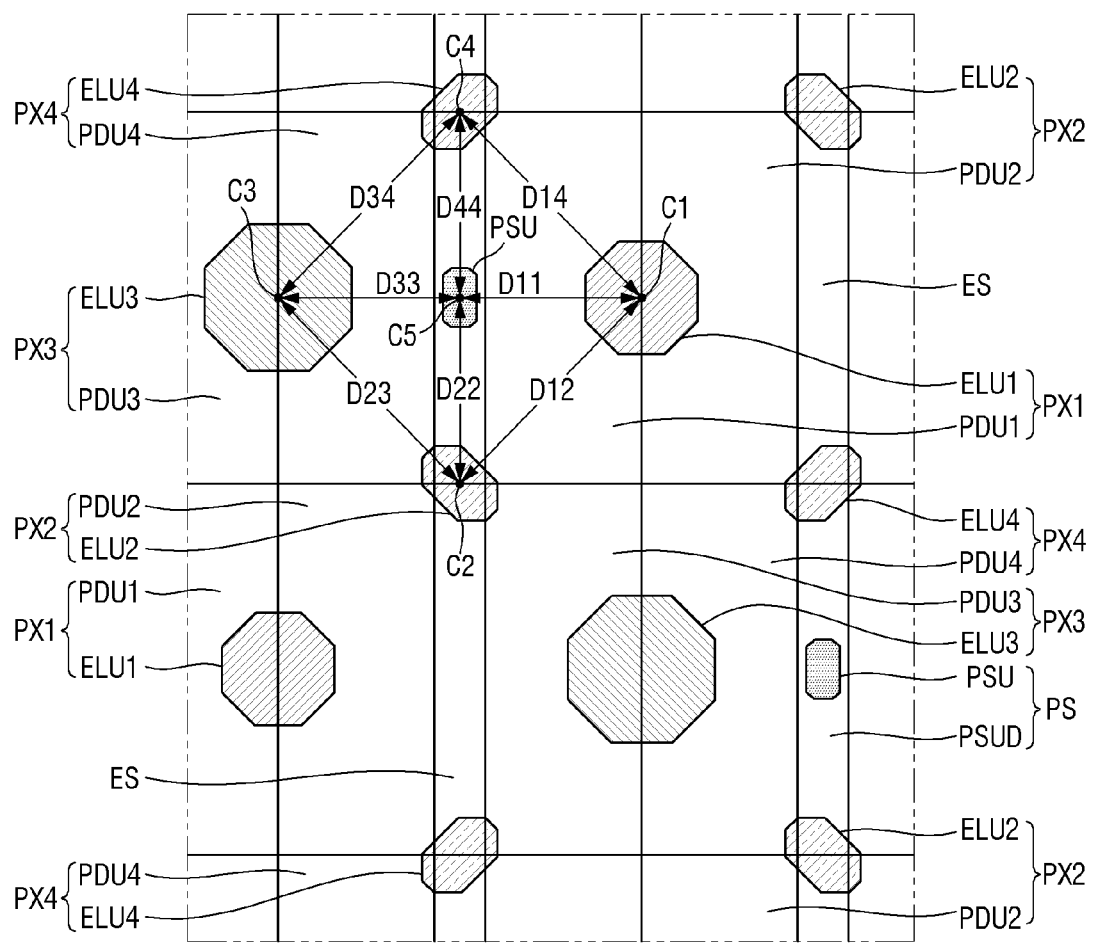
FIG. 4F is a layout diagram illustrating display pixels and light sensing pixels in a display area of a display panel according to one or more embodiments.

FIG. 4E is a schematic diagram illustrating pixel driving units, sensing driving units, scan write lines, scan initialization lines, scan control lines, light emitting lines, data lines, and sensing lines according to one or more embodiments. FIG. 4F is a layout diagram illustrating display pixels and light sensing pixels in a display area of a display panel according to one or more embodiments.

The embodiment of FIGS. 4E and 4F is different from the embodiment of FIGS. 4C and 4D in that empty spaces ES are disposed instead of some of the sensing driving units PDU. In FIGS. 4E and 4F, descriptions overlapping those of the embodiment of FIGS. 4C and 4D will be omitted.

Referring to 4E and 4F, the empty spaces ES may be spaces in which the first to fourth pixel driving units PDU1, PDU2, PDU3, and PDU4 and the sensing driving unit PSDU are not disposed. The empty space ES may be disposed between the second pixel driving unit PDU2 and the third pixel driving unit PDU3 in the first direction DR1. The empty space ES may be disposed between the sensing driving unit PSDU adjacent to each other in the second direction DR2.

The sensing driving unit PSDU may be surrounded by the second pixel driving unit PDU2, the third pixel driving unit PDU3, and the empty spaces ES. The sensing driving unit PSDU may be disposed between adjacent empty spaces ES in the second direction DR2.

The sensing driving units PSDU, the pixel driving units PDU1, PDU2, PDU3, and PDU4, and the empty space ES may be repeatedly arranged in the order of the sensing driving unit PSDU, the first pixel driving unit PDU1, the second pixel driving unit PDU2, the empty space ES, the third pixel driving unit PDU3 and the fourth pixel driving unit PDU4 in the first direction DR1. Also, the sensing driving unit PSDU and the empty space ES may be repeatedly disposed in the second direction DR2.

Figure 5A:
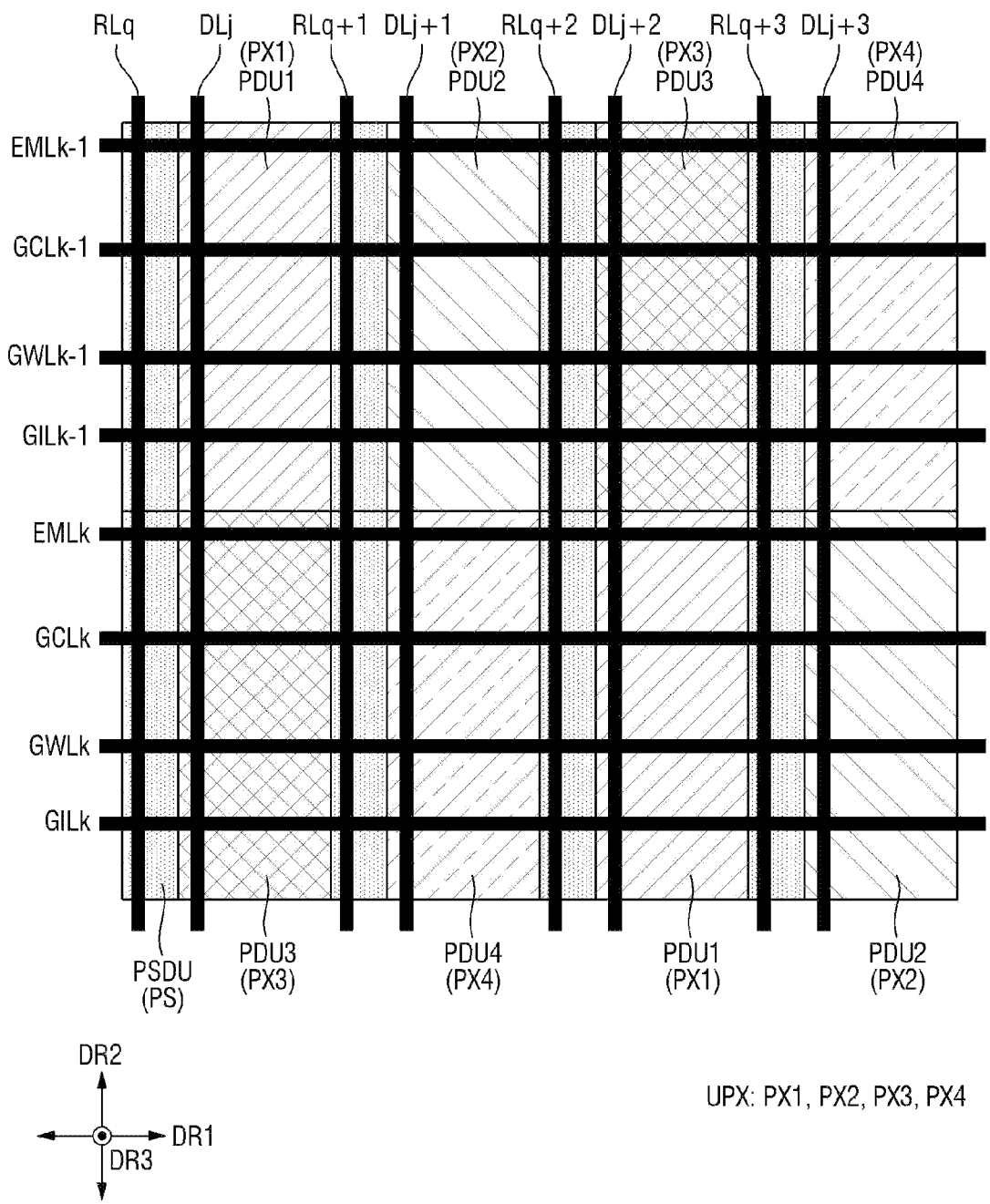
FIG. 5A is a schematic diagram illustrating pixel driving units, sensing driving units, scan write lines, scan initialization lines, scan control lines, light emitting lines, data lines, and sensing lines according to one or more embodiments.

FIG. 5A is a schematic diagram illustrating pixel driving units, sensing driving units, scan write lines, scan initialization lines, scan control lines, light emitting lines, data lines, and sensing lines according to one or more embodiments.

The embodiment of FIG. 5A is different from the embodiment of FIG. 4A in that the sensing driving unit PSDU are arranged to correspond to the pixel driving units PDU1, PDU2, PDU3, and PDU4 one-to-one. In FIG. 5A, a description overlapping with the embodiment of FIG. 4A will be omitted.

Referring to FIG. 5A, the sensing driving units PSDU may be disposed between adjacent pixel driving units PDU1, PDU2, PDU3, and PDU4 in the first direction DR1. For example, the sensing driving unit PSDU may be disposed between the first pixel driving unit PDU1 and the second pixel driving unit PDU2 in the first direction DR1, between the second pixel driving unit PDU2 and the third pixel driving unit PDU3 in the first direction DR1, between the third pixel driving unit PDU3 and the fourth pixel driving unit PDU4 in the first direction DR1, and between the first pixel driving unit PDU1 and the fourth pixel driving unit PDU4 in the first direction DR1. For example, the sensing driving unit PSDU and the pixel driving units PDU1, PDU2, PDU3, and PDU4 may be repeatedly arranged in the order of the sensing driving unit PSDU, the first pixel driving unit PDU1, the sensing driving unit PSDU, the second pixel driving unit PDU2, the sensing driving unit PSDU, the third pixel driving unit PDU3, the sensing driving unit PSDU, and the fourth pixel driving unit PDU4 in the first direction DR1.

Figure 5B:
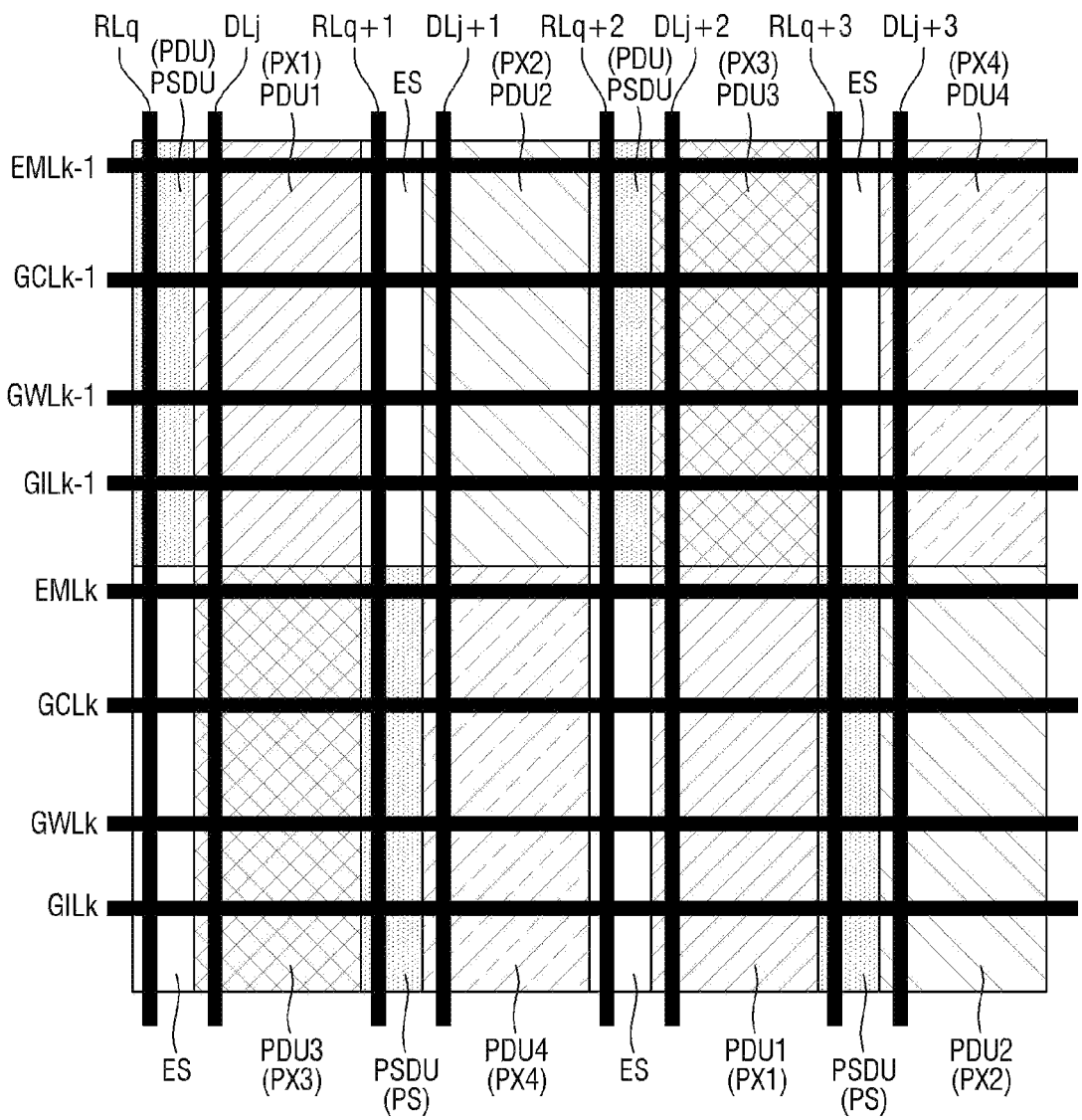
FIG. 5B is a schematic diagram illustrating pixel driving units, sensing driving units, scan write lines, scan initialization lines, scan control lines, light emitting lines, data lines, and sensing lines according to one or more embodiments.

FIG. 5B is a schematic diagram illustrating pixel driving units, sensing driving data lines, and sensing lines according to one or more embodiments.

The embodiment of FIG. 5B is different from the embodiment of FIG. 5A in that empty spaces ES are disposed instead of some of the sensing driving units PDU. In FIG. 5B, a description overlapping with the embodiment of FIG. 5A will be omitted.

Referring to FIG. 5B, the empty spaces ES may be spaces in which the first to fourth pixel driving units PDU1, PDU2, PDU3, and PDU4 and the sensing driving unit PSDU are not disposed. The empty space ES may be disposed between the first pixel driving unit PDU1 and the second pixel driving unit PDU2 or between the third pixel driving unit PDU3 and the fourth pixel driving unit PDU4 in the first direction DR1. The empty space ES may be disposed between the sensing driving units PSDU adjacent to each other in the second direction DR2.

The sensing driving unit PSDU may be surrounded by the second pixel driving unit PDU2, the third pixel driving unit PDU3, and the empty spaces ES. The sensing driving unit PSDU may be disposed between adjacent empty spaces ES in the second direction DR2.

The sensing driving units PSDU, the pixel driving units PDU1, PDU2, PDU3, and PDU4, and the empty space ES may be repeatedly arranged in the order of the sensing driving unit PSDU, the first pixel driving unit PDU1, the empty space ES, the second pixel driving unit PDU2, the sensing driving unit PSDU, the third pixel driving unit PDU3, the empty space ES, and the fourth pixel driving unit PDU4 in the first direction DR1. Also, the sensing driving unit PSDU and the empty space ES may be repeatedly disposed in the second direction DR2.

Figure 6A:
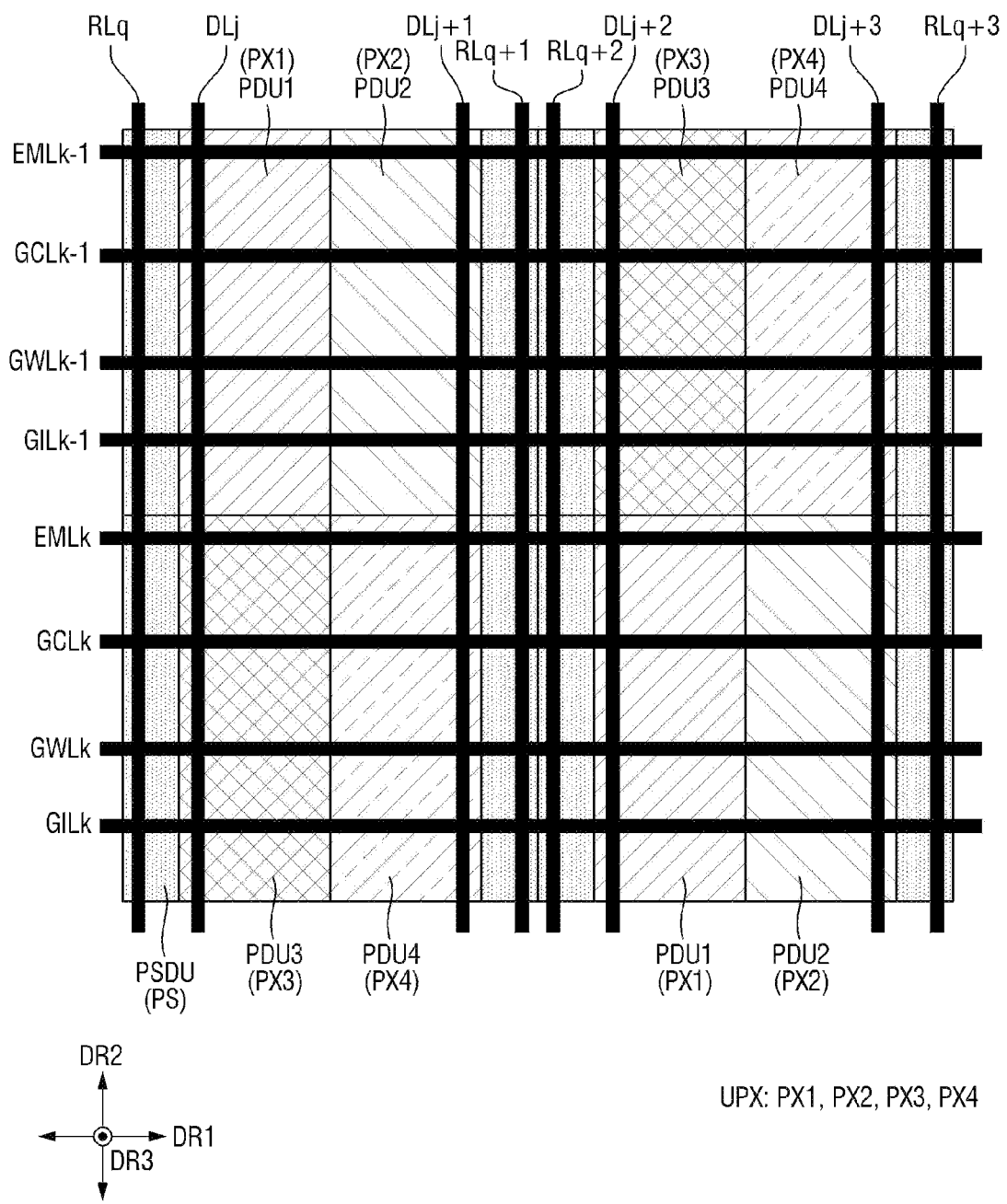
FIG. 6A is a schematic diagram illustrating pixel driving units, sensing driving units, scan write lines, scan initialization lines, scan control lines, light emitting lines, data lines, and sensing lines according to one or more embodiments.

FIG. 6A is a schematic diagram illustrating pixel driving units, sensing driving units, scan write lines, scan initialization lines, scan control lines, light emitting lines, data lines, and sensing lines according to one or more embodiments.

The embodiment of FIG. 6A is different from the embodiment of FIG. 4A in that the sensing driving units PSDU are arranged to correspond to the pixel driving units DU1, PDU2, PDU3, and PDU4 one-to-one. In FIG. 6A, a description overlapping with the embodiment of FIG. 4A will be omitted.

Referring to FIG. 6A, the two sensing driving units PSDU may be disposed between the first pixel driving unit PDU1 and the fourth pixel driving unit PDU4 in the first direction DR1 or between the second pixel driving unit PDU2 and the third pixel driving unit PDU3 in the first direction DR1. For example, the sensing driving units PSDU and the pixel driving units PDU1, PDU2, PDU3, and PDU4 may be repeatedly arranged in the order of the sensing driving unit PSDU, the first pixel driving unit PDU1, the second pixel driving unit PDU2, the sensing driving unit PSDU, the sensing driving unit PSDU, the third pixel driving unit PDU3, the fourth pixel driving unit PDU4, and the sensing driving unit PSDU in the first direction DR1.

Figure 6B:
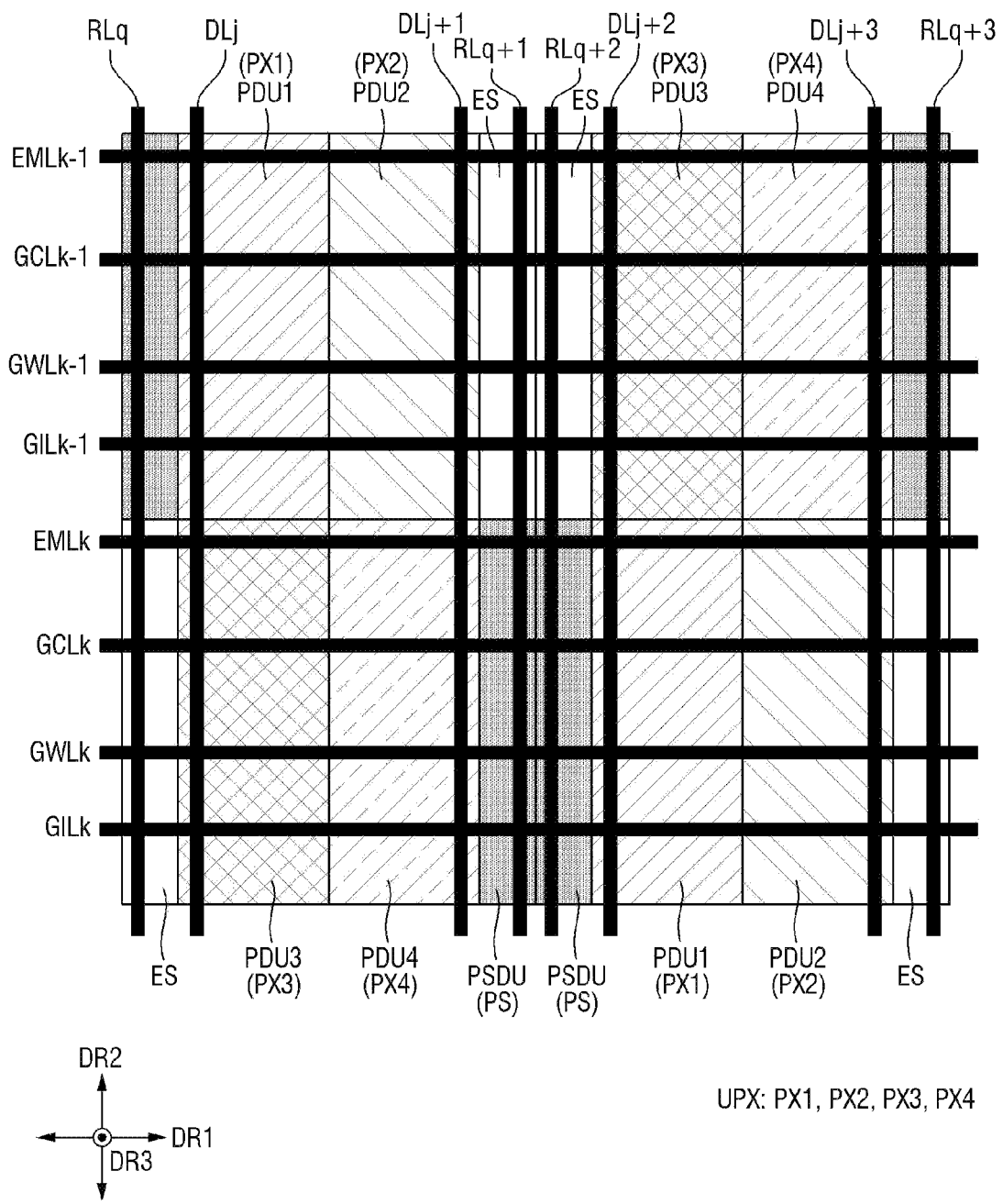
FIG. 6B is a schematic diagram illustrating pixel driving units, sensing driving units, scan write lines, scan initialization lines, scan control lines, light emitting lines, data lines, and sensing lines according to one or more embodiments.

FIG. 6B is a schematic diagram illustrating pixel driving units, sensing driving units, scan write lines, scan initialization lines, scan control lines, light emitting lines, data lines, and sensing lines according to one or more embodiments.

The embodiment of FIG. 6B is different from the embodiment of FIG. 6A in that empty spaces ES are disposed instead of some of the sensing driving units PDU. In FIG. 6B, a description overlapping with the embodiment of FIG. 6A will be omitted.

Referring to FIG. 6B, the empty spaces ES may be spaces in which the first to fourth pixel driving units PDU1, PDU2, PDU3, and PDU4 and the sensing driving unit PSDU are not disposed. The empty space ES may be disposed between the second pixel driving unit PDU2 and the third pixel driving unit PDU3 in the first direction DR1. The empty space ES may be disposed between the sensing driving units PSDU adjacent to each other in the second direction DR2.

The sensing driving unit PSDU may be surrounded by the first pixel driving unit PDU1, the fourth pixel driving unit PDU4, and the empty spaces ES. The sensing driving unit PSDU may be disposed between adjacent empty spaces ES in the second direction DR2.

The sensing driving units PSDU, the pixel driving units PDU1, PDU2, PDU3, and PDU4, and the empty spaces ES may be repeatedly arranged in the order of the sensing driving unit PSDU, the first pixel driving unit PDU1, the second pixel driving unit PDU2, the empty spaces ES, the third pixel driving unit PDU3, the fourth pixel driving unit PDU4, and the sensing driving unit PSDU in the first direction DR1. Also, the sensing driving unit PSDU and the empty space ES may be repeatedly disposed in the second direction DR2.

Figure 7:
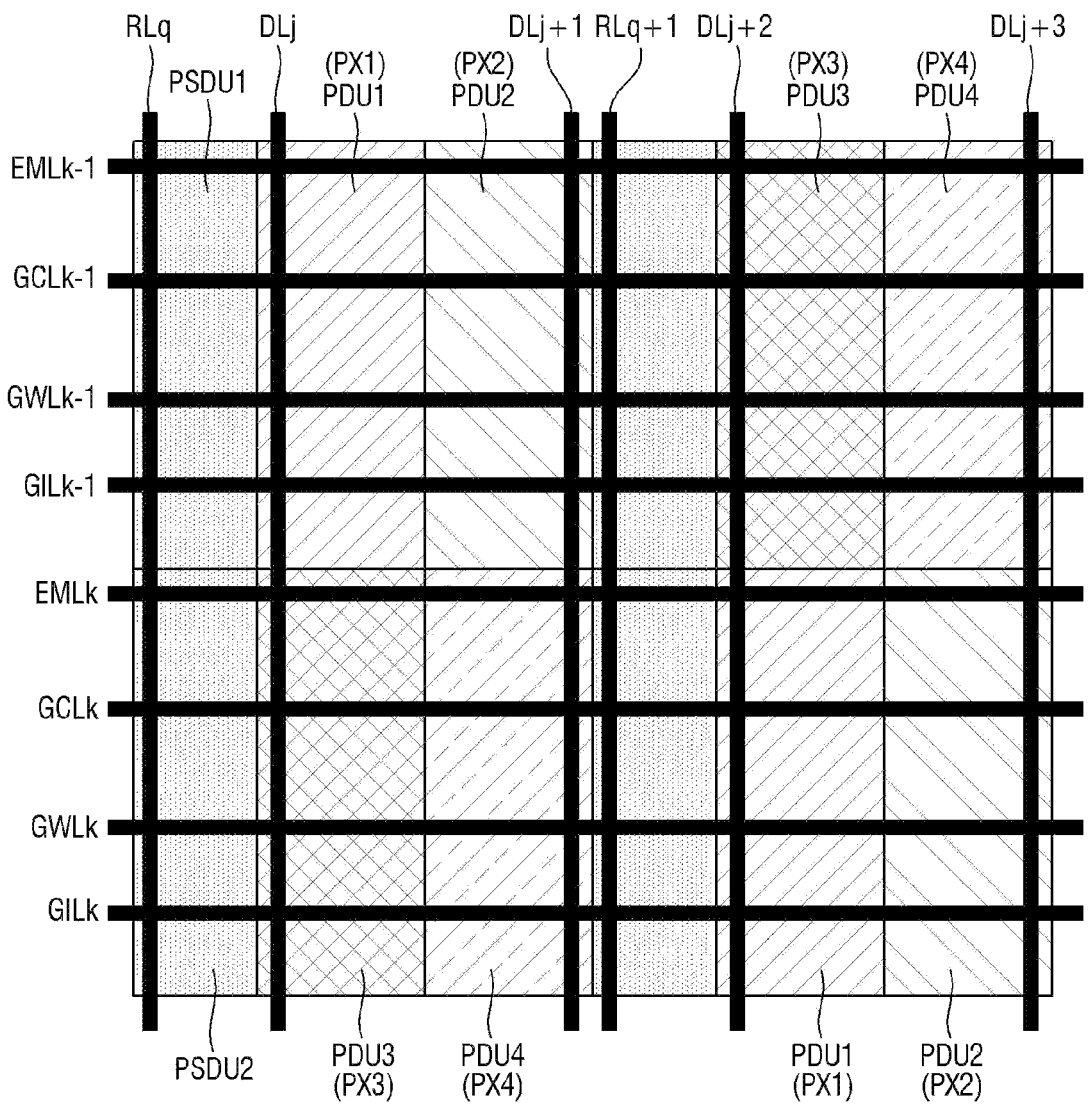
FIG. 7 is a schematic diagram illustrating pixel driving units, sensing driving units, scan write lines, scan initialization lines, scan control lines, light emitting lines, data lines, and sensing lines according to one or more embodiments.

FIG. 7 is a schematic diagram illustrating pixel driving units, sensing driving units, scan write lines, scan initialization lines, scan control lines, light emitting lines, data lines, and sensing lines according to one or more embodiments.

The embodiment of FIG. 7 is different from the embodiment of FIG. 4A in that the area of the sensing driving unit PSDU is twice of that of the sensing driving unit PSDU of the embodiment of FIG. 4A. In FIG. 7, a description overlapping with the embodiment of FIG. 4A will be omitted.

Referring to FIG. 7, a first sensing driving unit PSDU1 may be disposed between the first pixel driving unit PDU1 and the fourth pixel driving unit PDU4 in the first direction DR1 and a second driving unit PSDU2 may be disposed between the second pixel driving unit PDU2 and the third pixel driving unit PDU3 in the first direction DR1. For example, the sensing driving units PSDU and the pixel driving units PDU1, PDU2, PDU3, and PDU4 may be repeatedly arranged in the order of the first sensing driving unit PSDU1, the first pixel driving unit PDU1, the second pixel driving unit PDU2, the second sensing driving unit PSDU2, the third pixel driving unit PDU3, and the fourth pixel driving unit PDU4 in the first direction DR1.

As the area of the sensing driving unit PSDU increases, a relative area of each of the pixel driving units PDU1, PDU2, PDU3, and PDU4 may decrease. For example, in case that the circuit integration of the sensing driving unit PSDU is higher than that of each of the pixel driving units PDU1, PDU2, PDU3, and PDU4, the circuit integration of the sensing driving unit PSDU and the circuit integration of each of the pixel driving units PDU1, PDU2, PDU3, and PDU4 may be made uniform by increasing the area of the sensing driving unit PSDU and reducing the area of each of the pixel driving units PDU1, PDU2, PDU3, and PDU4. For example, a length of the first sensing driving unit PSDU1 in the first direction may be greater than a length of each of the pixel driving units PDU1, PDU2, PDU3, and PDU4.

Figure 8:
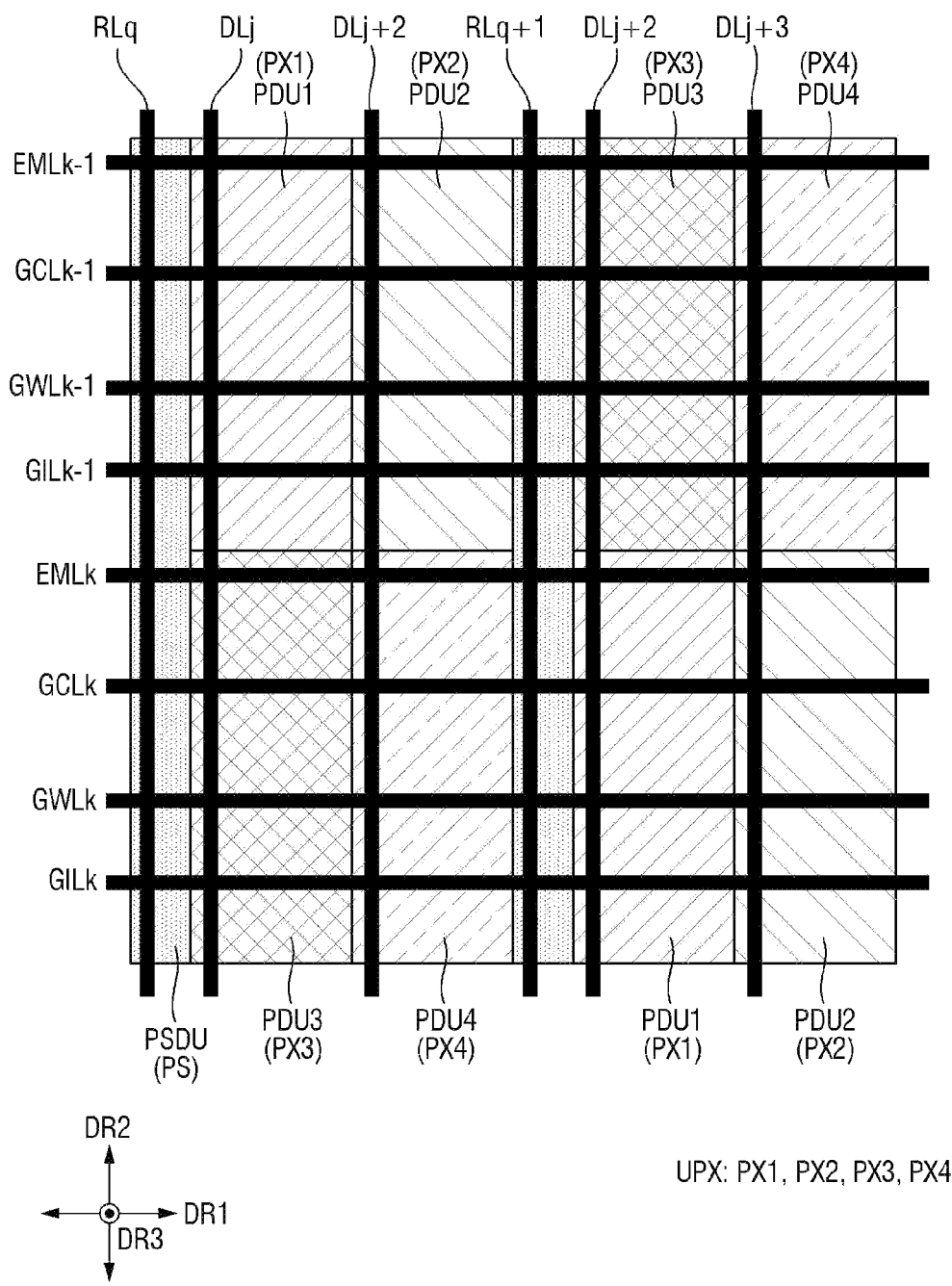
FIG. 8 is a schematic diagram illustrating pixel driving units, sensing driving data lines, and sensing lines according to one or more embodiments.

FIG. 8 is a schematic diagram illustrating pixel driving units, sensing driving data lines, and sensing lines according to one or more embodiments.

The embodiment of FIG. 8 is different from the embodiment of FIG. 4A in that the sensing driving unit PSDU is disposed to correspond to one unit pixel UPX. In FIG. 8, a description overlapping with the embodiment of FIG. 4A will be omitted.

Referring to FIG. 8, the sensing driving units PSDU may be disposed to correspond to the unit pixels UPX on a one-to-one basis. Each of the sensing driving units PSDU may be disposed on a side of the unit pixel UPX. For example, the sensing driving unit PSDU may be disposed on the left side of the first pixel driving unit PDU1 and on the left side of the third pixel driving unit PDU3, and may be disposed on the right side of the second pixel driving unit PDU2 and the fourth pixel driving unit PDU4 but the embodiment of the specification is not limited thereto.

The sensing driving units PSDU, the first pixel driving units PDU1, and the second pixel driving units PDU2 may be repeatedly arranged in the order of the sensing driving unit PSDU, the first pixel driving unit PDU1, and the second pixel driving unit PDU2 in the first direction DR1. For example, the sensing driving unit PSDU may be disposed on a side of the first pixel driving unit PDU1, and the second pixel driving unit PDU2 may be disposed on another side of the first pixel driving unit PDU1.

The sensing driving units PSDU, the third pixel driving units PDU3, and the fourth pixel driving units PDU4 may be repeatedly arranged in the order of the sensing driving unit PSDU, the third pixel driving unit PDU3, and the second pixel driving unit PDU4 in the first direction DR1. For example, the sensing driving unit PSDU may be disposed on a side of the third pixel driving unit PDU3, and the fourth pixel driving unit PDU4 may be disposed on another side of the third pixel driving unit PDU3.

Figure 9:
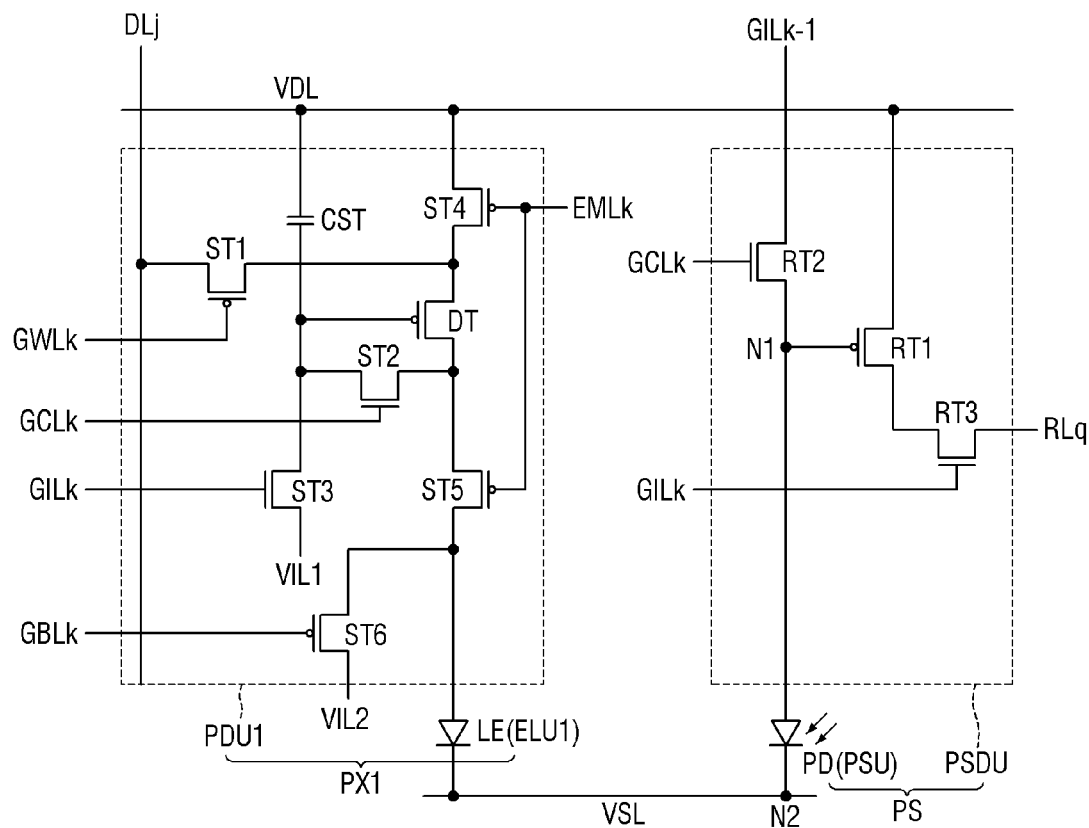
FIG. 9 is a schematic diagram of an equivalent circuit of a display pixel and a light sensing pixel according to one or more embodiments.

FIG. 9 is a schematic diagram of an equivalent circuit of a display pixel and a light sensing pixel according to one or more embodiments.

For convenience of explanation, FIG. 9 illustrated a schematic diagram that a $k^{th}$ scan initialization line GILk, a $k^{th}$ scan write line GWLk, a $k^{th}$ scan control line GCLK, the first display pixel PX1 connected to a $k^{th}$ scan bias line GBLk, and the light sensing pixel PS connected to the $k^{th}$ scan initialization line GILk and the $k^{th}$ scan control line GCLK.

Referring to FIG. 9, the first display pixel PX may be connected to the $k^{th}$ scan initialization line GILk, the $k^{th}$ scan write line GWLk, the $k^{th}$ scan control line GCLK, the $k^{th}$ scan bias line GBLk, and a $j^{th}$ data line DLj. The first display pixel PX may be connected to a first power supply line VDL to which a first power voltage is supplied, a second power supply line VSL to which a second power voltage is supplied, a first initialization line VIL1 to which the first initialization voltage is supplied, and the second initialization line VIL2 to which the second initialization voltage is supplied.

The first display pixel PX may include the first light emitting unit ELU1 and the first pixel driving unit PDU1. The first light emitting unit ELU1 may include a light emitting element LE. The first pixel driving unit PDU1 may include a driving transistor DT, switch elements, and a capacitor CST. The switch elements may include first to sixth transistors ST1, ST2, ST3, ST4, ST5, and ST6.

The driving transistor DT may include a gate electrode, a first electrode, and a second electrode. The driving transistor DT may control a drain-source current (Isd, hereinafter referred to as a "driving current") flowing between the first electrode and the second electrode according to the data voltage applied to the gate electrode. The driving current Isd flowing through the channel of the driving transistor DT may be proportional to the square of the difference between the voltage Vsg between the first electrode and the gate electrode and the threshold voltage Vth of the driving transistor DT as shown in Eq. (1).

$$Isd = k' \times (Vsg - Vth)^2 \qquad \text{Eq. (1)}$$

In Eq. (1), Isd is a driving current, refers to a source-drain current flowing through the channel of the driving transistor DT, k' refers to a coefficient determined by the structure and physical characteristics of the driving transistor, Vsg refers to the voltage between the first electrode and the gate electrode of the driving transistor, and Vth refers to the threshold voltage of the driving transistor.

A light emitting element LE may emit light according to the driving current Isd. As the driving current Isd increases, the amount of light emitted from the light emitting element LE may increase.

The light emitting element LE may be an organic light emitting diode including an organic light emitting layer disposed between an anode electrode and a cathode electrode. In another embodiment, the light emitting element LE may be a quantum dot light emitting element including a quantum dot light emitting layer disposed between the anode electrode and the cathode electrode. In another embodiment, the light emitting element LE may be an inorganic light emitting element including an inorganic semiconductor disposed between the anode electrode and the cathode electrode. In case that the light emitting element LE is an inorganic light emitting element, it may include a micro light emitting diode or a nano light emitting diode.

The anode electrode of the light emitting element LE may be connected to the second electrode of the fifth transistor ST5 and the first electrode of the sixth transistor ST6, and the cathode electrode may be connected to a second power supply line VSL.

The first transistor ST1 may be turned-on by the $k^{th}$ scan write signal of the $k^{th}$ scan write line GWLk to connect the first electrode of the driving transistor DT to the $j^{th}$ data line DLj. Accordingly, the data voltage of the $j^{th}$ data line DLj may be applied to the first electrode of the driving transistor DT. The gate electrode of the first transistor ST1 may be connected to the $k^{th}$ scan write line GWLk, the first electrode may be connected to the first electrode of the driving transistor DT, and the second electrode may be connected to the $j^{th}$ data line DLj.

The second transistor ST2 may be turned-on by the $k^{th}$ scan control signal of the $k^{th}$ scan control line GCLk to connect the gate electrode and the second electrode of the driving transistor DT. In case that the gate electrode and the second electrode of the driving transistor DT are connected, the driving transistor DT may be driven as a diode. The gate electrode of the second transistor ST2 may be connected to the $k^{th}$ scan control line GCLK, the first electrode may be connected to the gate electrode of the driving transistor DT, and the second electrode may be connected to the second electrode of the driving transistor DT.

The third transistor ST3 may be turned-on by the $k^{th}$ scan initialization signal of the $k^{th}$ scan initialization line GILk to connect the gate electrode of the driving transistor DT to a first initialization voltage line VIL1. Accordingly, the first initialization voltage VINT1 of the first initialization voltage line VIL1 may be applied to the gate electrode of the driving transistor DT. The gate electrode of the third transistor ST3 may be connected to the $k^{th}$ scan initialization line GILk, the first electrode may be connected to the first initialization voltage line VIL1, and the second electrode may be connected to the gate electrode of the driving transistor DT.

The fourth transistor ST4 may be turned-on by the $k^{th}$ light emitting signal of the $k^{th}$ light emitting line EMLk to connect the first electrode of the driving transistor DT to the first power supply line VDL. The gate electrode of the fourth transistor ST4 may be connected to the $k^{th}$ light emitting line EMLk, the first electrode may be connected to the first power supply line VDL, and the second electrode may be connected to the first electrode of the driving transistor DT.

The fifth transistor ST5 may be turned-on by the $k^{th}$ light emitting signal of the $k^{th}$ light emitting line EMLk to connect the second electrode of the driving transistor DT to the anode electrode of the light emitting element LE. The gate electrode of the fifth transistor ST5 may be connected to the $k^{th}$ light emitting line EMLk, the first electrode may be connected to the second electrode of the driving transistor DT, and the second electrode may be connected to the anode electrode of the light emitting element LE.

In case that both the fourth transistor ST4 and the fifth transistor ST5 are turned-on, the driving current Isd of the driving transistor DT according to the voltage of the gate electrode of the driving transistor DT may flow through the light emitting element LE.

The sixth transistor ST6 may be turned-on by the $k^{th}$ scan bias signal of the $k^{th}$ scan bias line GBLk to connect the anode electrode of the light emitting element LE to a second initialization voltage line VIL2. The second initialization voltage VINT2 of the second initialization voltage line VIL2 may be applied to the anode electrode of the light emitting element LE. The gate electrode of the sixth transistor ST6 may be connected to the $k^{th}$ scan bias line GBLk, the first electrode may be connected to the anode electrode of the light emitting element LE, and the second electrode may be connected to the second initialization voltage line VIL2.

The capacitor CST may be formed between the gate electrode of the driving transistor DT and the first power supply line VDL. The first capacitor electrode of the capacitor CST may be connected to the gate electrode of the driving transistor DT, and the second capacitor electrode may be connected to the first power supply line VDL.

In case that the first electrode of each of the driving transistor DT and the first to sixth transistors ST1, ST2, ST3, ST4, ST5, and ST6 is a source electrode, the second electrode may be a drain electrode. In another embodiment, in case that the first electrode of each of the driving transistor DT and the first to sixth transistors ST1, ST2, ST3, ST4, ST5, and ST6 is a drain electrode, the second electrode may be a source electrode.

An active layer of each of the driving transistor DT and the first to sixth transistors ST1, ST2, ST3, ST4, ST5, and ST6 may be formed of any one of polysilicon, amorphous silicon, and oxide semiconductor. For example, the active layer of each of the driving transistor DT, the first transistor ST1, and the fourth to sixth transistors ST4 to ST6 may be made of polysilicon. Each active layer of the second transistor ST2 and the third transistor ST3 may be made of an oxide semiconductor. The driving transistor DT, the first transistor ST1, and the fourth to sixth transistors ST4 to ST6 may be formed of a P-type MOSFET, and the second transistor ST2 and the third transistor ST3 may be formed of an N-type MOSFET.

The light sensing pixel PS may be connected to the k-$1^{th}$ scan initialization line GILk-1, the $k^{th}$ scan initialization line GILk, and the $k^{th}$ scan control line GCLk. Also, the light sensing pixel PS may be connected to a second power supply line VSL to which a second power voltage is supplied.

The light sensing pixel PS may include a light sensing unit PSU and a sensing driving unit PSDU. The light sensing unit PSU may include an optical element PD. The sensing driving unit PSDU may include first to third sensing transistors RT1 to RT3.

The optical element PD may be a photodiode including an anode electrode, a photoelectric conversion layer, and a cathode electrode. The anode electrode of the optical element PD may be connected to a first node N1, and the cathode electrode may be connected to the second power supply line VSL.

The optical element PD may convert incident light into an electrical signal. In case that light is incident on the optical element PD, a photocurrent flowing through the optical element PD may increase compared to in case that light is not incident on the optical element PD. An optical device PD may be an organic photodiode including an electron donating material generating donor ions and an electron accepting material generating acceptor ions.

In case that the optical element PD is exposed to light, photocharges may be generated, and the generated photocharges may be accumulated in the anode electrode of the optical element PD. Therefore, in case that the optical element PD is exposed to light, the voltage of the first node N1 connected to the anode electrode of the optical element PD may increase.

A first sensing transistor RT1 may be turned-on by the voltage of the first node N1 applied to the gate electrode to connect the first power supply line VDL to the second electrode of a third sensing transistor RT3. The gate electrode of the first sensing transistor RT1 may be connected to the first node N1, the first electrode may be connected to the first power supply line VDL, and the second electrode may be connected to the second electrode of the third sensing transistor RT3.

A second sensing transistor RT2 may be turned-on by the $k^{th}$ scan control signal of the $k^{th}$ scan control line GCLk to connect a k-$1^{th}$ scan initialization line GILk-1 to the first node N1. The gate electrode of the second sensing transistor RT2 may be connected to the $k^{th}$ scan control line GCLk, the first electrode may be connected to the k-$1^{th}$ scan initialization line GILk-1, and the second electrode may be connected to the first node N1.

The third sensing transistor RT3 may be turned-on by the $k^{th}$ scan initialization signal of the $k^{th}$ scan initialization line GILk to connect the second electrode of the first sensing transistor RT1 to the $q^{th}$ sensing line RLq. Accordingly, the sensing current of the first sensing transistor RT1 may flow to the $q^{th}$ sensing line RLq. The gate electrode of the third sensing transistor RT3 may be connected to the $k^{th}$ scan initialization line GILk, the first electrode may be connected to the $q^{th}$ sensing line RLq, and the second electrode may be connected to the second electrode of the first sensing transistor RT1.

In case that the first electrode of each of the first to third sensing transistors RT1, RT2, and RT3 is a source electrode, the second electrode may be a drain electrode. In another embodiment, in case that the first electrode of each of the first to third sensing transistors RT1, RT2, and RT3 is a drain electrode, the second electrode may be a source electrode.

An active layer of each of the first to third sensing transistors RT1, RT2, and RT3 may be formed of any one of polysilicon, amorphous silicon, and oxide semiconductor. For example, the active layer of the first sensing transistor RT1 may be made of polysilicon. Each active layer of the second sensing transistor RT2 and the third sensing transistor RT3 may be formed of an oxide semiconductor. The first sensing transistor RT1 may be formed of a P-type MOSFET, and the second sensing transistor RT2 and the third sensing transistor RT3 may be formed of an N-type MOSFET.

The diagram of the second pixel driving unit PDU2 of the second display pixel PX2, the third pixel driving unit PDU3 of the third display pixel PX3, and the fourth pixel driving unit PDU4 of the fourth display pixel PX4 may be substantially the same as the diagram of the first pixel driving unit PDU1 of the first display pixel PX1 described in connection with FIG. 9. Therefore, the description the diagram of the second pixel driving unit PDU2 of the second display pixel PX2, the third pixel driving unit PDU3 of the third display pixel PX3, and the fourth pixel driving unit PDU4 of the fourth display pixel PX4 will be omitted.

On the other hand, in case that the second sensing transistor RT2 and the third sensing transistor RT3 are formed of a P-type MOSFET, the fingerprint sensing ability may be deteriorated due to the off-leakage current of the second sensing transistor RT2 and the off-leakage current of the third sensing transistor RT3 are used.

As shown in FIG. 9, since the second transistor ST2 and the third transistor ST3 of the first pixel driving unit PDU1 are formed of an N-type MOSFET, the second sensing transistor RT2 and the third sensing transistor RT3 may be formed of an N-type MOSFET in the embodiment of the specification without additional process. Therefore, it is possible to reduce the deterioration of the fingerprint sensing ability due to the off-leakage current of the second sensing transistor RT2 and the off-leakage current of the third sensing transistor RT3 by forming the second sensing transistor RT2 and the third sensing transistor RT3 with N-type MOSFET.

The first pixel driving unit PDU1 and the sensing driving unit PSDU may share the $k^{th}$ scan control line GCLK, the $k^{th}$ scan initialization line GILk, the k-$1^{th}$ scan initialization line GILk-1, the second initialization line VIL2, and the second power supply line VSL. Therefore, although the sensing driving unit PSDU is added, there is an advantage in that a separate wire to which a separate signal for driving the sensing driving unit PSDU is applied is not required.

Figure 10:
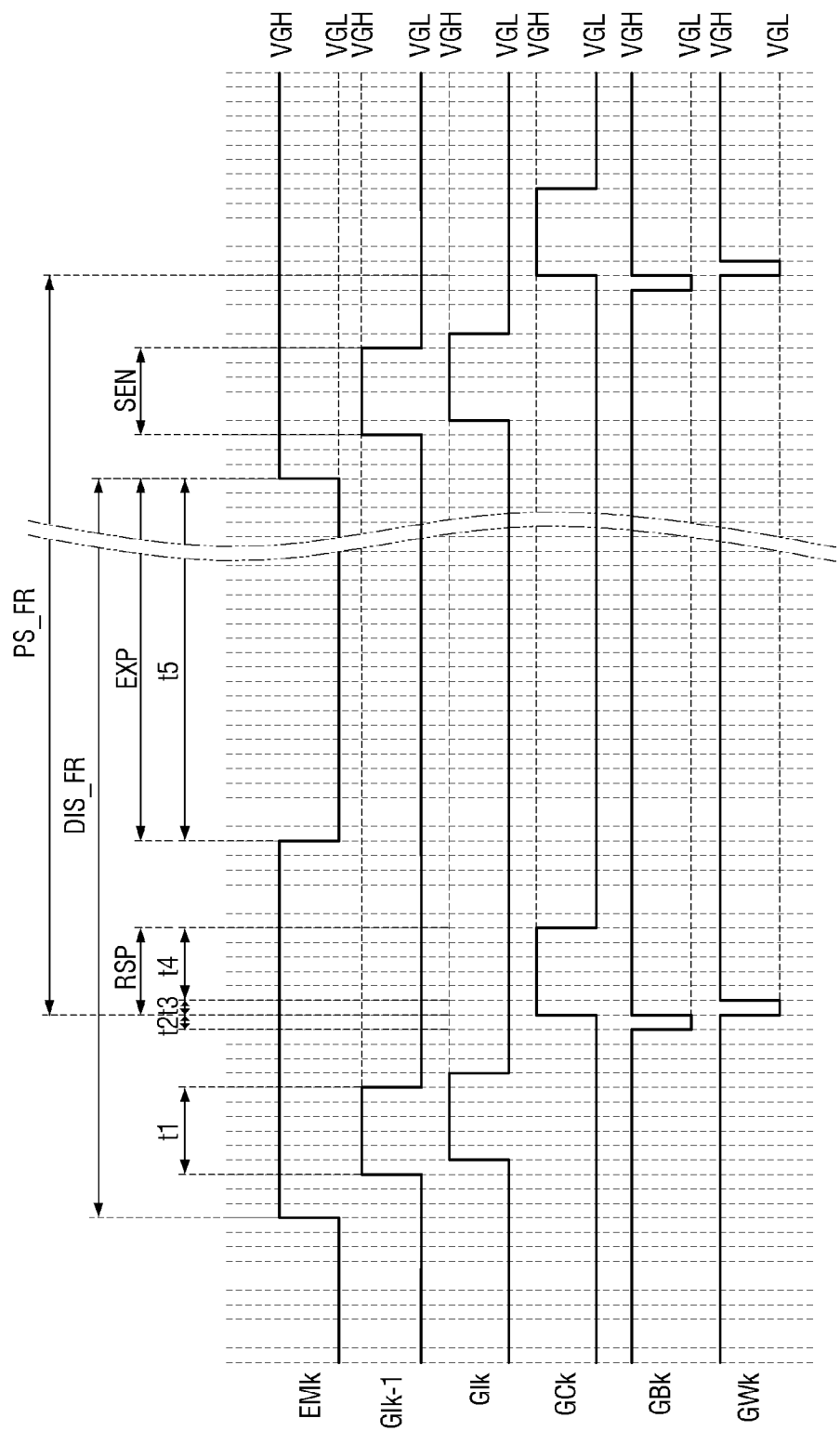
FIG. 10 is a waveform diagram illustrating a k-$1^{th}$ scan initialization signal, a $k^{th}$ scan initialization signal, a $k^{th}$ scan control signal, a $k^{th}$ scan write signal, a $k^{th}$ scan bias signal, and a $k^{th}$ light emitting signal applied to a display pixel and a light sensing pixel according to one or more embodiments.

FIG. 10 is a waveform diagram illustrating a k-$1^{th}$ scan initialization signal, a $k^{th}$ scan initialization signal, a $k^{th}$ scan control signal, a $k^{th}$ scan write signal, a $k^{th}$ scan bias signal, and a $k^{th}$ light emitting signal applied to a display pixel and a light sensing pixel according to one or more embodiments.

Referring to FIG. 10, a $k^{th}$ light emitting signal EMk may be a signal applied to a $k^{th}$ light emitting line EMLk, and may be a signal for controlling turn-on and turn-off of the fourth transistor ST4 and the fifth transistor ST5. A $k^{th}$ scan initialization signal Glk may be a signal applied to the $k^{th}$ scan initialization line GILk, and may be a signal for controlling turn-on and turn-off of the third transistor ST3 and the third sensing transistor RT3. A $k^{th}$ scan control signal GCk may be a signal applied to the $k^{th}$ scan control line GCLK, and may be a signal for controlling turn-on and turn-off of the second transistor ST2 and the second sensing transistor RT2. A $k^{th}$ scan write signal GWk may be a signal applied to the $k^{th}$ scan write line GWLk and may be a signal for controlling turn-on and turn-off of the first transistor ST1. A $k^{th}$ scan bias signal GBk may be a signal applied to the $k^{th}$ scan bias line GBLk and may be a signal for controlling turn-on and turn-off of the sixth transistor ST6.

The $k^{th}$ scan initialization signal Glk, the $k^{th}$ scan control signal GCk, the $k^{th}$ scan write signal GWk, the $k^{th}$ scan bias signal GBk, and the $k^{th}$ light emitting signal EMk may be repeated in one frame period DIS_FR and PS_FR. The first frame period DIS_FR may include a first period t1 for initializing the voltage of the gate electrode of the driving transistor DT to the first initialization voltage VINT1, a second period t2 for initializing the voltage of the anode electrode of the light emitting element LE to the second initialization voltage VINT2, a third period t3 for supplying the data voltage to the first electrode of the driving transistor DT, a fourth period t4 for sampling the threshold voltage of the driving transistor DT, and a fifth period t5 for emitting the light emitting element LE based on the operation of the first display pixel PX1.

The $k^{th}$ scan initialization signal Glk may have a second level voltage VGH during the first period t1 and may have a first level voltage VGL during the remaining period. The $k^{th}$ scan bias signal GBk may have the first level voltage VGL during the second period t2 and may have the second level voltage VGH during the remaining period. The $k^{th}$ scan control signal GCk may have the second level voltage VGH during the third period t3 and the fourth period t4 and may have the first level voltage VGL during the remaining period. The $k^{th}$ scan write signal GWk may have the first level voltage VGL during the third period t3 and the second level voltage VGH during the remaining period. The $k^{th}$ emitting signal EMk may have the second level voltage VGH during the first to fourth periods t1 to t4 and may have the first level voltage VGL during the fifth period t5. The first level voltage VGL may be a gate low voltage, and the second level voltage VGH may be a gate high voltage.

Since the first transistor ST1, the fourth to sixth transistors ST4, ST5, ST6, and the first sensing transistor RT1 are formed of a P-type MOSFET, they may be turned-on in case that the signal of the first level voltage VGL is applied to the gate electrode, and they may be turned-off in case that the signal of the second level voltage VGH is applied to the gate electrode. Since the second transistor ST2 and the third transistor ST3 are formed of an N-type MOSFET, they may be turned-on in case that the signal of the second level voltage VGH is applied to the gate electrode, and they may be turned-off in case that the signal of the first level voltage VGL is applied to the gate electrode is applied.

Hereinafter, operations of the first display pixel PX1 and the light sensing pixel PS will be described in detail during the first to fifth periods t1 to t5 with reference to FIGS. 9 and 10.

First, the operation of the first display pixel PX1 will be described during the first to fifth periods t1 to t5.

During the first period t1, the $k^{th}$ scan initialization signal Glk having the second level voltage VGH may be supplied to the $k^{th}$ scan initialization line GILk. During the first period t1, the third transistor ST3 may be turned-on by the $k^{th}$ scan initialization signal Glk having the second level voltage VGH. Due to the turn-on of the third transistor ST3, the gate electrode of the driving transistor DT may be initialized to the first initialization voltage VINT1 of the first initialization voltage line VIL1.

During the second period t2, the $k^{th}$ scan bias signal GBk having the first level voltage VGL may be supplied to the $k^{th}$ scan bias line GBLk. During the second period t2, the sixth transistor ST6 may be turned-on by the $k^{th}$ scan bias signal GBk having the first level voltage VGL. Due to the turn-on of the sixth transistor ST6, the anode electrode of the light emitting element LE may be initialized to the second initialization voltage VINT2 of the second initialization voltage line VIL2.

During the third period t3, the $k^{th}$ scan write signal GWk having the first level voltage VGL may be supplied to the $k^{th}$ scan write line GWLk, and the $k^{th}$ scan control signal GCk having the second level voltage VGH may be supplied to the $k^{th}$ scan control line GCLk. During the third period t3, the first transistor ST1 may be turned-on by the $k^{th}$ scan write line GWLk having the first level voltage VGL, and the second transistor ST2 may be turned-on by the $k^{th}$ scan control line GCLk having the second level voltage VGH. Due to the turn-on of the first transistor ST1, the data voltage of the $j^{th}$ data line DLj may be supplied to the first electrode of the driving transistor DT.

During the fourth period t4, the $k^{th}$ scan control signal GCk having the second level voltage VGH is supplied to the $k^{th}$ scan control line GCLk. During the fourth period t4, the second transistor ST2 may be turned-on by the $k^{th}$ scan control line GCLK having the second level voltage VGH. Due to the turn-on of the second transistor ST2, the gate electrode and the second electrode of the driving transistor DT may be connected to each other, and the driving transistor DT may be driven as a diode.

Since the voltage difference (Vsg=Vdata−VINT1) between the first electrode and the gate electrode of the driving transistor DT is smaller than the threshold voltage of the driving transistor DT, the driving transistor DT may form a current path until the voltage difference between the first electrode and the gate electrode reaches a threshold voltage. For this reason, during the third period t3, the voltage of the gate electrode of the driving transistor DT may rise to a voltage Vdata-Vth obtained by subtracting the threshold voltage Vth of the driving transistor DT from the data voltage Vdata.

During the fifth period t5, the $k^{th}$ light emitting signal EMk having the first level voltage VGL is supplied to the $k^{th}$ light emitting line EMLk. During the fifth period t5, the fourth transistor ST4 and the fifth transistor ST5 may be turned-on by the $k^{th}$ emitting signal EMk having the first level voltage VGL. Due to the turn-on of the fourth transistor ST4, the first electrode of the driving transistor DT may be connected to the first power supply line VDL. Due to the turn-on of the fifth transistor ST5, the second electrode of the driving transistor DT may be connected to the anode electrode of the light emitting element LE.

In case that the fourth transistor ST4 and the fifth transistor ST5 are turned-on, the driving current Isd according to the voltage of the gate electrode of the driving transistor DT may be supplied to the light emitting element LE. The driving current Isd may be defined as in Eq. (2).

$$Isd=k'\times(VDD-(Vdata-Vth)-Vth)^2 \qquad Eq.\ (2)$$

In Eq. (2), Vth is the threshold voltage of the driving transistor DT, VDD is the first power voltage of the first power supply line VDL, and Vdata is the data voltage. The gate voltage of the driving transistor DT is (Vdata−Vth), and the voltage of the first electrode is VDD. By rearranging Eq. (2), Eq. (3) is derived.

$$Ids=k'\times(VDD-Vdata)^2 \qquad Eq.\ (3)$$

As a result, as shown in Eq. (3), the driving current Isd may not depend on the threshold voltage Vth of the driving transistor DT. For example, the threshold voltage Vth of the driving transistor DT may be compensated, and the light emitting element LE may emit light according to the driving current Isd controlled by the first power voltage VDD and the data voltage Vdata.

Hereinafter, the operation of the light sensing pixel PS during the reset period RSP, the light exposure period EXP, and the sensing period SEN will be described in detail.

Based on the operation of the light sensing pixel PS, one frame period PS_FR may include a reset period RSP for resetting the first node N1, a light exposure period EXP for exposing the optical element PD to light, and a sensing period SEN for sensing a sensing current flowing through the $q^{th}$ sensing line RLq according to the voltage of the first node N1.

The $k^{th}$ scan control signal GCk may have the second level voltage VGH during the reset period RSP and the first level voltage VGL during the light exposure period EXP and the sensing period SEN. The $k^{th}$ scan initialization signal Glk may have the second level voltage VGH during the sensing period SEN and may have the first level voltage VGL during the reset period RSP and the light exposure period EXP.

During the reset period RSP, the $k^{th}$ scan control signal GCk having the second level voltage VGH may be supplied to the $k^{th}$ scan control line GCLK. The second sensing transistor RT2 may be turned-on by the $k^{th}$ scan control signal GCk having the second level voltage VGH. Due to the turn-on of the second sensing transistor RT2, the first node N1 may be connected to the k-$1^{th}$ scan initialization line GILk-1. Therefore, the first level voltage VGL of the k-$1^{th}$ scan initialization line GILk-1 may be supplied to the first node N1 during the reset period RSP. Since the first level voltage VGL has a lower potential than the second power voltage VSS, the optical element PD may have a reverse bias state.

During the light exposure period EXP, light emitted from the light emitting element LE may be reflected from the fingerprint of the finger F to be incident on the optical element PD. Accordingly, when light is incident on the optical element PD, photocharges may be generated, and the generated photocharges may be accumulated in the anode electrode of the optical element PD. Accordingly, the voltage of the first node N1 may increase. Since the voltage of the first node N1 increases as the amount of charge accumulated in the first node N1 increases, the light exposure period EXP may be set to be sufficiently long.

During the sensing period SEN, the $k^{th}$ scan initialization signal GIk having the second level voltage VGH may be supplied to the $k^{th}$ scan initialization line GILk. During the sensing period SEN, the third sensing transistor RT3 may be turned-on by the $k^{th}$ scan initialization signal GIk having the second level voltage VGH. Due to the turn-on of the third sensing transistor RT3, the sensing current of the first sensing transistor RT1 according to the voltage of the first node N1 may flow to the $q^{th}$ sensing line RLq. The sensor driving circuit 300 may sense the sensing voltage charged in the $q^{th}$ sensing line RLq by the sensing current, whereby the detected fingerprint pattern may be compared with a previously stored fingerprint pattern. For example, fingerprint authentication may be possible using the display device 10.

The operations of the second display pixel PX2, the third display pixel PX3, and the fourth display pixel PX4 may be substantially the same as the operations of the first display pixel PX1 described with reference to FIGS. 9 and 10. Therefore, a description of the operations of the second display pixel PX2, the third display pixel PX3, and the fourth display pixel PX4 will be omitted.

Figure 11:
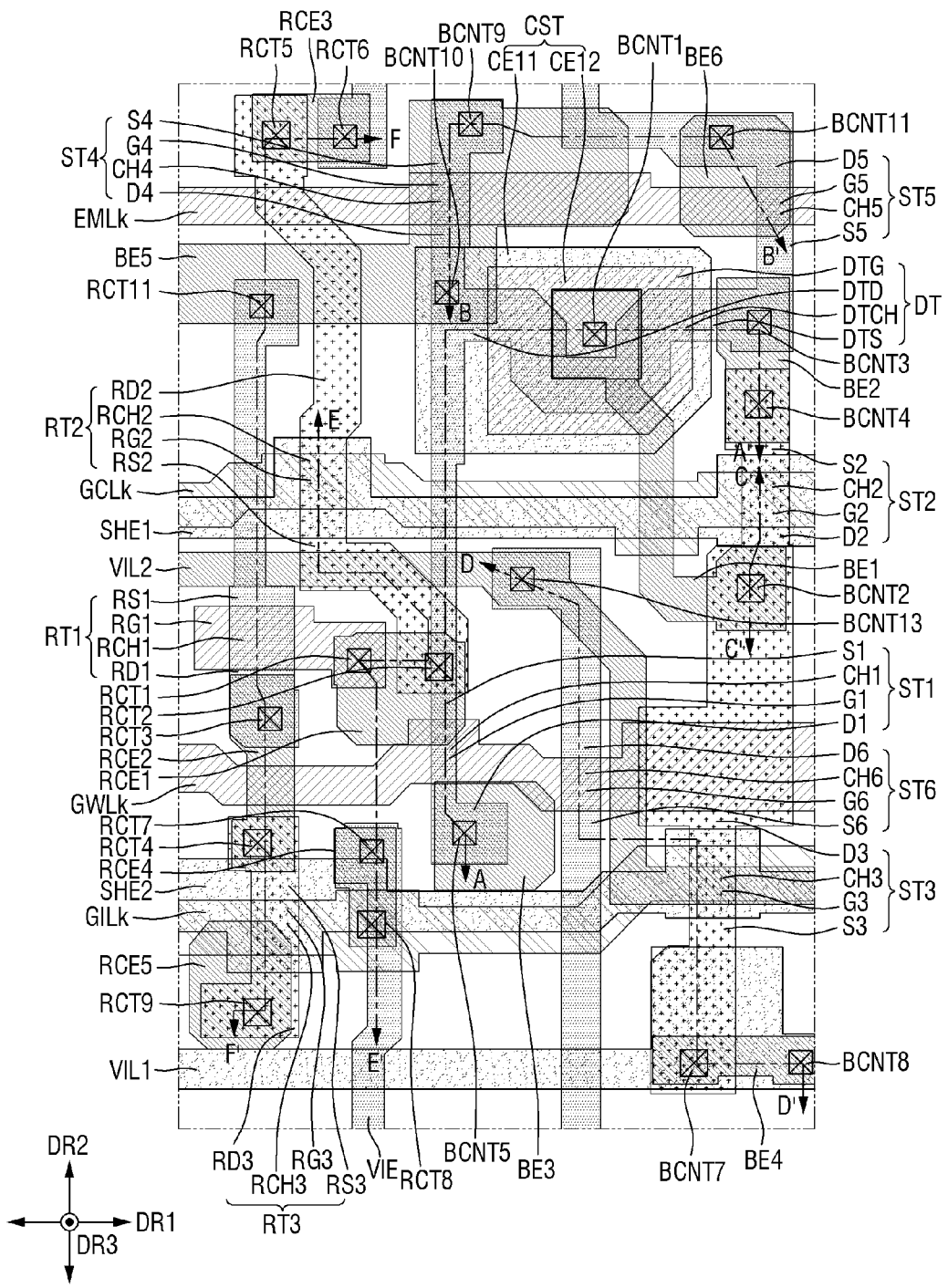
FIG. 11 is a layout diagram illustrating a first active layer, a first gate layer, a second gate layer, a second active layer, a third gate layer, and a first source drain layer of the first sub-pixel and the light sensing pixel according to one or more embodiments.
Figure 12:
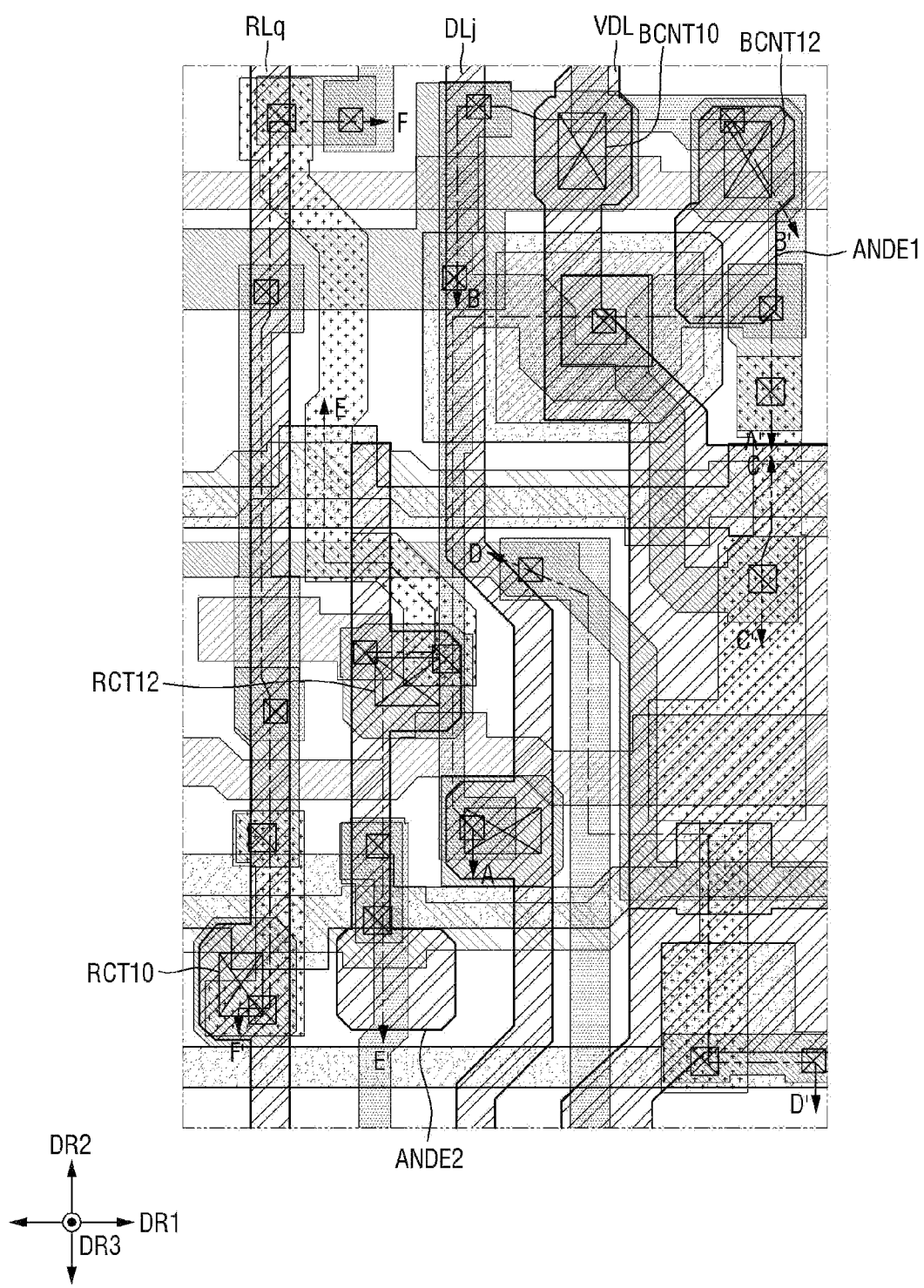
FIG. 12 is a layout diagram illustrating a first active layer, a first gate layer, a second gate layer, a second active layer, a third gate layer, a first source drain layer, and a second source drain layer of the first sub-pixel and the light sensing pixel according to one or more embodiments.

FIG. 11 is a layout diagram illustrating a first active layer, a first gate layer, a second gate layer, a second active layer, a third gate layer, and a first source drain layer of the first sub-pixel and the light sensing pixel according to one or more embodiments. FIG. 12 is a layout diagram illustrating a first active layer, a first gate layer, a second gate layer, a second active layer, a third gate layer, a first source drain layer, and a second source drain layer of the first sub-pixel and the light sensing pixel according to one or more embodiments.

Referring to FIGS. 11 and 12, the first pixel driving unit PDU1 may include a driving transistor DT, first to sixth transistors ST1 to ST6, a capacitor CST, connection electrodes BE1 to BE6, and a first anode connection electrode ANDE1.

The $k^{th}$ scan write line GWLk, a $k^{th}$ scan initialization lines GILk and GILk+1, the $k^{th}$ scan control line GCLK, and the $k^{th}$ light emitting line EMLk may extend in the first direction DR1. The $j^{th}$ data line DLj may extend in the second direction DR2. The first power supply line VDL may extend in the second direction DR2. The $k^{th}$ scan bias line GBLk may be the $k-1^{th}$ scan write line GWLk-1.

The driving transistor DT may include a channel layer DTCH, a gate electrode DTG, a first electrode DTS, and a second electrode DTD. The channel layer DTCH of the driving transistor DT may overlap the gate electrode DTG of the driving transistor DT. The gate electrode DTG of the driving transistor DT may be disposed on the channel layer DTCH of the driving transistor DT.

The gate electrode DTG of the driving transistor DT may be connected to a first connection electrode BE1 through a first connection contact hole BCNT1. The first connection electrode BE1 may be connected to a second electrode D2 of the second transistor ST2 through a second connection contact hole BCNT2. The first connection electrode BE1 may intersect the $k^{th}$ scan control line GCLk.

The first electrode DTS of the driving transistor DT may be connected to a first electrode S1 of the first transistor ST1 and a second electrode D4 of the fourth transistor ST4.

The second electrode DTD of the driving transistor DT may be connected to a second connection electrode BE2 through a third connection contact hole BCNT3. The second connection electrode BE2 may be connected to a first electrode S2 of the second transistor ST2 through a fourth connection contact hole BCNT4.

The first transistor ST1 may be connected to a channel layer CH1, a gate electrode G1, the first electrode S1, and a second electrode D1. The channel layer CH1 of the first transistor ST1 may overlap the gate electrode G1 of the first transistor ST1. The gate electrode G1 of the first transistor ST1 may be disposed on the channel layer CH1 of the first transistor ST1. The gate electrode G1 of the first transistor ST1 may be integrally formed with the $k^{th}$ scan write line GWLk. The gate electrode G1 of the first transistor ST1 may be a part of the $k^{th}$ scan write line GWLk.

The first electrode S1 of the first transistor ST1 may be connected to the first electrode DTS of the driving transistor DT. The first electrode S1 of the first transistor ST1 may be extended in the second direction DR2, and thus the first electrode S1 of the first transistor ST1 may overlap the $k^{th}$ scan control line GCLK, a first shielding electrode SHE1, the second initialization voltage line VIL2, the second electrode RD2 of the second sensing transistor RT2, and the first sensing connection electrode RCE1. The first shielding electrode SHE1 may be extended in the first direction DR1 and may overlap the $k^{th}$ scan control line GCLk.

The second electrode D1 of the first transistor ST1 may be connected to a third connection electrode BE3 through a fifth connection contact hole BCNT5. The third connection electrode BE3 may be connected to the $j^{th}$ data line DLj through a sixth connection contact hole BCNT6.

The second transistor ST2 may be connected to a channel layer CH2, a gate electrode G2, a first electrode S2, and a second electrode D2. The channel layer CH2 of the second transistor ST2 may overlap the gate electrode G2 of the second transistor ST2. The gate electrode G2 of the second transistor ST2 may be disposed on the channel layer CH2 of the second transistor ST2. The gate electrode G2 of the second transistor ST2 may be integrally formed with the $k^{th}$ scan control line GCLk. The gate electrode G2 of the second transistor ST2 may be a part of the $k^{th}$ scan control line GCLk.

The first electrode S2 of the second transistor ST2 may be connected to the second connection electrode BE2 through the fourth connection contact hole BCNT4. The second electrode D2 of the second transistor ST2 may be connected to the first connection electrode BE1 through the second connection contact hole BCNT2. Also, the second electrode D2 of the second transistor ST2 may be connected to a second electrode D3 of the third transistor ST3.

The third transistor ST3 may be connected to a channel layer CH3, a gate electrode G3, a first electrode S3, and the second electrode D3. The channel layer CH3 of the third transistor ST3 may overlap the gate electrode G3 of the third transistor ST3. The gate electrode G3 of the third transistor ST3 may be disposed on the channel layer CH3 of the third transistor ST3. The gate electrode G3 of the third transistor ST3 may be integrally formed with the $k^{th}$ scan initialization line GILk. The gate electrode G3 of the third transistor ST3 may be a part of the $k^{th}$ scan initialization line GILk.

The first electrode S3 of the third transistor ST3 may be connected to a fourth connection electrode BE4 through a seventh connection contact hole BCNT7. The fourth connection electrode BE4 may be connected to the first initialization voltage line VIL1 through an eighth connection contact hole BCNT8. The second electrode D3 of the third transistor ST3 may be connected to the second electrode D2 of the second transistor ST2.

The fourth transistor ST4 may be connected to a channel layer CH4, a gate electrode G4, a first electrode S4, and a second electrode D4. The channel layer CH4 of the fourth transistor ST4 may overlap the gate electrode G4 of the fourth transistor ST4. The gate electrode G4 of the fourth transistor ST4 may be disposed on the channel layer CH4 of the fourth transistor ST4. The gate electrode G4 of the fourth transistor ST4 may be integrally formed with the $k^{th}$ light emitting line EMLk. The gate electrode G4 of the fourth transistor ST4 may be a part of the $k^{th}$ light emitting line EMLK.

The first electrode S4 of the fourth transistor ST4 may be connected to a fifth connection electrode BE5 through a ninth connection contact hole BCNT9. The fifth connection electrode BE5 may be connected to the first power supply line VDL through a tenth connection contact hole BCNT10. The second electrode D2 of the fourth transistor ST4 may be connected to the first electrode DTS of the driving transistor DT and the first electrode S1 of the first transistor ST1.

The fifth transistor ST5 may be connected to a channel layer CH5, a gate electrode G5, a first electrode S5, and a second electrode D5. The channel layer CH5 of the fifth transistor ST5 may overlap the gate electrode G5 of the fifth transistor ST5. The gate electrode G5 of the fifth transistor ST5 may be disposed on the channel layer CH5 of the fifth transistor ST5. The gate electrode G5 of the fifth transistor ST5 may be integrally formed with the $k^{th}$ light emitting line EMLk. The gate electrode G5 of the fifth transistor ST5 may be a part of the $k^{th}$ light emitting line EMLk.

The first electrode S5 of the fifth transistor ST5 may be connected to the second connection electrode BE2 through the third connection contact hole BCNT3. The second electrode D5 of the fifth transistor ST5 may be connected to a sixth connection electrode BE6 through an eleventh connection contact hole BCNT11. The sixth connection electrode BE6 may be connected to the first anode connection electrode ANDE1 through a twelfth connection contact hole BCNT12. The first electrode of the light emitting element LE may be connected to the first anode connection electrode ANDE1 through a first anode contact hole.

The sixth transistor ST6 may be connected to a channel layer CH6, a gate electrode G6, a first electrode S6, and a second electrode D6. The channel layer CH6 of the sixth transistor ST6 may overlap the gate electrode G6 of the sixth transistor ST6. The gate electrode G6 of the sixth transistor ST6 may be disposed on the channel layer CH6 of the sixth transistor ST6. The gate electrode G6 of the sixth transistor ST6 may be integrally formed with the $k^{th}$ scan bias line GBLk. The gate electrode G6 of the sixth transistor ST6 may be a part of the $k^{th}$ scan bias line GBLk. It should be noted that the $k^{th}$ scan bias line GBLk is substantially the same as the k-1$^{th}$ scan write line GWLk-1, and thus is not shown in FIGS. 10 and 11.

The first electrode S6 of the sixth transistor ST6 may be connected to the sixth connection electrode BE6 through a thirteenth connection contact hole BCNT13. The first electrode S6 of the sixth transistor ST6 may overlap the $k^{th}$ scan initialization line GILk and a second shielding electrode SHE2. The second electrode D6 of the sixth transistor ST6 may be connected to the second initialization voltage line VIL2 through the thirteenth connection contact hole BCNT13. The second shielding electrode SHE2 may be extended in the first direction DR1 and may overlap the $k^{th}$ scan initialization line GILk.

A first electrode CE11 of the capacitor CST may be integrally formed with the gate electrode DTG of the driving transistor DT. The first electrode CE11 of the capacitor CST may be a part of the gate electrode DTG of the driving transistor DT. A second electrode CE12 of the capacitor CST may overlap the first electrode CE11 of the capacitor CST. The second electrode CE12 of the capacitor CST may be connected to the fifth connection electrode BE5 through a fourteenth connection contact hole BCNT14.

The sensing driving unit PSDU may include first to third sensing transistors RT1, RT2, and RT3, sensing connection electrodes RCE1 to RCE5, and a second anode connection electrode ANDE2. The $q^{th}$ sensing line RLq may be extended in the second direction DR2.

The first sensing transistor RT1 may be connected to a channel layer RCH1, a gate electrode RG1, a first electrode RS1, and a second electrode RD1. The channel layer RCH1 of the first sensing transistor RT1 may overlap the gate electrode RG1 of the first sensing transistor RT1. The gate electrode RG1 of the first sensing transistor RT1 may be disposed on the channel layer RCH1 of the first sensing transistor RT1.

The gate electrode RG1 of the first sensing transistor RT1 may be connected to a first sensing connection electrode RCE1 through a first sensing contact hole RCT1. The first sensing connection electrode RCE1 may be connected to a first electrode RS2 of the second sensing transistor RT2 through a second sensing contact hole RCT2. The first sensing connection electrode RCE1 may be connected to the second anode connection electrode ANDE2 through a twelfth sensing contact hole RCT12. A first electrode of the optical element PD may be connected to the second anode connection electrode ANDE2 through a second anode contact hole.

The first electrode RS1 of the first sensing transistor RT1 may be connected to the fifth connection electrode BE5 through an eleventh sensing contact hole RCT11. The first electrode RS1 of the first sensing transistor RT1 may be extended in the second direction DR2, and may overlap the second initialization voltage line VIL2, the $k^{th}$ scan control line GCLk, and the first shielding electrode SHE1.

The second electrode RD1 of the first sensing transistor RT1 may be connected to a second sensing connection electrode RCE2 through a third sensing contact hole RCT3. The second sensing connection electrode RCE2 may be connected to a first electrode RS3 of the third sensing transistor RT3 through a fourth sensing contact hole RCT4.

The second sensing transistor RT2 may be connected to a channel layer RCH2, a gate electrode RG2, a first electrode RS2, and a second electrode RD2. The channel layer RCH2 of the second sensing transistor RT2 may overlap the gate electrode RG2 of the second sensing transistor RT2. The gate electrode RG2 of the second sensing transistor RT2 may be disposed on the channel layer RCH2 of the second sensing transistor RT2. The gate electrode RG2 of the second sensing transistor RT2 may be integrally formed with the $k^{th}$ scan control line GCLk. The gate electrode RG2 of the second sensing transistor RT2 may be a part of the $k^{th}$ scan control line GCLk.

The first electrode RS2 of the second sensing transistor RT2 may overlap the second initialization voltage line VIL2. The first electrode RS2 of the second sensing transistor RT2 may be connected to a third sensing connection electrode RCE3 through a fifth sensing contact hole RCT5. The third sensing connection electrode RCE3 may be connected to an initialization connection electrode VIE through a sixth sensing contact hole RCT6. The initialization connection electrode VIE may be connected to a fourth sensing connection electrode RCE4 through a seventh sensing contact hole RCT7. The fourth sensing connection electrode RCE4 may be connected to the k-1$^{th}$ scan initialization line GILk-1 through an eighth sensing contact hole RCT8. The second electrode RD2 of the second sensing transistor RT2 may be connected to the first sensing connection electrode RCE1 through the second sensing contact hole RCT2.

Since the initialization connection electrode VIE extend in the second direction DR2, it may be disposed in the sensing driving unit PSDU disposed in the k-1$^{th}$ row and the k$^{th}$ row. Accordingly, the first electrode RS2 of the second sensing transistor RT2 disposed in the sensing driving unit PSDU of the k$^{th}$ row may be connected to the k-1$^{th}$ scan initialization line GILk-1. In case that the initialization connection electrode VIE is disposed in the sensing driving unit PSDU disposed in the k$^{th}$ row and the k+1$^{th}$ row, the first electrode RS2 of the second sensing transistor RT2 disposed in the sensing driving unit PSDU of the k+1$^{th}$ row may be connected to the k$^{th}$ scan initialization line GILk. The sensing driving unit PSDU disposed in the k$^{th}$ row may be a sensing driving unit PSDU overlapping the k$^{th}$ scan write line GWLk, the k$^{th}$ scan initialization line GILk, the k$^{th}$ scan control line GCLk, and the k$^{th}$ light emitting line EMLK.

The third sensing transistor RT3 may be connected to a channel layer RCH3, a gate electrode RG3, a first electrode RS3, and a second electrode RD3. The channel layer RCH3 of the third sensing transistor RT3 may overlap the gate electrode RG3 of the third sensing transistor RT3. The gate electrode RG3 of the third sensing transistor RT3 may be disposed on the channel layer RCH3 of the third sensing transistor RT3. The gate electrode RG3 of the third sensing transistor RT3 may be integrally formed with the k$^{th}$ scan initialization line GILk. The gate electrode RG3 of the third sensing transistor RT3 may be a part of the k$^{th}$ scan initialization line GILk.

The first electrode RS3 of the third sensing transistor RT3 may be connected to the second sensing connection electrode RCE2 through the fourth sensing contact hole RCT4. The second electrode RD3 of the third sensing transistor RT3 may be connected to a fifth sensing connection electrode RCE5 through a ninth sensing contact hole RCT9. The fifth sensing connection electrode RCE5 may be connected to the q$^{th}$ sensing line RLq through a tenth sensing contact hole RCT10.

Since the second pixel driving unit PDU2, the third pixel driving unit PDU3, and the fourth pixel driving unit PDU4 are substantially the same as the first pixel driving unit PDU1 described with reference to FIGS. 11 and 12, a description of these will be omitted.

Figure 13:
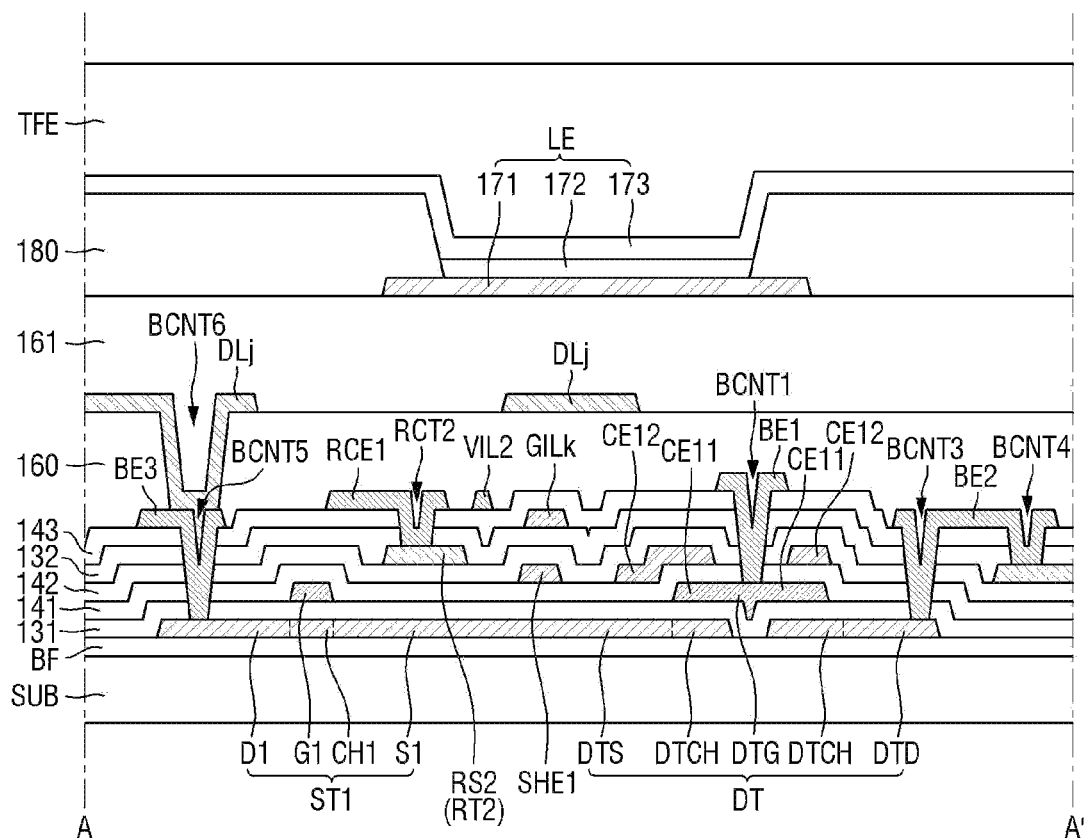
FIG. 13 is a schematic cross-sectional view illustrating an embodiment of the display panel taken along line A-A' of FIGS. 11 and 12.
Figure 14:
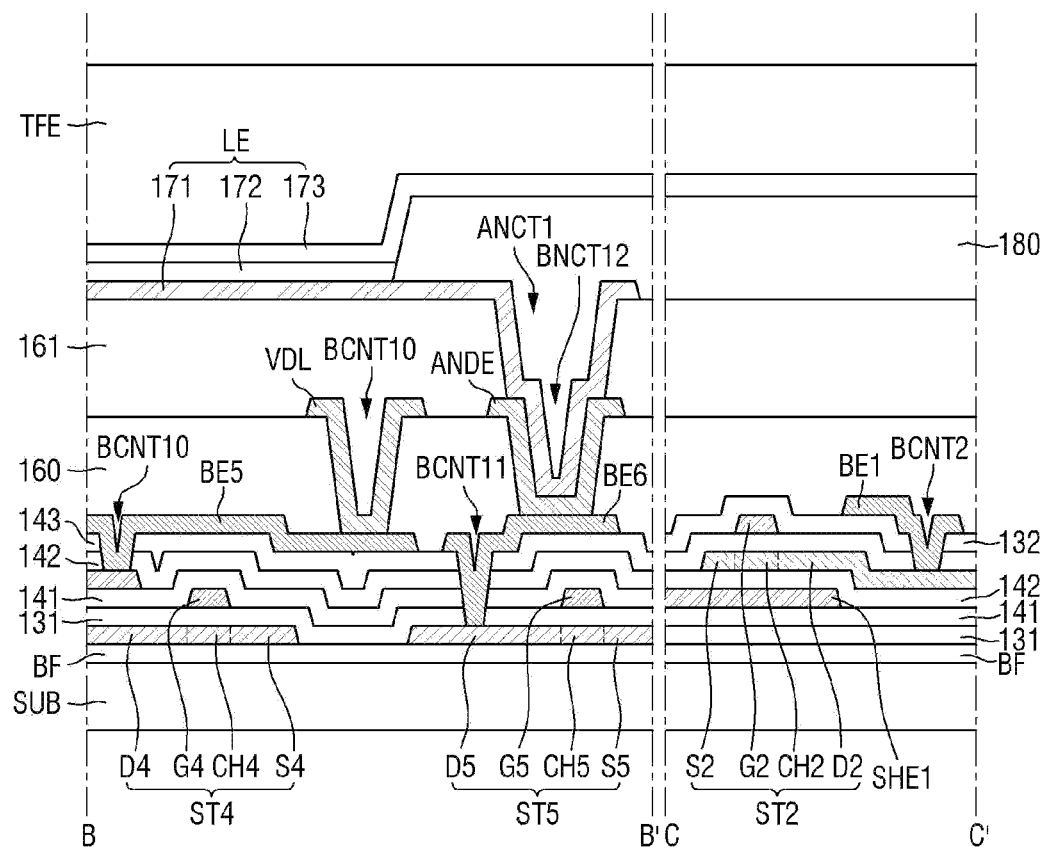
FIG. 14 is a schematic cross-sectional view illustrating an embodiment of the display panel taken along lines B-B' and C-C' of FIGS. 11 and 12.
Figure 15:
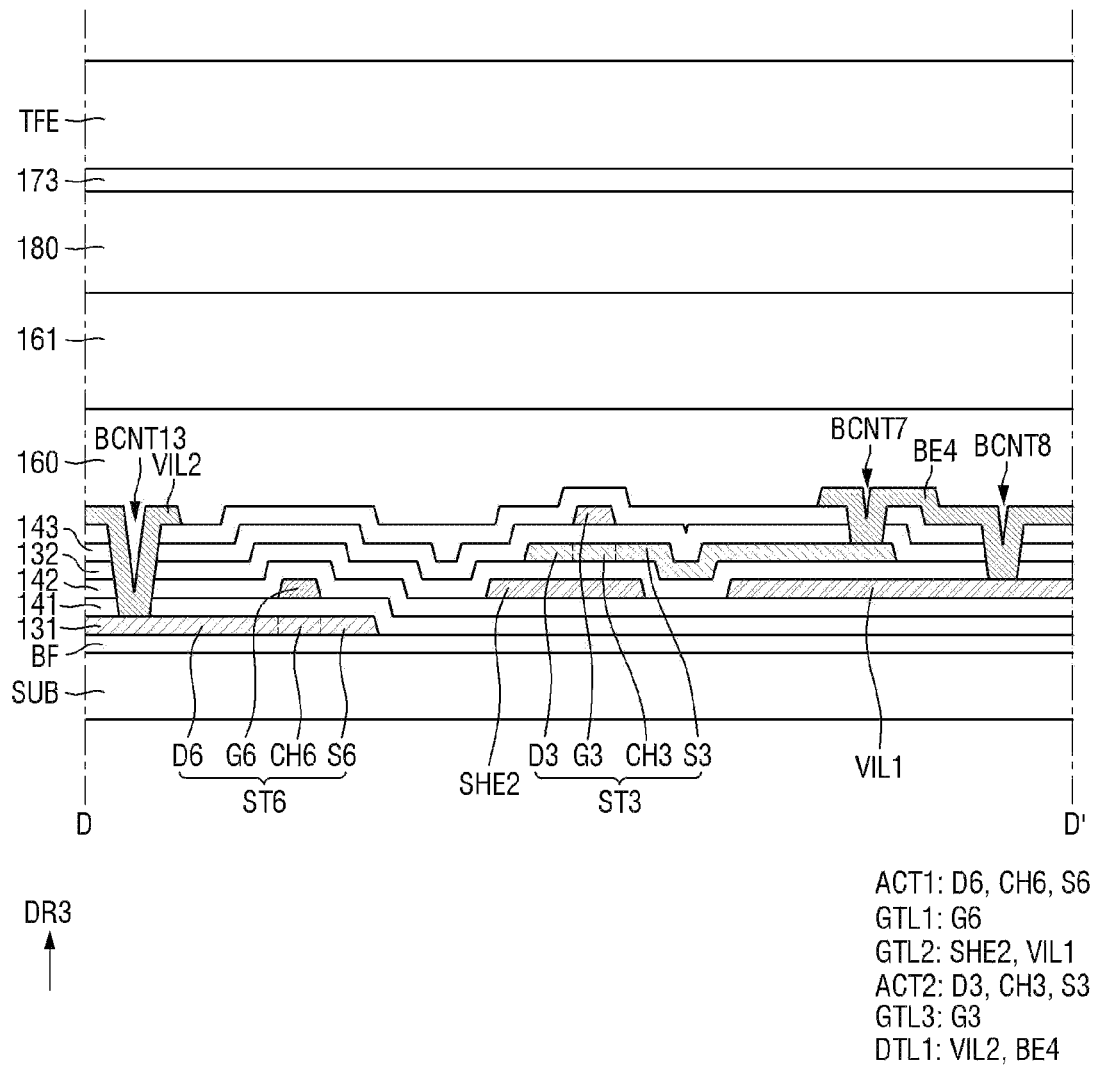
FIG. 15 is a schematic cross-sectional view illustrating an embodiment of the display panel taken along line D-D' of FIGS. 11 and 12.
Figure 16:
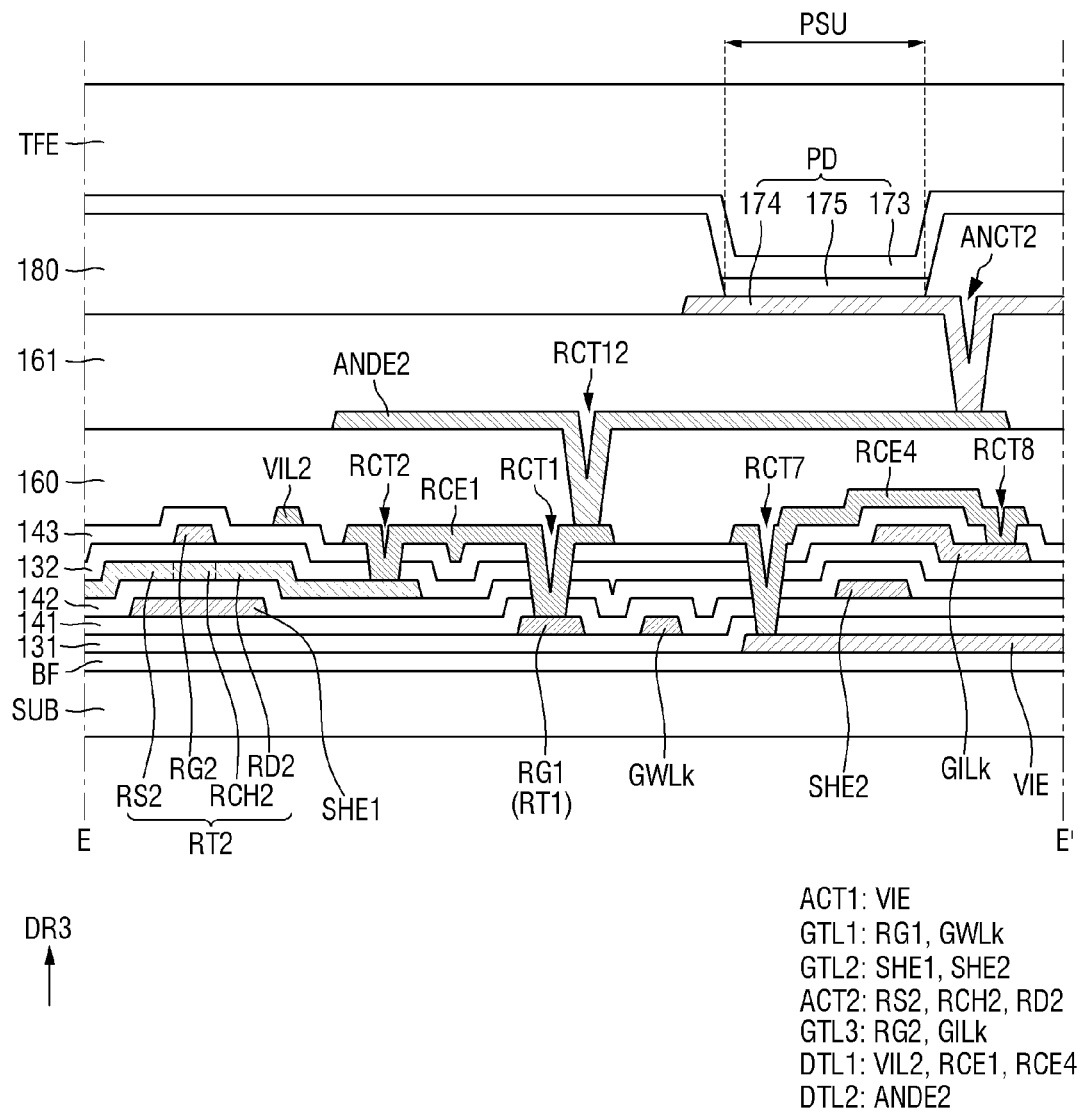
FIG. 16 is a schematic cross-sectional view illustrating an embodiment of the display panel taken along line E-E' of FIGS. 11 and 12.
Figure 17:
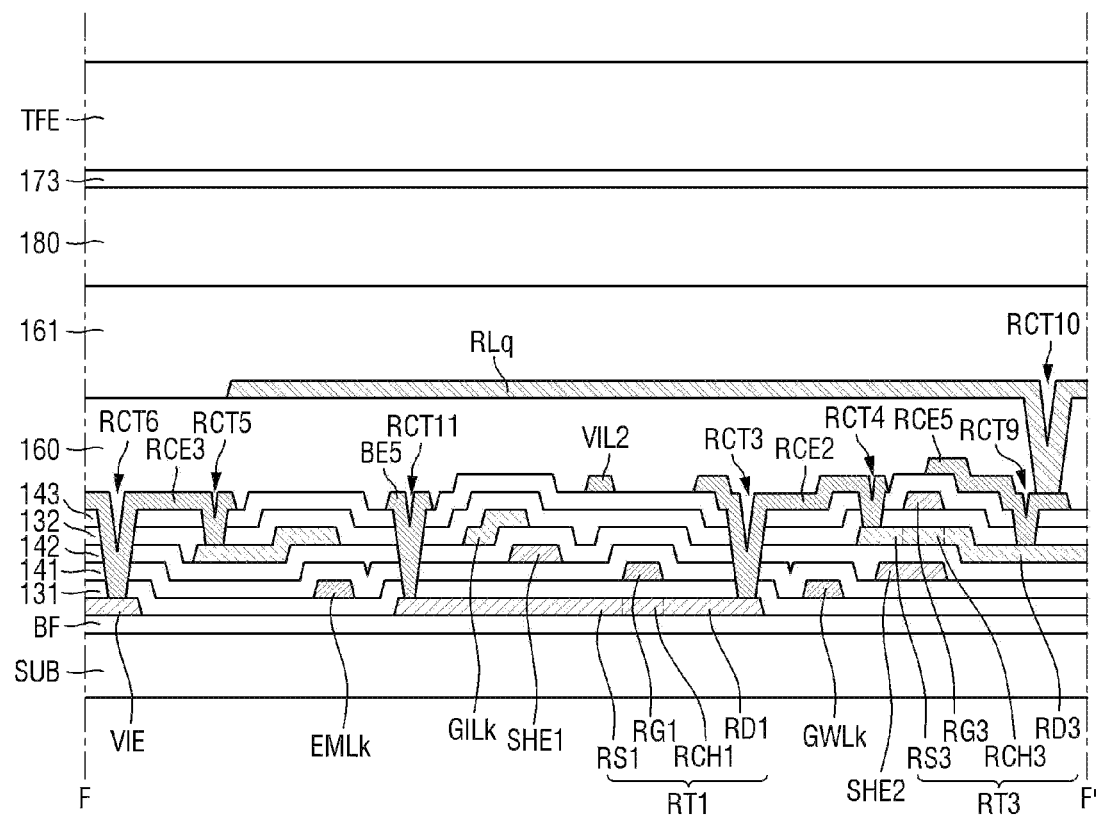
FIG. 17 is a schematic cross-sectional view illustrating an embodiment of the display panel taken along line F-F' of FIGS. 11 and 12.

FIG. 13 is a schematic cross-sectional view illustrating an embodiment of the display panel taken along line A-A' of FIGS. 11 and 12. FIG. 14 is a schematic cross-sectional view illustrating an embodiment of the display panel taken along lines B-B' and C-C' of FIGS. 11 and 12. FIG. 15 is a schematic cross-sectional view illustrating an embodiment of the display panel taken along line D-D' of FIGS. 11 and 12. FIG. 16 is a schematic cross-sectional view illustrating an embodiment of the display panel taken along line E-E' of FIGS. 11 and 12. FIG. 17 is a schematic cross-sectional view illustrating an embodiment of the display panel taken along line F-F' of FIGS. 11 and 12.

Referring to FIGS. 13 to 17, a display layer DPL and the encapsulation layer TFE may be sequentially formed on the substrate SUB. The display layer DPL may include a thin film transistor layer TFTL and a light emitting element layer EML.

The thin film transistor layer TFTL may be a layer in which the driving transistor DT, the first to sixth transistors ST1 to ST6, and the capacitor CST of each of the pixel driving units PDU1 to PDU4 and a layer in which the first to third sensing transistors RT1 to RT3 of each of the sensing driving units PSDU are formed. The thin film transistor layer TFTL may include a first active layer ACT1, a second active layer ACT2, a first gate layer GTL1, a second gate layer GTL2, a third gate layer GTL3, a first data metal layer DTL1, a second data metal layer DTL2, a buffer layer BF, a first gate insulating layer 131, a second gate insulating layer 132, a first interlayer insulating layer 141, a second interlayer insulating layer 142, a third interlayer insulating layer 143, a first organic layer 160, and a second organic layer 161.

A buffer layer BF may be disposed on one surface of the substrate SUB. The buffer layer BF may be formed on one surface of the substrate SUB to protect the thin film transistors and an organic light emitting layer 172 of the light emitting element layer EML from moisture penetrating through the substrate SUB, which is vulnerable to moisture permeation. The buffer layer BF may be made of multiple inorganic layers alternately stacked each other. The buffer layer BF may be formed as a multilayer in which one or more inorganic layers of a silicon nitride layer, a silicon oxynitride layer, a silicon oxide layer, a titanium oxide layer, and/or an aluminum oxide layer are alternately stacked each other. The buffer layer BF may be omitted.

The first active layer ACT1 may be disposed on the buffer layer BF. The first active layer ACT1 may include a silicon semiconductor such as polycrystalline silicon, single crystal silicon, low-temperature polycrystalline silicon, and amorphous silicon.

The first active layer ACT1 may include a channel layer DTCH, a first electrode DTS, and a second electrode DTD of the driving transistor DT. The channel layer DTCH of the driving transistor DT may be an area overlapping the gate electrode DTG of the driving transistor DT in the third direction DR3, which is a thickness direction of the substrate SUB. The first electrode DTS of the driving transistor DT may be disposed on a side of the channel layer DTCH, and the second electrode DTD may be disposed on another side of the channel layer DTCH. The first electrode DTS and the second electrode DTD of the driving transistor DT may be areas that do not overlap the gate electrode DTG in the third direction DR3. The first electrode DTS and the second electrode DTD of the driving transistor DT may be areas having conductivity by doping the silicon semiconductor with ions or impurities.

The first active layer ACT1 may further include the channel layers CH1 and CH4 to CH6, the first electrodes S1 and S4 to S6, and second electrodes D1 and D4 to D6 of the first and fourth to sixth transistors ST1 and ST4 to ST6. Each of the channel layers CH1 and CH4 to CH6 of the first and fourth to sixth transistors ST1 and ST4 to ST6 may overlap a corresponding gate electrode G1 and G4 to G6 in the third direction DR3. The first electrodes S1 and S4 to S6 and the second electrodes D1 and D4 to D6 of the first and fourth to sixth transistors ST1 and ST 4 to ST6 may be areas having conductivity by doping the silicon semiconductor with ions or impurities.

The first active layer ACT1 may further include the channel layer RCH1, the first electrode RS1, and the second electrode RD1 of the first sensing transistor RT1. The channel layer RCH1 of the first sensing transistor RT1 may overlap the gate electrode RG1 in the third direction DR3. The first electrode RS1 and the second electrode RD1 of the first sensing transistor RT1 may be areas having conductivity by doping the silicon semiconductor with ions or impurities.

The first gate insulating layer 131 may be disposed on the first active layer ACT1. The first gate insulating layer 131 may be formed of an inorganic layer, for example, a silicon nitride layer, a silicon oxynitride layer, a silicon oxide layer, a titanium oxide layer, or an aluminum oxide layer.

A first gate layer GTL1 may be disposed on the first gate insulating layer 131. The first gate layer GTL1 may include the gate electrode DTG of the driving transistor DT. The first gate layer GTL1 may further include the gate electrodes G1 to G6 of the first to sixth transistors ST1 to ST6, the first capacitor electrode CE11, the scan write lines GWLk and the light emitting line EMLk. Also, the first gate layer GTL1 may further include gate electrodes RG1 to RG3 of the first to third sensing transistors RT1 to RT3. The first gate layer GTL1 may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The first interlayer insulating layer 141 may be disposed on the first gate layer GTL1. The first interlayer insulating layer 141 may be formed of an inorganic layer, for example, a silicon nitride layer, a silicon oxynitride layer, a silicon oxide layer, a titanium oxide layer, or an aluminum oxide layer.

The second gate layer GTL2 may be disposed on the first interlayer insulating layer 141. The second gate layer GTL2 may include a second capacitor electrode CE12, shielding electrodes SHE1 and SHE2, and the first initialization voltage line VIL1. The second gate metal layer may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The second interlayer insulating layer 142 may be disposed on the second gate layer GTL2. The second interlayer insulating layer 142 may be formed of an inorganic layer, for example, a silicon nitride layer, a silicon oxynitride layer, a silicon oxide layer, a titanium oxide layer, or an aluminum oxide layer.

The second active layer ACT2 may be disposed on the second interlayer insulating layer 142. The second active layer ACT2 may include oxide semiconductors such as IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn) and oxygen (O)).

The second active layer ACT2 may further include the channel layers CH2 and CH3, the first electrodes S2 and S3, and the second electrodes D2 and D3 of the second and third transistors ST2 and ST3. Each of the channel layers CH2 and CH3 of the second and third transistors ST2 and ST3 may overlap a corresponding gate electrode G2 and G3 in the third direction DR3. The first electrodes S2 and S3 and the second electrodes D2 and D3 of the second and third transistors ST2 and ST3 may be areas having conductivity by doping an oxide semiconductor with ions or impurities.

The second active layer ACT2 may further include the channel layers RCH2 and RCH3, the first electrodes RS2 and RS3, and the second electrodes RD2 and RD3 of the second and third sensing transistors RT2 and RT3. The channel layers RCH2 and RCH3 of the second and third sensing transistors RT2 and RT3 may overlap a corresponding gate electrode in the third direction DR3. The first electrodes RS2 and RS3 and the second electrodes RD2 and RD3 of the second and third sensing transistors RT2 and RT3 may be areas having conductivity by doping an oxide semiconductor with ions or impurities.

A second gate insulating layer 132 may be disposed on the second active layer ACT2. The second gate insulating layer 132 may be formed of an inorganic layer, for example, a silicon nitride layer, a silicon oxynitride layer, a silicon oxide layer, a titanium oxide layer, or an aluminum oxide layer.

The third gate layer GTL3 may be disposed on the second gate insulating layer 132. The third gate layer GTL3 may further include the gate electrodes G2 and G3 of the second to third transistors ST2 and ST3, the gate electrodes RG2 and RG3 of the second and third sensing transistors RT2 and RT3, scan initialization lines GILk, and scan control lines GCLk. The third gate layer GTL3 may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The third interlayer insulating layer 143 may be disposed on the third gate layer GTL3. The third interlayer insulating layer 143 may be formed of an inorganic layer, for example, a silicon nitride layer, a silicon oxynitride layer, a silicon oxide layer, a titanium oxide layer, or an aluminum oxide layer.

A first data metal layer DTL1 may be formed on the third interlayer insulating layer 143. The first data metal layer DTL1 may include the second initialization voltage line VIL2, connection electrodes BE1 to BE6, and sensing connection electrodes RCE1 to RCE5. The first data metal layer DTL1 may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

On the first data metal layer DTL1, the first organic layer 160 may be formed for flattening a step caused by the first active layer ACT1, the second active layer ACT2, the first gate layer GTL1, the second gate layer GTL2, the third gate layer GTL3, and the first data metal layer DTL1. The first organic layer 160 may be formed of an organic layer such as acryl resin, epoxy resin, phenolic resin, polyamide resin, polyimide resin, etc.

The second data metal layer DTL2 may be formed on the first organic layer 160. The second data metal layer DTL2 may include the first anode connection electrode ANDE1, the second anode connection electrode ANDE2, the first power supply line VDL, data lines DLj, and sensing lines RLq. The second data metal layer DTL2 may be formed as a single layer or multiple layers made of at least one of molybdenum (Mo), aluminum (Al), chromium (Cr), gold (Au), titanium (Ti), nickel (Ni), neodymium (Nd), and copper (Cu), or an alloy thereof.

The second organic layer 161 may be formed on the second data metal layer DTL2 for flattening a step. The second organic layer 161 may be formed of an organic layer such as acryl resin, epoxy resin, phenolic resin, polyamide resin, polyimide resin, etc.

The first connection contact hole BCNT1 may be a hole exposing the gate electrode DTG of the driving transistor DT penetrating the first interlayer insulating layer 141, the second interlayer insulating layer 142, the second gate insulating layer 132, and the third interlayer insulating layer 143. The second connection contact hole BCNT2 may be a hole exposing the second electrode D2 of the second transistor ST2 penetrating the second gate insulating layer 132 and the third interlayer insulating layer 143. The first connection electrode BE1 may be connected to the gate electrode DTG of the driving transistor DT through the first connection contact hole BCNT1, and may be connected to the second electrode D2 of the second transistor ST2 through the second connection contact hole BCNT2.

The third connection contact hole BCNT3 may be a hole exposing the first electrode DTS of the driving transistor DT penetrating the first gate insulating layer 131, the first interlayer insulating layer 141, the second interlayer insulating layer 142, the second gate insulating layer 132, and the third interlayer insulating layer 143. The fourth connection contact hole BCNT4 may be a hole exposing the first electrode S2 of the second transistor ST2 penetrating the second gate insulating layer 132 and the third interlayer insulating layer 143. The second connection electrode BE2 may be connected to the first electrode DTS of the driving transistor DT through the third connection contact hole BCNT3 and may be connected to the first electrode S2 of the second transistor ST2 through the fourth connection contact hole BCNT4.

The fifth connection contact hole BCNT5 may be a hole exposing the second electrode D1 of the first transistor ST1 penetrating the first gate insulating layer 131, the first interlayer insulating layer 141, the second interlayer insulating layer 142, the second gate insulating layer 132, and the third interlayer insulating layer 143. The sixth connection contact hole BCNT6 may be a hole exposing the third connection electrode BE3 penetrating the first organic layer 160. The third connection electrode BE3 may be connected to the second electrode D1 of the first transistor ST1 through the fifth connection contact hole BCNT5, and the $j^{th}$ data line DLj may be connected to the third connection electrode BE3 through the sixth connection contact hole BCNT6.

The seventh connection contact hole BCNT7 may be a hole exposing the first electrode S3 of the third transistor ST3 penetrating the second gate insulating layer 132 and the third interlayer insulating layer 143. The eighth connection contact hole BCNT8 may be a hole exposing the first initialization voltage line VIL1 penetrating the second interlayer insulating layer 142, the second gate insulating layer 132, and the third interlayer insulating layer 143. The fourth connection electrode BE4 may be connected to the first electrode S3 of the third transistor ST3 through the seventh connection contact hole BCNT7 and may be connected to the first initialization voltage line VIL1 through the eighth connection contact hole BCNT8.

The ninth connection contact hole BCNT9 may be a hole exposing the first electrode S4 of the fourth transistor ST4 penetrating the first gate insulating layer 131, the first interlayer insulating layer 141, the second interlayer insulating layer 142, the second gate insulating layer 132, and the third interlayer insulating layer 143. The tenth connection contact hole BCNT10 may be a hole penetrating the first organic layer 160 penetrating the fifth connection electrode BE5. The fifth connection electrode BE5 may be connected to the first electrode S4 of the fourth transistor ST4 through the ninth connection contact hole BCNT9, and the first power supply line VDL may be connected to the fifth connection electrode BE5 through the tenth connection contact hole BCNT10.

The eleventh connection contact hole BCNT11 may be a hole exposing the second electrode D5 of the fifth transistor ST5 penetrating the first gate insulating layer 131, the first interlayer insulating layer 141, the second interlayer insulating layer 142, the second gate insulating layer 132, and the third interlayer insulating layer 143. The twelfth connection contact hole BCNT12 may be a hole penetrating the first organic layer 160 penetrating the sixth connection electrode BE6. The sixth connection electrode BE6 may be connected to the second electrode D5 of the fifth transistor ST5 through the eleventh connection contact hole BCNT11, and the first anode connection electrode ANDE1 may be connected to the sixth connection electrode BE6 through the twelfth connection contact hole BCNT12.

The thirteenth connection contact hole BCNT13 may be a hole exposing the second electrode D6 of the sixth transistor ST6 penetrating the first gate insulating layer 131, the first interlayer insulating layer 141, the second interlayer insulating layer 142, the second gate insulating layer 132, and the third interlayer insulating layer 143. The second initialization voltage line VIL2 may be connected to the second electrode D6 of the sixth transistor ST6 through the thirteenth connection contact hole BCNT13.

A fourteenth connection contact hole BCNT14 may be a hole exposing the second capacitor electrode CE12 penetrating the second interlayer insulating layer 142, the second gate insulating layer 132, and the third interlayer insulating layer 143. The first power supply line VDL may be connected to the second capacitor electrode CE12 through the fourteenth connection contact hole BCNT14.

The first sensing contact hole RCT1 may be a hole exposing the gate electrode RG1 of the first sensing transistor RT1 penetrating the first interlayer insulating layer 141, the second interlayer insulating layer 142, the second gate insulating layer 132, and the third interlayer insulating layer 143. The second sensing contact hole RCT2 may be a hole exposing the first electrode RS2 of the second sensing transistor RT2 penetrating the second gate insulating layer 132 and the third interlayer insulating layer 143. The first sensing connection electrode RCE1 may be connected to the gate electrode RG1 of the first sensing transistor RT1 through the first sensing contact hole RCT1 and may be connected to the first electrode RS2 of the second sensing transistor RT2 through the second sensing contact hole RCT2.

The third sensing contact hole RCT3 may be a hole exposing the second electrode RD1 of the first sensing transistor RT1 penetrating the first gate insulating layer 131, the first interlayer insulating layer 141, the second interlayer insulating layer 142, the second gate insulating layer 132, and the third interlayer insulating layer 143. The fourth sensing contact hole RCT4 may be a hole exposing the first electrode RS3 of the third sensing transistor RT3 penetrating the second gate insulating layer 132 and the third interlayer insulating layer 143. The second sensing connection electrode RCE2 may be connected to the second electrode RD1 of the first sensing transistor RT1 through the third sensing contact hole RCT3, and may be connected to the first electrode RS3 of the third sensing transistor RT3 through the fourth sensing contact hole RCT4.

The fifth sensing contact hole RCT5 may be a hole exposing the second electrode RD2 of the second sensing transistor RT2 penetrating the second gate insulating layer 132 and the third interlayer insulating layer 143. The sixth sensing contact hole RCT6 may be a hole exposing the initialization connection electrode VIE penetrating the first gate insulating layer 131, the first interlayer insulating layer 141, the second interlayer insulating layer 142, the second gate insulating layer 132, and the third interlayer insulating layer 143. The third sensing connection electrode RCE3 may be connected to the second electrode RD2 of the second sensing transistor RT2 through the fifth sensing contact hole RCT5 and may be connected to the initialization connection electrode VIE through the sixth sensing contact hole RCT6.

The seventh sensing contact hole RCT7 may be a hole exposing the initialization connection electrode VIE penetrating the first gate insulating layer 131, the first interlayer insulating layer 141, the second interlayer insulating layer 14, the second gate insulating layer 132, and the third interlayer insulating layer 143. The eighth sensing contact hole RCT8 may be a hole exposing the scan initialization line GILk penetrating the third interlayer insulating layer 143. The fourth sensing connection electrode RCE4 may be connected to the initialization connection electrode VIE through the seventh sensing contact hole RCT7, and may be connected to the scan initialization line GILk through the eighth sensing contact hole RCT8.

The ninth sensing contact hole RCT9 may be a hole exposing the second electrode RD3 of the third sensing transistor RT3 penetrating the second gate insulating layer 132 and the third interlayer insulating layer 143. The tenth sensing contact hole RCT10 may be a hole exposing the fifth sensing connection electrode RCE5 penetrating the first organic layer 160. The fifth sensing connection electrode RCE5 may be connected to the second electrode RD3 of the third sensing transistor RT3 through the ninth sensing contact hole RCT9, and the $q^{th}$ sensing line RLq may be connected to the fifth sensing connection electrode RCE5 through the tenth sensing contact hole RCT10.

The eleventh sensing contact hole RCT11 may be a hole exposing the first electrode RS1 of the first sensing transistor RT1 penetrating the first gate insulating layer 131, the first interlayer insulating layer 141, the second interlayer insulating layer 142, the second gate insulating layer 132, and the third interlayer insulating layer 143. The fifth connection electrode BE5 may be connected to the first electrode RS1 of the first sensing transistor RT1 through the eleventh sensing contact hole RCT11.

The twelfth sensing contact hole RCT12 may be a hole exposing the first sensing connection electrode RCE1 penetrating the first organic layer 160. The second anode connection electrode ANDE2 may be connected to the first sensing connection electrode RCE1 through the twelfth sensing contact hole RCT12.

The light emitting element layer EML may be formed on the thin film transistor layer TFTL. The light emitting element layer EML may include light emitting elements LE, optical elements PD, and a bank 180 which are disposed on the second organic layer 161.

Each of the light emitting elements LE may include a first electrode 171, an organic light emitting layer 172, and a second electrode 173. Each of the optical elements PD may include a first electrode 174, a photoelectric conversion layer 175, and the second electrode 173. The light emitting elements LE and the optical elements PD may share the second electrode 173.

The first electrode 171 of each of the light emitting elements LE and the first electrode 174 of each of the optical elements PD may be formed on the second organic layer 161. The first electrode 171 of each of the light emitting elements LE may be connected to the first anode connection electrode ANDE1 through the first anode contact hole ANCT1 penetrating the first organic layer 160. The first electrode 174 of each of the optical elements PD may be connected to the second anode connection electrode ANDE2 through the second anode contact hole ANCT2 penetrating the second organic layer 161.

The first electrode 171 of each of the light emitting elements LE and the first electrode 174 of each of the optical elements PD may be formed of a metal material having a high reflectance such as a stacked structure of aluminum and titanium (Ti/Al/Ti), a stacked structure of aluminum and ITO (ITO/Al/ITO), an APC alloy, and a stacked structure of an APC alloy and ITO (ITO/APC/ITO). The APC alloy may be an alloy of silver (Ag), palladium (Pd), and copper (Cu).

The bank 180 may be formed on the second organic layer 161 to define the light emitting units ELU1, ELU2, ELU3, ELU4 of the display pixels PX1, PX2, PX3, and PX4 and the light sensing units PSU of the light sensing pixels PS. The bank 180 may divide the light emitting units ELU1, ELU2, ELU3, and ELU4 and the light sensing units PSU. Each of the light emitting units ELU1, ELU2, ELU3, and ELU4 may be an area in which holes from the first electrode 171 and electrons from the second electrode 173 are recombined in the organic light emitting layer 172 to emit light by sequentially stacking the first electrode 171, the organic light emitting layer 172, and the second electrode 173.

The bank 180 may be formed to cover edges of the first electrode 171 of each of the light emitting elements LE and the first electrode 174 of each of the optical elements PD. The bank 180 may be formed of an organic layer such as an acrylic resin, an epoxy resin, a phenolic resin, a polyamide resin, or a polyimide resin.

The organic light emitting layer 172 may be formed on the first electrode 171 of each of the light emitting elements LE. The organic light emitting layer 172 may include an organic material to emit a predetermined (or selectable) color. For example, the organic light emitting layer 172 may include a hole transporting layer, an organic material layer, and an electron transporting layer. The organic light emitting layer 172 of the first light emitting unit ELU1 may emit a first light, and the organic light emitting layer 172 of the second light emitting unit ELU2 may emit a second light. The organic light emitting layer 172 of the third light emitting unit ELU3 may emit the third light, and the organic light emitting layer 172 of the fourth light emitting unit ELU4 may emit the second light.

In another embodiment, in case that the organic light emitting layer 172 is commonly formed in the light emitting units ELU1, ELU2, ELU3, ELU4 of the display pixels PX1, PX2, PX3, and PX4, the organic light emitting layer 172 may emit white light. The first light emitting unit ELU1 may overlap the first color filter transmitting the first light, and the second light emitting unit ELU2 may overlap the second color filter transmitting the second light. Also, the third light emitting unit ELU3 may overlap the third color filter transmitting the third light, and the fourth light emitting unit ELU4 may overlap the second color filter transmitting the second light.

Each of the light sensing units PSU may represent an area in which a first electrode 174, a photoelectric conversion layer 175, and a second electrode 173 are sequentially stacked to convert externally incident light into an electrical signal. The photoelectric conversion layer 175 may include an organic material.

The second electrode 173 may be disposed on the organic light emitting layer 172, the photoelectric conversion layer 175, and the bank 180. The second electrode 173 may be formed to cover the organic light emitting layer 172 and the photoelectric conversion layer 175. The second electrode 173 may be commonly formed in the light emitting units ELU1, ELU2, ELU3, and ELU4 and the light sensing units PSU. A capping layer may be formed on the second electrode 173.

In the upper light emitting structure, the second electrode 173 may be formed of a transparent metal material (TCO, Transparent Conductive Material) such as ITO or IZO that may transmit light, or magnesium (Mg), silver (Ag), or a semi-transmissive conductive material such as an alloy of magnesium (Mg) and silver (Ag). In case that the second electrode 173 is formed of the transflective metal material, light output efficiency of each of the light emitting units ELU1, ELU2, ELU3, and ELU4 may be increased due to a micro cavity.

The encapsulation layer TFE may be formed on the light emitting element layer EML. The encapsulation layer TFE may include at least one inorganic layer to prevent oxygen or moisture from penetrating into the light emitting element layer EML. Also, the encapsulation layer TFE may include at least one organic layer to protect the light emitting element layer EML from foreign substances such as dust.

As shown in FIGS. 13 to 17, the driving transistor DT, the first transistor ST1, and the fourth to sixth transistors ST4 to ST6 of the first pixel driving unit PDU1 may be formed of the P-type MOSFET including the first active layer ACT1 having a silicon semiconductor while the second transistor ST2 and the third transistor ST3 may be formed of an N-type MOSFET including the second active layer ACT2 having an oxide semiconductor. Accordingly, the first sensing transistor RT1 of the sensing driving unit PSDU may be formed of a P-type MOSFET including the first active layer ACT1 and the second sensing transistor RT2 and the third sensing transistor RT3 may be formed of an N-type MOSFET including the second active layer ACT2 without adding a separate process. Therefore, it is possible to reduce a decrease in the fingerprint sensing capability due to the off-leakage current of the second sensing transistor RT2 and the off-leakage current of the third sensing transistor RT3.

Figure 18:
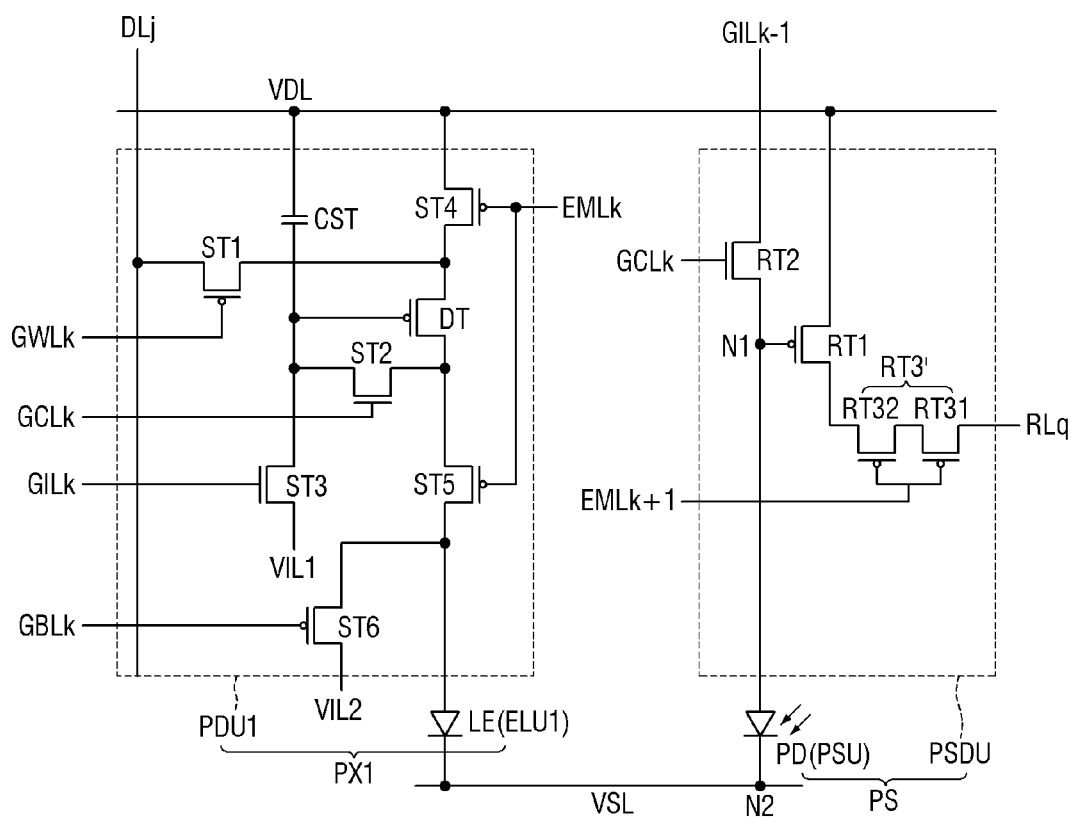
FIG. 18 is a schematic diagram of an equivalent circuit of a display pixel and the light sensing pixel according to one or more embodiments.

FIG. 18 is a schematic diagram of an equivalent circuit of a display pixel and the light sensing pixel according to one or more embodiments.

The embodiment of FIG. 18 is different from the embodiment of FIG. 9 in that the third sensing transistor RT3' includes multiple sub-transistors RT31 and RT32 formed of a P-type MOSFET. In FIG. 18, a description overlapping with the embodiment of FIG. 9 will be omitted.

Referring to FIG. 18, the third sensing transistor RT3' may include a first sub-transistor RT31 and a second sub-transistor RT32. The first sub-transistor RT31 and the second sub-transistor RT32 may be turned-on by the k+1$^{th}$ emitting signal of the k+1$^{th}$ light emitting line EMLk+1, and the second electrode of the first sensing transistor RT1 may be connected to the q$^{th}$ sensing line RLq. Accordingly, the sensing current of the first sensing transistor RT1 may flow to the q$^{th}$ sensing line RLq.

The gate electrode of the first sub-transistor RT31 may be connected to the k+1$^{th}$ light emitting line EMLk+1, the first electrode may be connected to the second electrode of the second sub-transistor RT32, and the second electrode may be connected to the q$^{th}$ sensing line RLq. The gate electrode of the second sub-transistor RT32 may be connected to the k+1$^{th}$ light emitting line EMLk+1, the first electrode may be connected to the second electrode of the first sensing transistor RT1, and the second electrode may be connected to the second electrode of the first sensing transistor RT1.

The active layer of the first sub-transistor RT31 and the active layer of the second sub-transistor RT32 may be made of polysilicon. The first sub-transistor RT31 and the second sub-transistor RT32 may be formed of a P-type MOSFET.

As shown in FIG. 18, the driving transistor DT, the first transistor ST1, and the fourth to sixth transistors ST4 to ST6 of the first pixel driving unit PDU1 may be formed of a P-type MOSFET, and the second transistor ST2 and the third transistor ST3 may be formed of an N-type MOSFET. Therefore, the embodiment of the specification may form the first and third sensing transistors RT1 and RT3' as a P-type MOSFET and may form the second sensing transistor RT2 as an N-type MOSFET without adding a separate process. By forming the second sensing transistor RT2 as an N-type MOSFET, it is possible to reduce a decrease in the fingerprint sensing capability due to an off-leakage current of the second sensing transistor RT2.

Since the third sensing transistor RT3' is formed of a dual transistor in which multiple transistors are connected in series, deterioration of the fingerprint sensing ability due to an off-leakage current of the third sensing transistor RT3' may be reduced.

The first pixel driving unit PDU1 and the sensing driving unit PSDU may share the k$^{th}$ scan control line GCLk, the k+1$^{th}$ light emitting line EMLk+1, the k-1$^{th}$ scan initialization line GILk-1, the first power supply line VDL, and the second power supply line VSL. Therefore, although the sensing driving unit PSDU is added, there is an advantage in that a separate wire to which a separate signal for driving the sensing driving unit PSDU is applied is not required.

Figure 34:
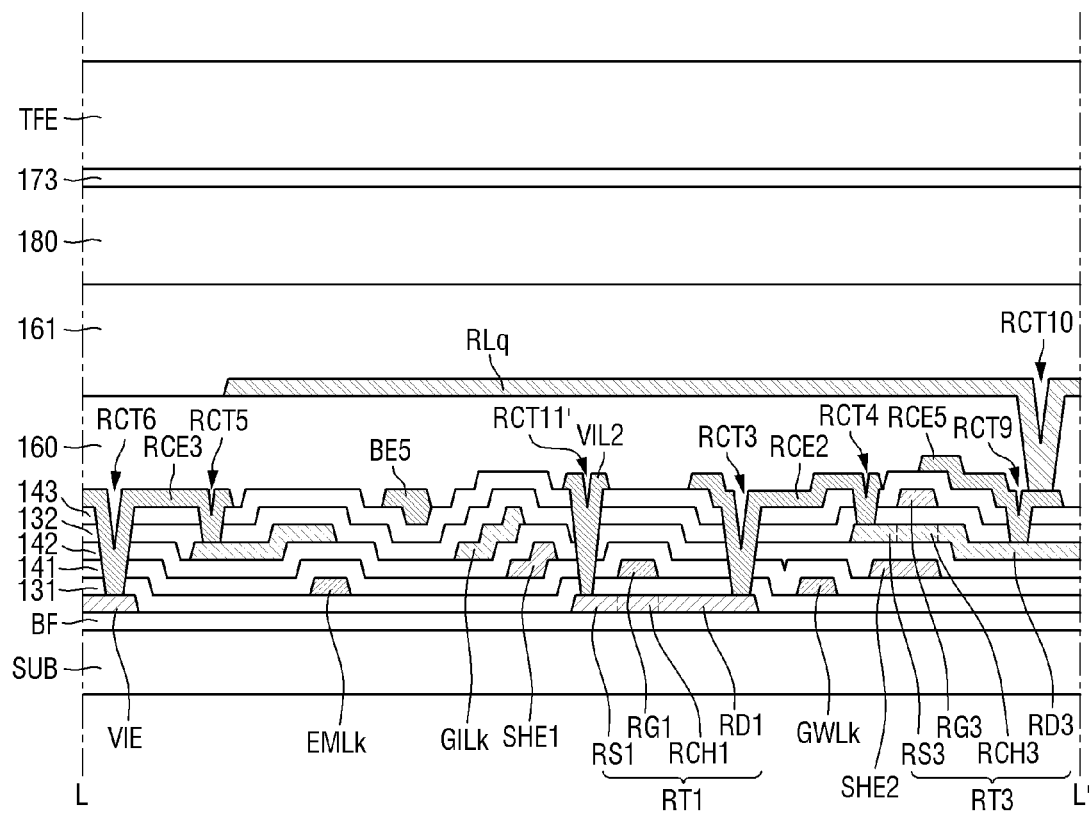
FIG. 34 is a schematic cross-sectional view illustrating an embodiment of the display panel taken along line L-L' of FIGS. 32 and 33.

Although FIG. 18 illustrates that the first electrode of the first sensing transistor RT1 is connected to the first power supply line VDL, the embodiment of the specification is not limited thereto. The first electrode of the first sensing transistor RT1 may be connected to the first initialization line VIL1 or may be connected to the second initialization line VIL2 as shown in FIG. 34. Accordingly, the layouts of FIGS. 20 and 21 may be modified.

Figure 19:
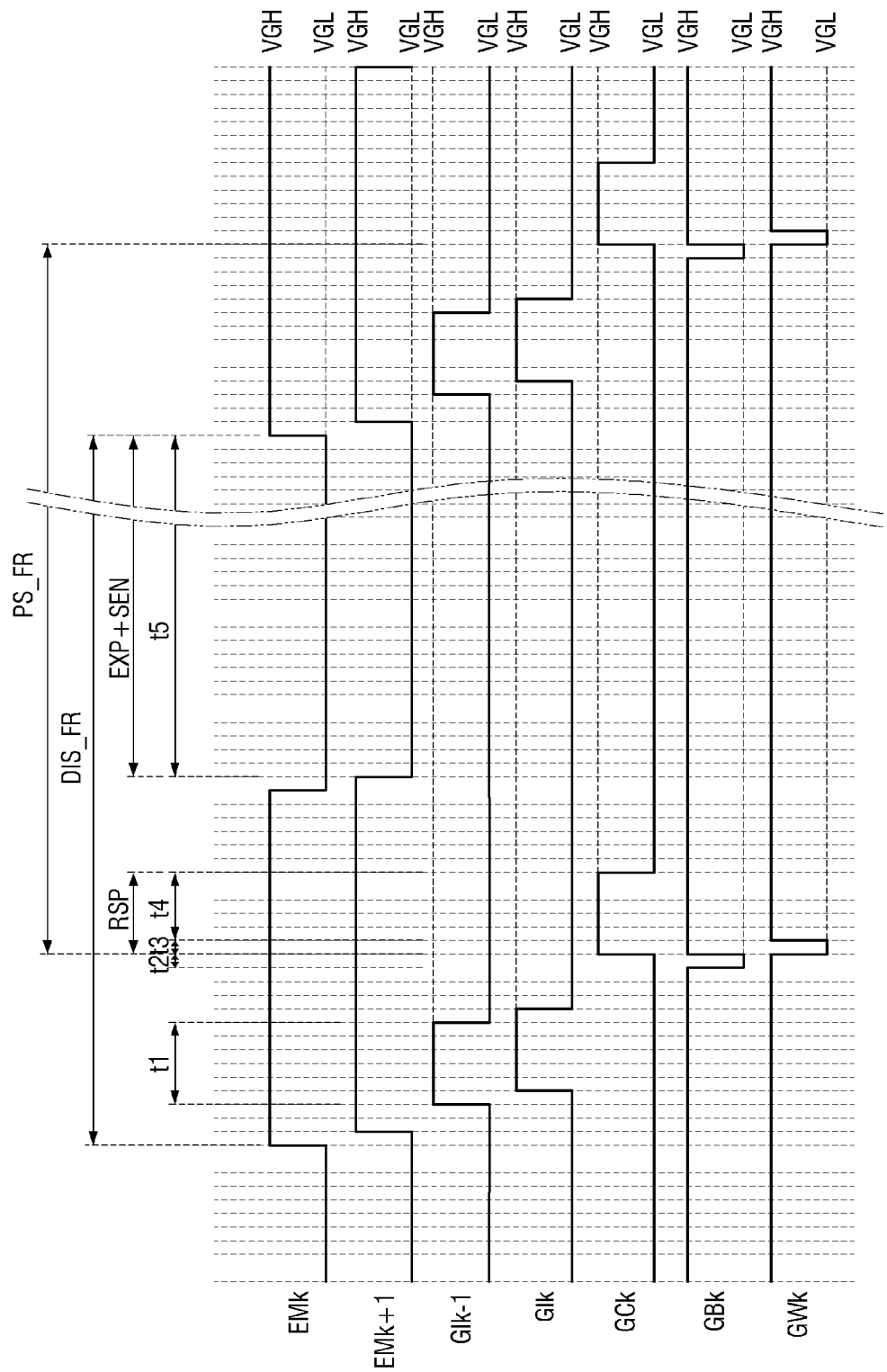
FIG. 19 is a waveform diagram illustrating a $k-1^{th}$ scan initialization signal, a $k^{th}$ scan initialization signal, a $k^{th}$ scan control signal, a $k^{th}$ scan write signal, a $k^{th}$ scan bias signal, a $k^{th}$ emitting signal and a $k+1^{th}$ emitting signal applied to a display pixel and a light sensing pixel according to one or more embodiment.

FIG. 19 is a waveform diagram illustrating a k-1$^{th}$ scan initialization signal, a k$^{th}$ scan initialization signal, a k$^{th}$ scan control signal, a k$^{th}$ scan write signal, a k$^{th}$ scan bias signal, a k$^{th}$ emitting signal and a k+1$^{th}$ emitting signal applied to a display pixel and a light sensing pixel according to one or more embodiments.

The embodiment of FIG. 19 is different from the embodiment of FIG. 10 in that the k+1$^{th}$ emitting signal EMk+1 is added. In FIG. 19, a description overlapping with the embodiment of FIG. 10 will be omitted.

Referring to FIG. 19, the k+1$^{th}$ emitting signal EMk+1 may be a signal applied to the k+1$^{th}$ emitting line EMLk+1, and may be a signal for controlling turn-on and turn-off of the third sensing transistor RT3'. The k+1$^{th}$ emitting signal EMk+1 may be repeated in one frame period DIS_FR and PS_FR.

The k+1$^{th}$ emitting signal EMk+1 may have a first level voltage VGL during the light exposure and detection period EXP+SEN, and may have a second level voltage VGH during the reset period RSP.

Hereinafter, the operation of the light sensing pixel PS during the reset period RSP and the light exposure and sensing period EXP+SEN will be described in detail.

The operation of the light sensing pixel PS during the reset period RSP may be substantially the same as described with reference to FIGS. 9 and 10.

During the light exposure and detection period EXP+SEN, light emitted from the light emitting element LE may be reflected from the fingerprint of the finger F to be incident on the optical element PD. Accordingly, in case that light is incident on the optical element PD, photocharges may be generated, and the generated photocharges may be accumulated in the anode electrode of the optical element PD. Accordingly, the voltage of the first node N1 may increase. As the amount of charge accumulated in the first node N1 increases, the voltage of the first node N1 increases, so that the light exposure period EXP may be set to be sufficiently long.

During the light exposure and detection period EXP+SEN, the k+1$^{th}$ emitting signal EMk+1 having the first level voltage VGL may be supplied to the k+1$^{th}$ emitting line EMLK+1. During the light exposure and detection period EXP+SEN, the third sensing transistor RT3' may be turned-on by the k+1$^{th}$ emitting signal EMk+1 having the first level voltage VGL. Due to the turn-on of the third sensing transistor RT3', the sensing current of the first sensing transistor RT1 according to the voltage of the first node N1 may flow to the q$^{th}$ sensing line RLq. The sensor driving circuit 300 may sense the sensing voltage charged in the q$^{th}$ sensing line RLq by the sensing current, and thus the detected fingerprint pattern may be compared with a pre-stored fingerprint pattern. For example, fingerprint authentication may be possible using the display device 10.

The operations of the second display pixel PX2, the third display pixel PX3, and the fourth display pixel PX4 are substantially the same as the operations of the first display pixel PX1 described with reference to FIGS. 18 and 19. Therefore, a description of the operations of the second display pixel PX2, the third display pixel PX3, and the fourth display pixel PX4 will be omitted.

Figure 20:
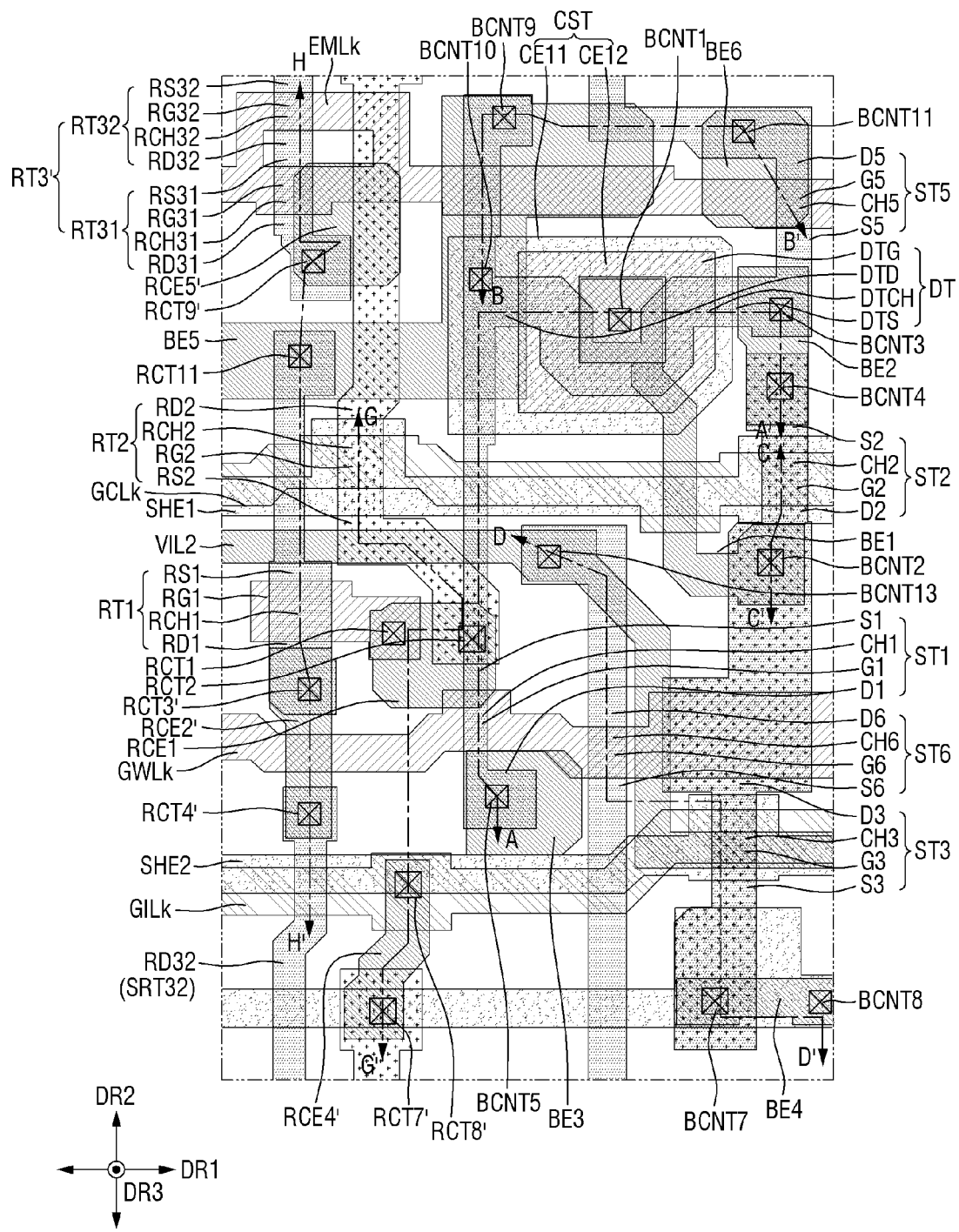
FIG. 20 is a layout diagram illustrating a first active layer, a first gate layer, a second gate layer, a second active layer, a third gate layer, and a first source-drain layer of the first sub-pixel and the light sensing pixel according to one or more embodiments.
Figure 21:
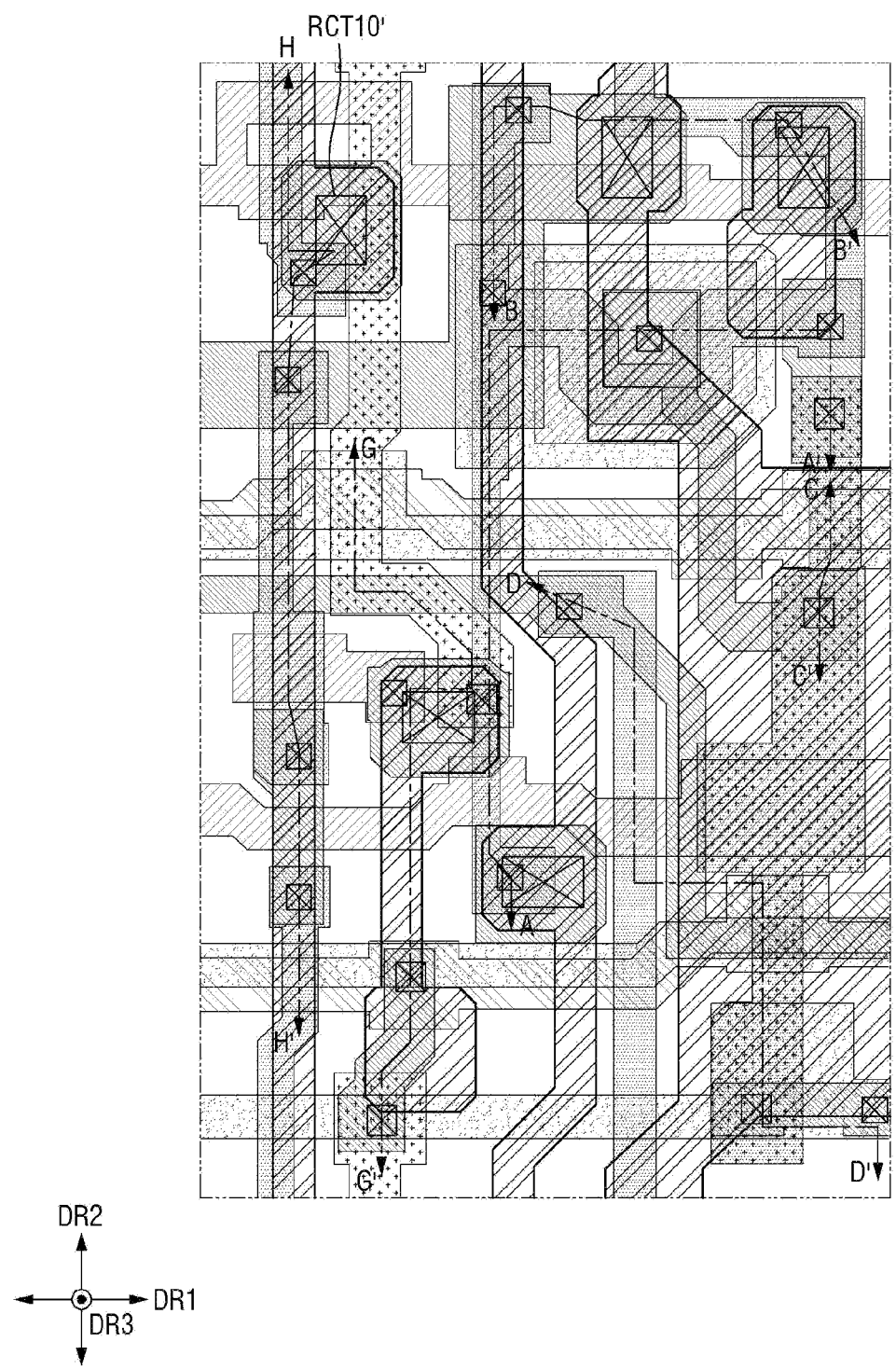
FIG. 21 is a layout diagram illustrating a first active layer, a first gate layer, a second gate layer, a second active layer, a third gate layer, a first source-drain layer, and a second source-drain layer of the first sub-pixel and the light sensing pixel according to one or more embodiments.

FIG. 20 is a layout diagram illustrating a first active layer, a first gate layer, a second gate layer, a second active layer, a third gate layer, and a first source-drain layer of the first sub-pixel and the light sensing pixel according to one or more embodiments. FIG. 21 is a layout diagram illustrating a first active layer, a first gate layer, a second gate layer, a second active layer, a third gate layer, a first source-drain layer, and a second source-drain layer of the first sub-pixel and the light sensing pixel according to one or more embodiments.

The embodiments of FIGS. 20 and 21 are different from the embodiments of FIGS. 11 and 12 in that the third sensing transistor RT3' and the second, fourth and fifth sensing connection electrodes RCE2', RCE4', and RCE5' are added. In FIGS. 20 and 21, descriptions overlapping those of the embodiments of FIGS. 11 and 12 will be omitted.

Referring to FIGS. 20 and 21, the third sensing transistor RT3' may include the first sub-transistor RT31 and the second sub-transistor RT32.

The first sub-transistor RT31 may be connected to a channel layer RCH31, a gate electrode RG31, a first electrode RS31, and a second electrode RD31. The channel layer RCH31 of the first sub-transistor RT31 may overlap the gate electrode RG31 of the first sub-transistor RT31. The gate electrode RG31 of the first sub-transistor RT31 may be disposed on the channel layer RCH31 of the first sub-transistor RT31. The gate electrode RG31 of the first sub-transistor RT31 may be integrally formed with the k+1$^{th}$ light emitting line EMLk+1. The gate electrode RG31 of the first sub-transistor RT31 may be a part of the k+1$^{th}$ light emitting line EMLk+1.

The first electrode RS31 of the first sub-transistor RT31 may be connected to the fifth sensing connection electrode RCE5' through a ninth sensing contact hole RCT9'. The fifth sensing connection electrode RCE5' may be connected to the q$^{th}$ sensing line RLq through a tenth sensing contact hole RCT10'. The second electrode RD31 of the first sub-transistor RT31 may be connected to a first electrode RS32 of the second sub-transistor RT32.

The second sub-transistor RT32 may be connected to a channel layer RCH32, a gate electrode RG32, a first electrode RS32, and a second electrode RD32. The channel layer RCH32 of the second sub-transistor RT32 may overlap the gate electrode RG32 of the second sub-transistor RT32. The gate electrode RG32 of the second sub-transistor RT32 may be disposed on the channel layer RCH32 of the second sub-transistor RT32. The gate electrode RG32 of the second sub-transistor RT32 may be integrally formed with the k+1$^{th}$ light emitting line EMLk+1. The gate electrode RG32 of the second sub-transistor RT32 may be a part of the k+1$^{th}$ light emitting line EMLk+1.

The first electrode RS32 of the second sub-transistor RT32 may be connected to the second electrode RD31 of the first sub-transistor RT31. The second electrode RD32 of the second sub-transistor RT32 may be connected to a second sensing connection electrode RCE2' through a fourth sensing contact hole RCT4'. The second sensing connection electrode RCE2' may be connected to the second electrode RD1 of the first sensing transistor RT1 through a third sensing contact hole RCT3'. A fourth sensing connection electrode RCE4' may be connected to the first electrode RS1 of the second sensing transistor RCT2 through a seventh sensing contact hole RCT7'. The fourth sensing connection electrode RCE4' may be connected to the k-1$^{th}$ scan initialization line GILk-1 through an eighth sensing contact hole RCT8'.

Since the first electrode RS32 of the second sub-transistor RT32 is extended in the second direction DR2, it may be disposed in the sensing driving unit PSDU disposed in the k$^{th}$ and k+1$^{th}$ rows. For this reason, the first electrode RS32 of the second sub-transistor RT32 connected to the second electrode RD1 of the first sensing transistor RT1 disposed in the sensing driving unit PSDU of the k$^{th}$ row may be connected to the k+1$^{th}$ light emitting line EMLk+1. In case that the first electrode RS32 of the second sub-transistor RT32 is disposed in the sensing driving unit PSDU disposed in the k-1 and k$^{th}$ rows, the first electrode RS32 of the second sub-transistor RT32 connected to the second electrode RD1 of the first sensing transistor RT1 disposed in the sensing driving unit PSDU of the k-1$^{th}$ row may be connected to the k$^{th}$ light emitting line EMLK.

Since the first electrode RS2 of the second sensing transistor RT2 is extended in the second direction DR2, it may be disposed in the sensing driving unit PSDU disposed in the k-1$^{th}$ row and the k$^{th}$ row. Accordingly, the first electrode RS2 of the second sensing transistor RT2 disposed in the sensing driving unit PSDU of the k$^{th}$ row may be connected to the k-1$^{th}$ scan initialization line GILk-1. Also, in case that the first electrode RS2 of the second sensing transistor RT2 is disposed in the sensing driving unit PSDU disposed in the k$^{th}$ row and the k+1$^{th}$ row, the first electrode RS2 of the second sensing transistor RT2 disposed in the sensing driving unit PSDU of the k+1$^{th}$ row may be connected to the k$^{th}$ scan initialization line GILk.

Since the second pixel driving unit PDU2, the third pixel driving unit PDU3, and the fourth pixel driving unit PDU4 are substantially the same as the first pixel driving unit PDU1 described with reference to FIGS. 20 and 21, a description of these will be omitted.

Figure 22:
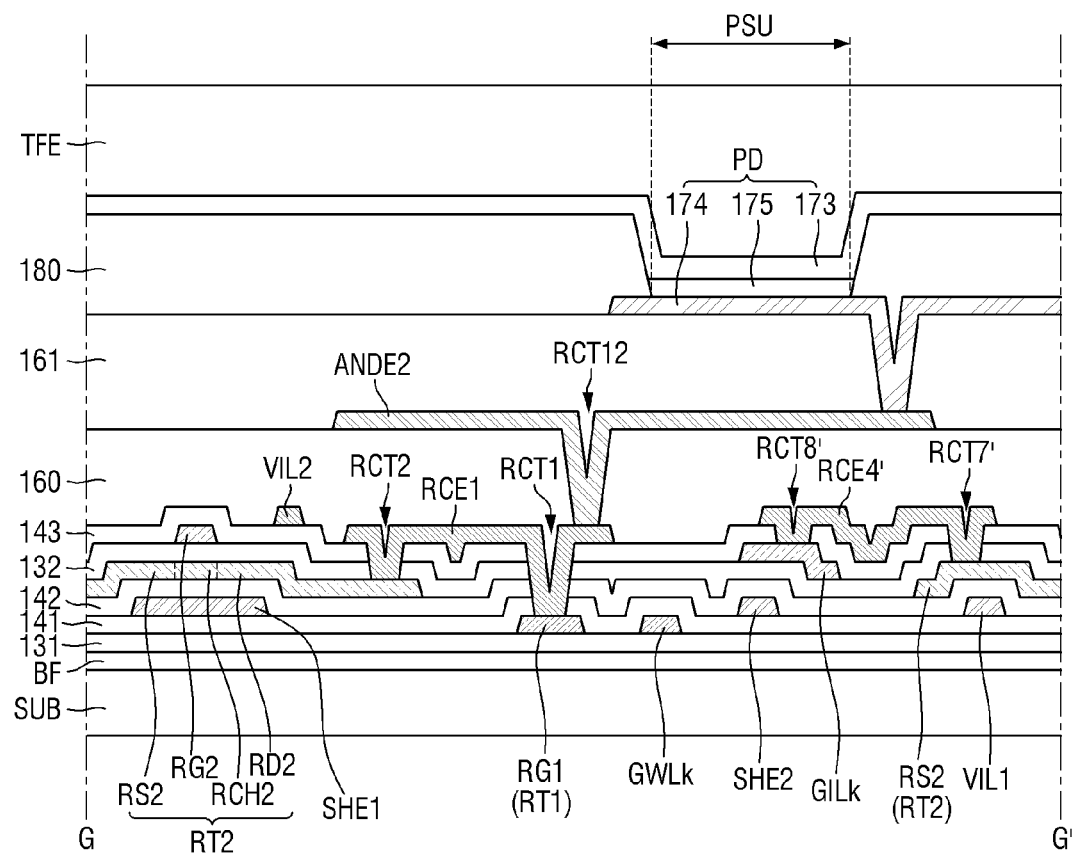
FIG. 22 is a schematic cross-sectional view illustrating an embodiment of the display panel taken along line G-G' of FIGS. 20 and 21.
Figure 23:
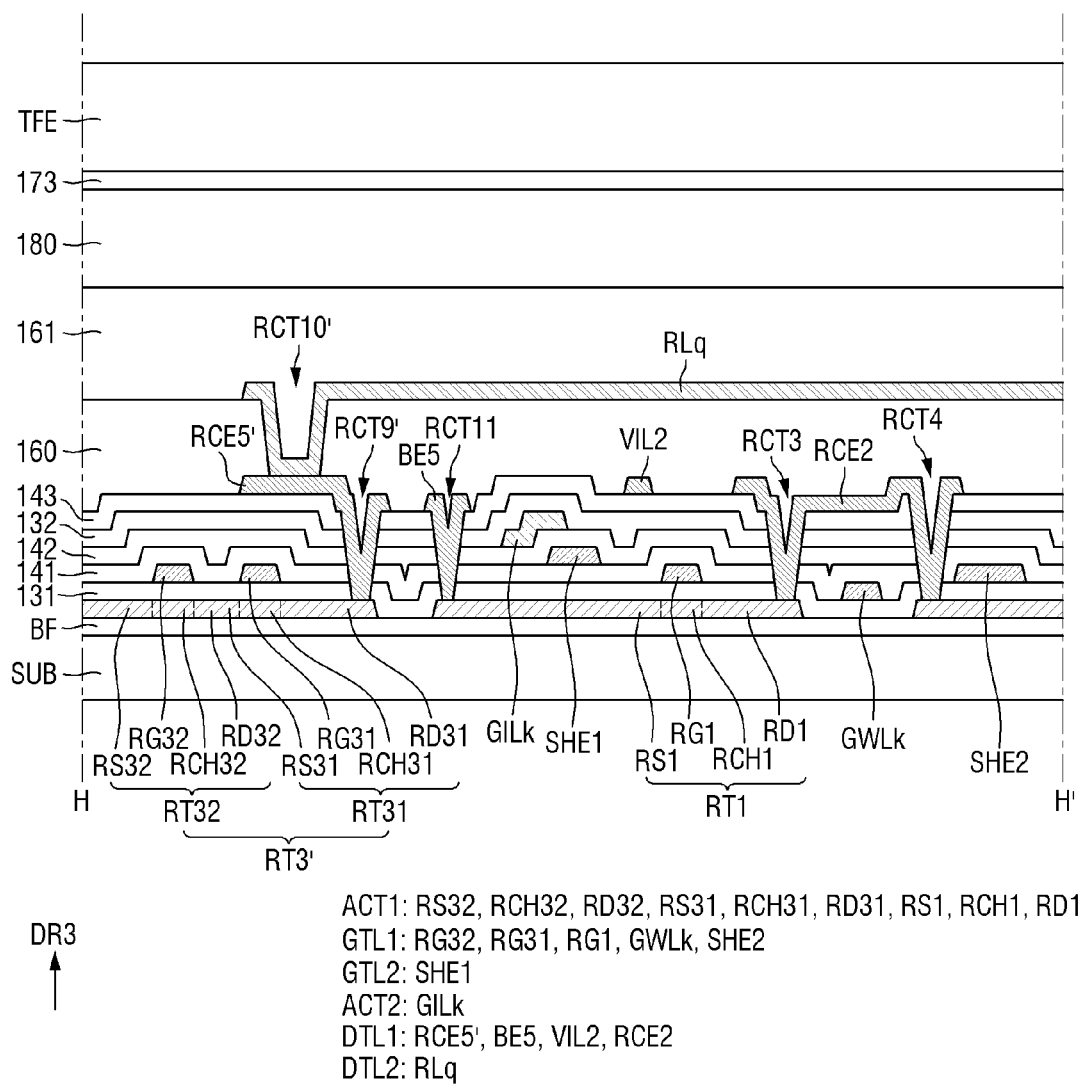
FIG. 23 is a schematic cross-sectional view illustrating an embodiment of the display panel taken along line H-H' of FIGS. 20 and 21.

FIG. 22 is a schematic cross-sectional view illustrating an embodiment of the display panel taken along line G-G' of FIGS. 20 and 21. FIG. 23 is a schematic cross-sectional view illustrating an embodiment of the display panel taken along line H-H' of FIGS. 20 and 21.

The embodiments of FIGS. 22 and 23 is different from the embodiments of FIGS. 16 and 17 in that the first sub-transistor RT31, the second sub-transistor RT32, and the second, fourth, and fifth connection electrodes RCE2', RCE4', and RCE5' of the third sensing transistor RT3' are added. In FIGS. 22 and 23, descriptions overlapping those of the embodiments of FIGS. 16 and 17 will be omitted.

Referring to FIGS. 22 and 23, the first active layer ACT1 may include the channel layers RCH31 and RCH32, the first electrodes RS31 and RS32, and the second electrodes RD31 and RD32 of the sub-transistors RT31 and RT32.

The channel layer RCH31 of the first sub-transistor RT31 may be an area overlapping a gate electrode RG31 of the first sub-transistor RT31 in the third direction DR3. The first electrode RS31 of the first sub-transistor RT31 may be disposed on a side of the channel layer RCH31, and the second electrode RD31 may be disposed on another side of the channel layer RCH31. The first electrode RS31 and the second electrode RD31 of the first sub-transistor RT31 may be areas that do not overlap the gate electrode RG31 in the third direction DR3. The first electrode RS31 and the second electrode RD31 of the first sub-transistor RT31 may be areas having conductivity by doping the silicon semiconductor with ions or impurities.

The channel layer RCH32 of the second sub-transistor RT32 may be an area overlapping a gate electrode RG32 of the second sub-transistor RT32 in the third direction DR3. The first electrode RS32 of the second sub-transistor RT32 may be disposed on a side of the channel layer RCH32, and the second electrode RD32 may be disposed on another side of the channel layer RCH32. The first electrode RS32 and the second electrode RD32 of the second sub-transistor RT32 may be areas that do not overlap the gate electrode RG32 in the third direction DR3. The first electrode RS32 and the second electrode RD32 of the second sub-transistor RT32 may be areas having conductivity by doping the silicon semiconductor with ions or impurities.

The first gate layer GTL1 may include the gate electrode RG31 of the first sub-transistor RT31 and the gate electrode RG32 of the second sub-transistor RT32.

The third sensing contact hole RCT3' may be a hole exposing the second electrode RD1 of the first sensing transistor RT1 penetrating the first gate insulating layer 131, the first interlayer insulating layer 141, the second interlayer insulating layer 142, the second gate insulating layer 132, and the third interlayer insulating layer 143. The fourth sensing contact hole RCT4' may be a hole exposing the second electrode RD32 of the second sub-transistor SRT32 penetrating the first gate insulating layer 131, the first interlayer insulating layer 141, the second interlayer insulating layer 142, the second gate insulating layer 132, and the third interlayer insulating layer 143. The second sensing connection electrode RCE2' may be connected to the second electrode RD1 of the first sensing transistor RT1 through the third sensing contact hole RCT3', and may be connected to the second electrode RD32 of the second sub-transistor SRT32 through the fourth sensing contact hole RCT4'.

The seventh sensing contact hole RCT7' may be a hole exposing the first electrode RS2 of the second sensing transistor RT2 penetrating the second gate insulating layer 132 and the third interlayer insulating layer 143. The eighth sensing contact hole RCT8' may be a hole exposing the scan initialization line GILk penetrating the third interlayer insulating layer 143. The fourth sensing connection electrode RCE4' may be connected to the first electrode RS2 of the second sensing transistor RT2 through the seventh sensing contact hole RCT7', and may be connected to the scan initialization line GILk through the eighth sensing contact hole RCT8'.

The ninth sensing contact hole RCT9' may be a hole exposing the second electrode RD31 of the first sub-transistor SRT31 penetrating the first gate insulating layer 131, the first interlayer insulating layer 141, the second interlayer insulating layer 142, the second gate insulating layer 132, and the third interlayer insulating layer 143. The tenth sensing contact hole RCT10' may be a hole exposing the fifth sensing connection electrode RCE5' penetrating the first organic layer 160. The fifth sensing connection electrode RCE5' may be connected to the first electrode RS31 of the first sub-transistor SRT31 through the ninth sensing contact hole RCT9', and the $q^{th}$ sensing line RLq may be connected to the fifth sensing connection electrode RCE5' through the tenth sensing contact hole RCT10'.

As shown in FIGS. 22 and 23, the driving transistor DT, the first transistor ST1, and the fourth to sixth transistors ST4 to ST6 of the first pixel driving unit PDU1 may be formed of a P-type MOSFET including the first active layer ACT1 having a silicon semiconductor while the second transistor ST2 and the third transistor ST3 may be formed of an N-type MOSFET including the second active layer ACT2 having an oxide semiconductor. For this reason, the first sensing transistor RT1 and the third sensing transistor RT3' of the photo sensing driving unit PSDU may be formed of a P-type MOSFET including the first active layer ACT1, and the second sensing transistor RT2 may be formed of a P-type MOSFET including the second active layer ACT2 without additional process. Therefore, deterioration of the fingerprint sensing capability may be reduced due to the off-leakage current of the second sensing transistor RT2.

Figure 24:
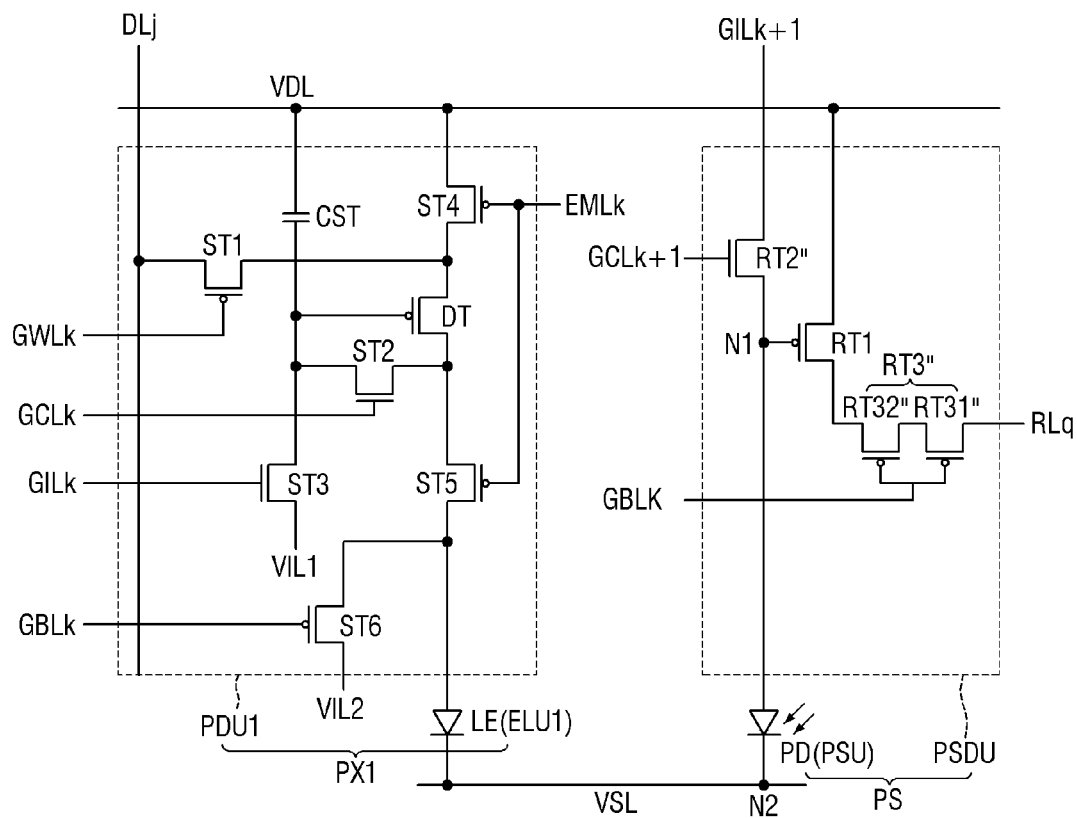
FIG. 24 is a schematic diagram of an equivalent circuit of a display pixel and a light sensing pixel according to one or more embodiments.

Since an embodiment of the display panel cut along line A-A', an embodiment of the display panel cut along line B-B', an embodiment of the display panel cut along line C-C', and an embodiment of the display panel cut along D-D' of FIGS. 20 and 21 are substantially the same as that described with reference to FIGS. 13 to 15, a description of these will be omitted. FIG. 24 is a schematic diagram of an equivalent circuit of a display pixel and a light sensing pixel according to one or more embodiments.

The embodiment of FIG. 24 is different from the embodiment of FIG. 9 in that the gate electrode of the second sensing transistor RT2" is connected to the k+1th scan control line GCLk+1 and a third sensing transistor RT3" includes multiple sub-transistors RT31" and RT32" formed of a P-type MOSFET. In FIG. 24, a description overlapping with the embodiment of FIG. 9 will be omitted.

Referring to FIG. 24, the second sensing transistor RT2" may be turned-on by the $k+1^{th}$ scan control signal of the $k+1^{th}$ scan control line GCLk+1, and connect the $k+1^{th}$ scan initialization line GILk+1 to the first node N1. The gate electrode of the second sensing transistor RT2" may be connected to the $k+1^{th}$ scan control line GCLk+1, the first electrode of the second sensing transistor RT2" may be connected to the $k+1^{th}$ scan initialization line GILk+1, and the second electrode of the second sensing transistor RT2" may be connected to the first node N1.

The third sensing transistor RT3" may include a first sub-transistor RT31" and a second sub-transistor RT32". The first sub-transistor RT31" and the second sub-transistor RT32" may be turned-on by the $k^{th}$ scan bias signal of the $k^{th}$ scan bias line GBLk and connect the second electrode of the first sensing transistor RT to the $q^{th}$ sensing line RLq. Accordingly, the sensing current of the first sensing transistor RT1 may flow to the $q^{th}$ sensing line RLq. The $k^{th}$ scan bias signal of the $k^{th}$ scan bias line GBLk may be substantially the same as the $k-1^{th}$ scan write signal GWLk−1.

The gate electrode of the first sub-transistor RT31" may be connected to the $k^{th}$ scan bias line GBLk, the first electrode of the first sub-transistor RT31" may be connected to the $q^{th}$ sensing line RLq, and the second electrode of the first sub-transistor RT31" may be connected to the first electrode of the second sub-transistor RT32". The gate electrode of the second sub-transistor RT32" may be connected to the $k^{th}$ scan bias line GBLk, the first electrode of the second sub-transistor RT32" may be connected to the second electrode of the first sub-transistor RT31", and the second electrode of the second sub-transistor RT32" may be connected to the second electrode of the first sensing transistor RT1.

The active layer of the second sensing transistor RT2" may be formed of an oxide semiconductor. The second sensing transistor RT2" may be formed of an N-type MOSFET. The active layer of the first sub-transistor RT31" and the active layer of the second sub-transistor RT32" may be made of polysilicon. The first sub-transistor RT31" and the second sub-transistor RT32" may be formed of a P-type MOSFET.

As shown in FIG. 24, the driving transistor DT, the first transistor ST1, and the fourth to sixth transistors ST4 to ST6 of the first pixel driving unit PDU1 may be formed of a P-type MOSFET, and the second transistor ST2 and the third transistor ST3 of the first pixel driving unit PDU1 may be formed of an N-type MOSFET. Therefore, in the embodiment of FIG. 24, the first and third sensing transistors RT1" and RT3" may be formed of a P-type MOSFET, and the second sensing transistor RT2" may be formed of an N-type MOSFET without additional processes. By forming the second sensing transistor RT2" as an N-type MOSFET, deterioration of the fingerprint sensing capability may be reduced due to an off-leakage current of the second sensing transistor RT2".

Since the third sensing transistor RT3" is formed of a dual transistor in which multiple transistors are connected in series, deterioration of the fingerprint sensing ability due to an off-leakage current of the third sensing transistor RT3" may be reduced.

The first pixel driving unit PDU1 and the sensing driving unit PSDU may share the $k+1^{th}$ scan control line GCLk+1, the $k^{th}$ scan bias line GBLk, the $k+1^{th}$ scan initialization line GILk+1, the first power supply line VDL, and the second power supply line VSL. Therefore, although the sensing driving unit PSDU is added, there is an advantage in that a separate wire to which a separate signal for driving the sensing driving unit PSDU is applied is not required.

Although FIG. 24 illustrates that the first electrode of the first sensing transistor RT1 is connected to the first power supply line VDL, the embodiment of the specification is not limited thereto. The first electrode of the first sensing transistor RT1 may be connected to the first initialization line VIL1 or may be connected to the second initialization line VIL2 as shown in FIG. 34, and accordingly, the layouts of FIGS. 26 and 27 may be modified.

Figure 25:
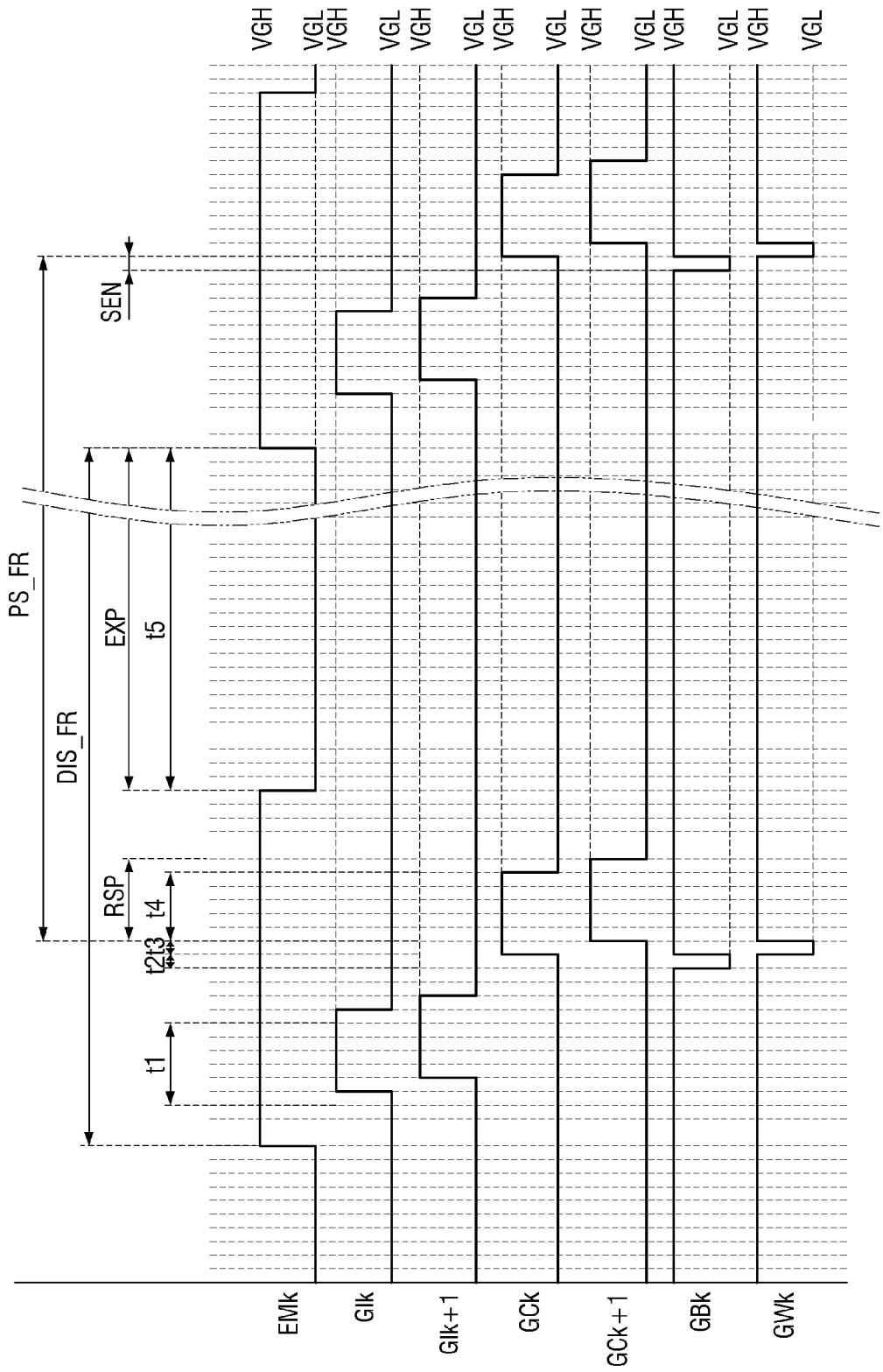
FIG. 25 is a waveform diagram illustrating a $k^{th}$ scan initialization signal, a $k+1^{th}$ scan initialization signal, a $k^{th}$ scan control signal, a $k+1^{th}$ scan control signal, a $k^{th}$ scan write signal, a $k^{th}$ scan bias signal, and a $k^{th}$ light emitting signal applied to a display pixel and a light sensing pixel according to one or more embodiments.

FIG. 25 is a waveform diagram illustrating a $k^{th}$ scan initialization signal, a $k+1^{th}$ scan initialization signal, a $k^{th}$ scan control signal, a $k+1^{th}$ scan control signal, a $k^{th}$ scan write signal, a $k^{th}$ scan bias signal, and a $k^{th}$ light emitting signal applied to a display pixel and a light sensing pixel according to one or more embodiments.

The embodiment of FIG. 25 is different from the embodiment of FIG. 10 in that the $k+1^{th}$ scan initialization signal and the $k+1^{th}$ scan control signal are added. In FIG. 25, a description overlapping with the embodiment of FIG. 10 will be omitted.

Referring to FIG. 25, the $k+1^{th}$ scan initialization signal Glk+1 may be a signal applied to the $k+1^{th}$ scan initialization line GILk+1, and may be a signal for initializing the first node N1 to the first level voltage VGL. The $k+1^{th}$ scan control signal GCk+1 may be a signal applied to the $k+1^{th}$ scan control line GCLk+1, and may be a signal for controlling the turn-on and turn-off of the second sensing transistor RT2". The $k+1^{th}$ scan initialization signal Glk+1 and the $k+1^{th}$ scan control signal GCk+1 may be repeated in one frame period DIS_FR and PS_FR.

Hereinafter, the operation of the light sensing pixel PS during the reset period RSP, the light exposure period EXP, and the sensing period SEN will be described in detail with reference to FIGS. 24 and 25.

The $k+1^{th}$ scan control signal GCk+1 may have the second level voltage VGH during the reset period RSP and may have the first level voltage VGL during the light exposure period EXP and the sensing period SEN. The $k^{th}$ scan bias signal GBk may have the first level voltage VGL during the sensing period SEN and may have the first level voltage VGL during the reset period RSP and the light exposure period EXP.

During the reset period RSP, the $k+1^{th}$ scan control signal GCk+1 having the second level voltage VGH may be supplied to the $k+1^{th}$ scan control line GCLk+1. The second sensing transistor RT2" may be turned-on by the $k+1^{th}$ scan control signal GCk+1 having the second level voltage VGH. Due to the turn-on of the second sensing transistor RT2", the first node N1 may be connected to the $k+1^{th}$ scan initialization line GILk+1. Therefore, the first level voltage VGL of the $k+1^{th}$ scan initialization line GILk+1 may be supplied to the first node N1 during the reset period RSP. Since the first level voltage VGL has a lower potential than the second power voltage VSS, the optical element PD may have a reverse bias state.

During the light exposure period EXP, light emitted from the light emitting element LE may be reflected from the fingerprint of the finger F to be incident on the optical element PD. Accordingly, when light is incident on the optical element PD, photocharges may be generated, and the generated photocharges may be accumulated in the anode electrode of the optical element PD. Accordingly, the voltage of the first node N1 may increase. As the amount of charge accumulated in the first node N1 increases, the voltage of the first node N1 increases, so that the light exposure period EXP may be set to be sufficiently long.

During the sensing period SEN, the $k^{th}$ scan bias signal GBk having the first level voltage VGL may be supplied to the $k^{th}$ scan bias line GBLk. During the sensing period SEN, the third sensing transistor RT3" may be turned-on by the $k^{th}$ scan bias signal GBk having the first level voltage VGL. Due to the turn-on of the third sensing transistor RT3", the sensing current of the first sensing transistor RT1 according to the voltage of the first node N1 may flow to the $q^{th}$ sensing line RLq. The sensor driving circuit 300 may sense the sensing voltage charged in the $q^{th}$ sensing line RLq by the sensing current, whereby the detected fingerprint pattern may be compared with a previously stored fingerprint pattern. For example, fingerprint authentication may be possible using the display device 10.

The operations of the second display pixel PX2, the third display pixel PX3, and the fourth display pixel PX4 may be substantially the same as the operations of the first display pixel PX1 described with reference to FIGS. 24 and 25. Therefore, a description of the operations of the second display pixel PX2, the third display pixel PX3, and the fourth display pixel PX4 will be omitted.

Figure 26:
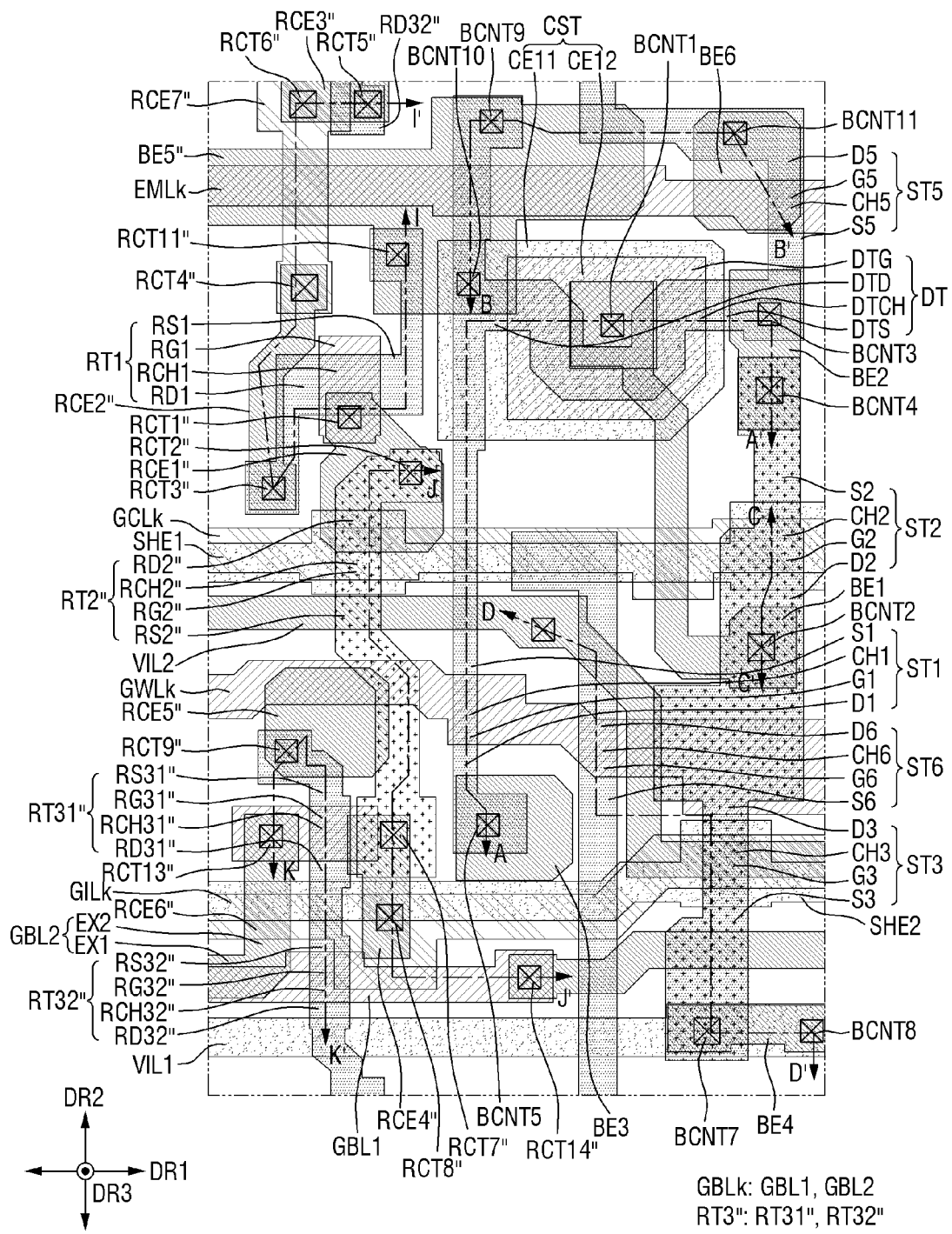
FIG. 26 is a layout diagram illustrating a first active layer, a first gate layer, a second gate layer, a second active layer, a third gate layer, and a first source-drain layer of the first sub-pixel and the light sensing pixel according to one or more embodiments.
Figure 27:
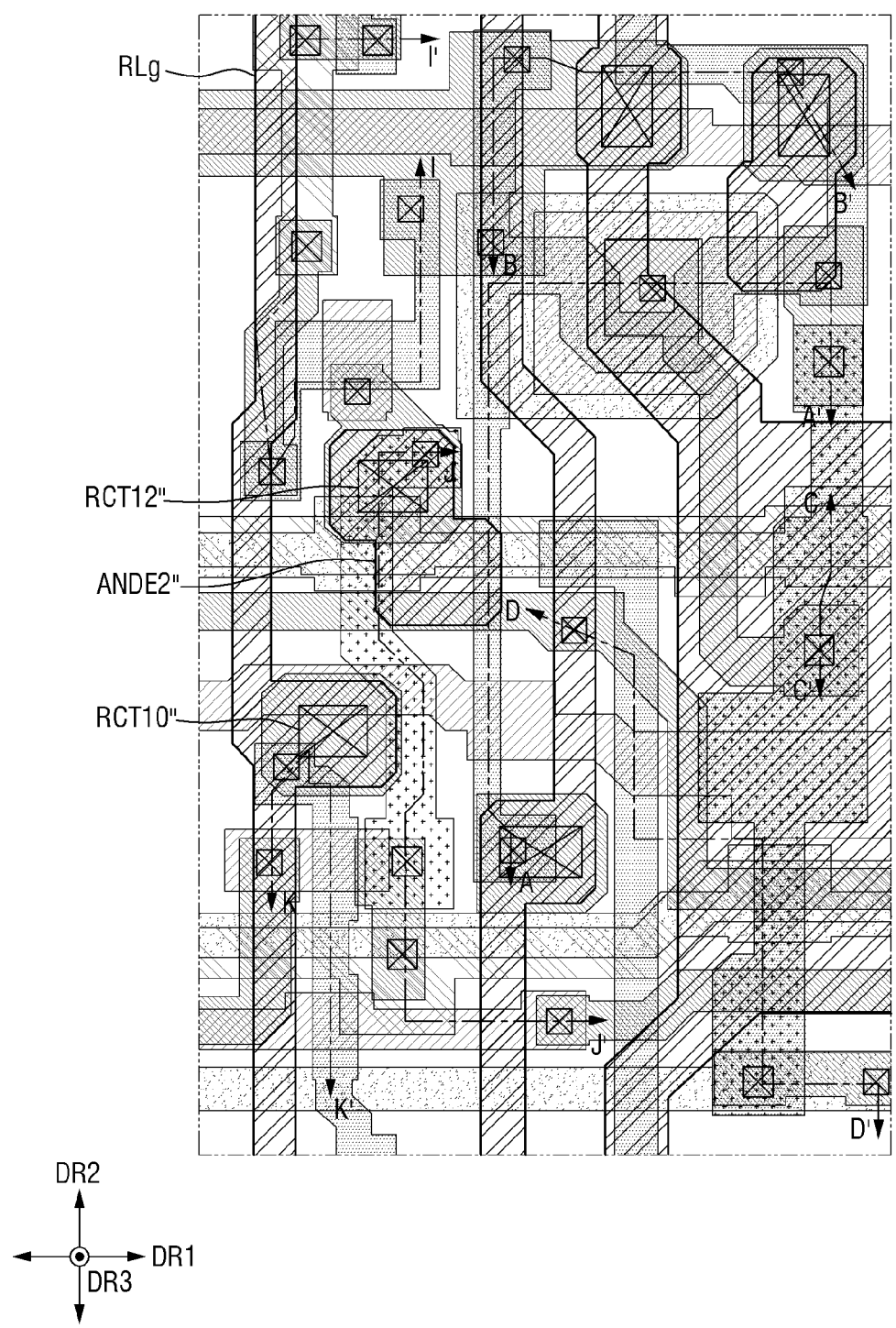
FIG. 27 a layout diagram illustrating a first active layer, a first gate layer, a second gate layer, a second active layer, a third gate layer, a first source-drain layer, and a second source-drain layer of the first sub-pixel and the light sensing pixel according to one or more embodiments.

FIG. 26 is a layout diagram illustrating a first active layer, a first gate layer, a second gate layer, a second active layer, a third gate layer, and a first source-drain layer of the first sub-pixel and the light sensing pixel according to one or more embodiments. FIG. 27 a layout diagram illustrating a first active layer, a first gate layer, a second gate layer, a second active layer, a third gate layer, a first source-drain layer, and a second source-drain layer of the first sub-pixel and the light sensing pixel according to one or more embodiments. In FIGS. 26 and 27, descriptions overlapping those of FIGS. 11 and 12 will be omitted.

Referring to FIGS. 26 and 27, the $k^{th}$ scan bias line GBLk may be extended in the first direction DR1. The $k^{th}$ scan bias line GBLk may include a first line unit GBL1 and a second line unit GBL2. The first line unit GBL1 may be extended in the first direction DR1. The second line unit GBL2 may include a first extension part EX1 extending in the first direction DR1 and a second extension part EX2 extending in the second direction DR2. The first extension part EX1 of the second line unit GBL2 may be connected to the first line unit GBL1 through a fourteenth sensing contact hole RCT14".

The gate electrode RG1 of the first sensing transistor RT1 may be connected to a first sensing connection electrode RCE1" through the first sensing contact hole RCT1". The first sensing connection electrode RCE1" may be connected to a first electrode RS2" of the second sensing transistor RT2" through a second sensing contact hole RCT2". The first sensing connection electrode RCE1" may be connected to a second anode connection electrode ANDE2" through a twelfth sensing contact hole RCT12". The first electrode of the optical element PD may be connected to the second anode connection electrode ANDE2" through the second anode contact hole.

The first electrode RS1 of the first sensing transistor RT1 may be connected to a fifth connection electrode BE5" through an eleventh sensing contact hole RCT11". The second electrode RD1 of the first sensing transistor RT1 may be connected to a second sensing connection electrode RCE2" through a third sensing contact hole RCT3". The second sensing connection electrode RCE2" may be connected to a seventh sensing connection electrode RCE7" through a fourth sensing contact hole RCT4".

A gate electrode RG2" of the second sensing transistor RT2" may be integrally formed with the $k^{th}$ scan control line GCLk. The gate electrode RG2" of the second sensing transistor RT2" may be a part of the $k^{th}$ scan control line GCLk.

The first electrode RS2" of the second sensing transistor RT2" may be connected to a fourth sensing connection electrode RCE4" through a seventh sensing contact hole RCT7". The fourth sensing connection electrode RCE4" may be connected to the $k^{th}$ scan initialization line GILk through an eighth sensing contact hole RCT8". A second electrode RD2" of the second sensing transistor RT2" may be connected to the first sensing connection electrode RCE1" through the second sensing contact hole RCT2".

The third sensing transistor RT3" may include the first sub-transistor RT31" and the second sub-transistor RT32".

The first sub-transistor RT31" may be connected to a channel layer RCH31", a gate electrode RG31", a first electrode RS31", and a second electrode RD31". The channel layer RCH31 "of the first sub-transistor RT31" may overlap the gate electrode RG31" of the first sub-transistor RT31". The gate electrode RG31" of the first sub-transistor RT31" may be disposed on the channel layer RCH31" of the first sub-transistor RT31 ".

The gate electrode RG31" of the first sub-transistor RT31" may be connected to the second extension part EX2 of the second line unit GBL2 of the $k^{th}$ scan bias line GBLk through a thirteenth sensing contact hole RCT13".

The first electrode RS31" of the first sub-transistor RT31" may be connected to a fifth sensing connection electrode RCE5" through a ninth sensing contact hole RCT9". The fifth sensing connection electrode RCE5" may be connected to the $q^{th}$ sensing line RLq through a tenth sensing contact hole RCT10". The second electrode RD31" of the first sub-transistor RT31" may be connected to the first electrode RS32" of the second sub-transistor RT32 ".

The second sub-transistor RT32" may be connected to a channel layer RCH32", a gate electrode RG32", a first electrode RS32", and a second electrode RD32". The channel layer RCH32" of the second sub-transistor RT32" may overlap the gate electrode RG32" of the second sub-transistor RT32". The gate electrode RG32" of the second sub-transistor RT32" may be disposed on the channel layer RCH32" of the second sub-transistor RT32".

The gate electrode RG32" of the second sub-transistor RT32" may be integrally formed with the first line unit GBL1 of the $k^{th}$ scan bias line GBLk. The gate electrode RG32" of the second sub-transistor RT32" may be a part of the first line unit GBL1 of the $k^{th}$ scan bias line GBLK.

The second electrode RD32" of the second sub-transistor RT32" may be connected to a third sensing connection electrode RCE3" through a fifth sensing contact hole RCT5". The third sensing connection electrode RCE3" may be connected to the seventh sensing connection electrode RCE7" through a sixth sensing contact hole RCT6". The seventh sensing connection electrode RCE7" may be connected to the second sensing connection electrode RCE2" through the fourth sensing contact hole RCT4". The second sensing connection electrode RCE2" may be connected to the second electrode RD1 of the first sensing transistor RT1. Accordingly, the second electrode RD32" of the second sub-transistor RT32" may be connected to the second electrode RD1 of the first sensing transistor RT1.

Since the first electrode RS32" of the second sub-transistor RT32" extends in the second direction DR2, it may be disposed in the sensing driving unit PSDU disposed in the $k^{th}$ and $k+1^{th}$ rows. Accordingly, the first electrode RS32" of the second sub-transistor RT32" disposed in the sensing driving unit PSDU of the $k^{th}$ row may be connected to the second electrode RD1 of the sensing transistor RT1 disposed in the sensing driving unit PSDU of the $k+1^{th}$ row. The first electrode RS32" of the second sub-transistor RT32" disposed in the sensing driving unit PSDU of the $k^{th}$ row may be connected to the $k^{th}$ scan bias line GBLk.

Since the second pixel driving unit PDU2, the third pixel driving unit PDU3, and the fourth pixel driving unit PDU4 are substantially the same as the first pixel driving unit PDU1 described with reference to FIGS. 26 and 27, a description of these will be omitted.

Figure 28:
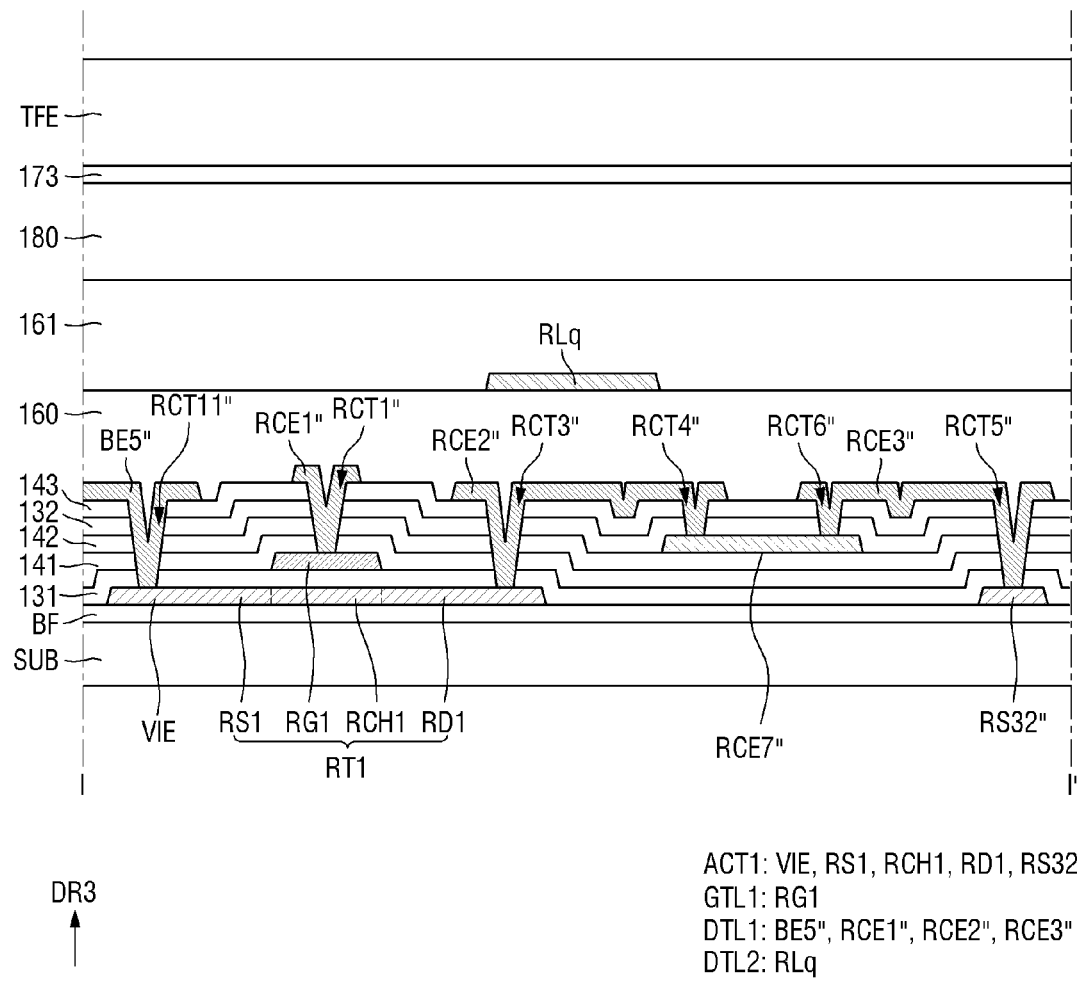
FIG. 28 is a schematic cross-sectional view illustrating an embodiment of the display panel taken along line I-I' of FIGS. 26 and 27.
Figure 29:
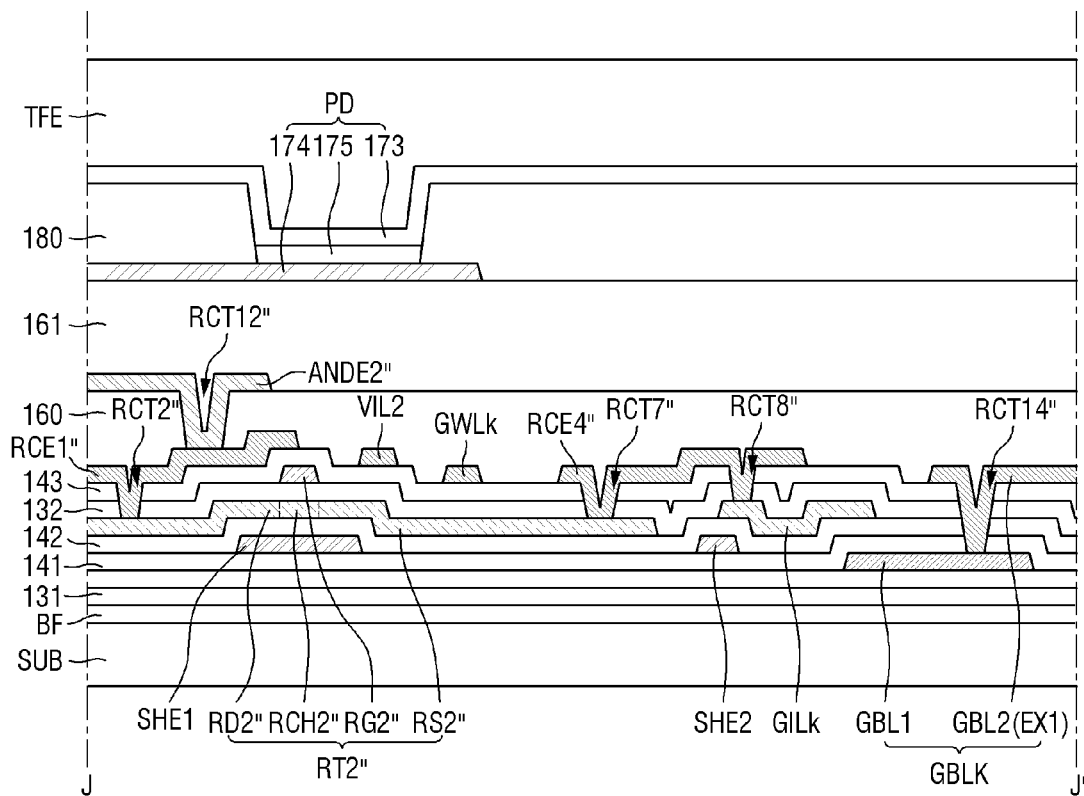
FIG. 29 is a schematic cross-sectional view illustrating an embodiment of the display panel taken along line J-J' of FIGS. 26 and 27.
Figure 30:
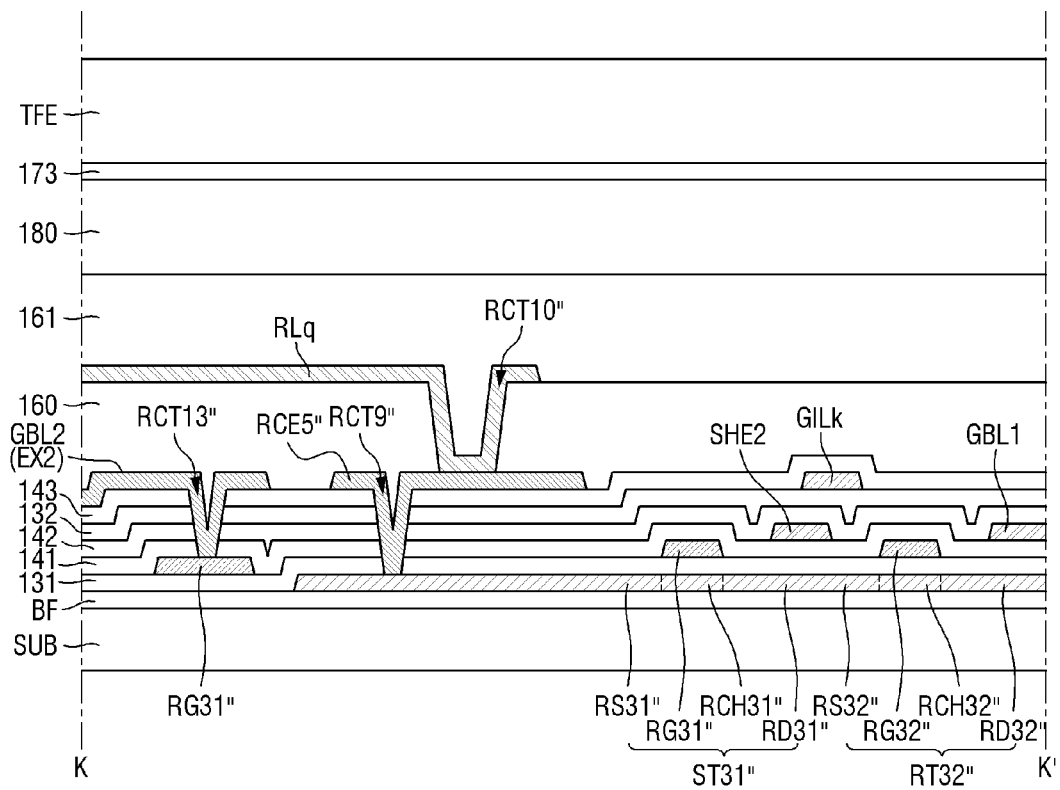
FIG. 30 is a schematic cross-sectional view illustrating an embodiment of the display panel taken along line K-K' of FIGS. 26 and 27.

FIG. 28 is a schematic cross-sectional view illustrating an embodiment of the display panel taken along line I-I' of FIGS. 26 and 27. FIG. 29 is a schematic cross-sectional view illustrating an embodiment of the display panel taken along line J-J' of FIGS. 26 and 27. FIG. 30 is a schematic cross-sectional view illustrating an embodiment of the display panel taken along line K-K' of FIGS. 26 and 27.

In FIGS. 28 to 30, a description overlapping those of FIGS. 16 and 17 will be omitted.

Referring to FIGS. 28 to 30, the first active layer ACT1 may include the channel layers RCH31" and RCH32", the first electrodes RS31" and RS32", and the second electrodes RD31" and RD32" of the sub-transistors RT31" and RT32".

The channel layer RCH31" of the first sub-transistor RT31" may be an area overlapping the gate electrode RG31" of the first sub-transistor RT31" in the third direction DR3. The first electrode RS31" of the first sub-transistor RT31" may be disposed on a side of the channel layer RCH31", and the second electrode RD31" may be disposed on another side of the channel layer RCH31". The first electrode RS31" and the second electrode RD31" of the first sub-transistor RT31" may be areas that do not overlap the gate electrode RG31" in the third direction DR3. The first electrode RS31" and the second electrode RD31" of the first sub-transistor RT31" may be an area having conductivity by doping the silicon semiconductor with ions or impurities.

The channel layer RCH32" of the second sub-transistor RT32" may be an area overlapping the gate electrode RG32" of the second sub-transistor RT32" in the third direction DR3. The first electrode RS32" of the second sub-transistor RT32" may be disposed on a side of the channel layer CH32", and the second electrode RD32" of the second sub-transistor RT32" may be disposed on another side of the channel layer RCH32". The first electrode RS32" and the second electrode RD32" of the second sub-transistor RT32" may be areas that do not overlap the gate electrode RG32" in the third direction DR3. The first electrode RS32" and the second electrode RD32" of the second sub-transistor RT32" may be areas having conductivity by doping the silicon semiconductor with ions or impurities.

The first gate layer GTL1 may include the gate electrode RG31" of the first sub-transistor RT31", the gate electrode RG32" of the second sub-transistor RT32" and the first line unit GBL1 of the $k^{th}$ scan bias line GBLk. The first data metal layer DTL1 may include the second line unit GBL2 of the $k^{th}$ scan bias line GBLk.

The third sensing contact hole RCT3" may be a hole exposing the second electrode RD1 of the first sensing transistor RT1 penetrating the first gate insulating layer 131, the first interlayer insulating layer 141, the second interlayer insulating layer 142, the second gate insulating layer 132, and the third interlayer insulating layer 143. The fourth sensing contact hole RCT4" may be a hole exposing the seventh sensing connection electrode RCE7" penetrating the second gate insulating layer 132 and the third interlayer insulating layer 143. The second sensing connection electrode RCE2" may be connected to the second electrode RD1 of the first sensing transistor RT1 through the third sensing contact hole RCT3", and may be connected to the seventh sensing connection electrode RCE7" through the fourth sensing contact hole RCT4".

The fifth sensing contact hole RCT5" may be a hole exposing the first electrode RS32" of the second sub-transistor RT32" penetrating the first gate insulating layer 131, the first interlayer insulating layer 141, the second interlayer insulating layer 142, the second gate insulating layer 132, and the third interlayer insulating layer 143. The sixth sensing contact hole RCT6" may be a hole exposing the seventh sensing connection electrode RCE7" penetrating the second gate insulating layer 132 and the third interlayer insulating layer 143. The third sensing connection electrode RCE3" may be connected to the first electrode RS32" of the second sub-transistor RT32" through the fifth sensing contact hole RCT5", and may be connected to the seventh sensing connection electrode RCE7" through the sixth sensing contact hole RCT6".

The seventh sensing contact hole RCT7" may be a hole exposing the first electrode RS2" of the second sensing transistor RT2" penetrating the second gate insulating layer 132 and the third interlayer insulating layer 143. The eighth sensing contact hole RCT8" may be a hole exposing the scan initialization line GILk penetrating the third interlayer insulating layer 143. The fourth sensing connection electrode RCE4" may be connected to the first electrode RS2" of the second sensing transistor RT2" through the seventh sensing contact hole RCT7", and may be connected to the scan initialization line GILk through the eighth sensing contact hole RCT8".

The ninth sensing contact hole RCT9" may be a hole exposing the first electrode RS31" of the first sub-transistor SRT31" penetrating the first gate insulating layer 131, the first interlayer insulating layer 141, the second interlayer insulating layer 142, the second gate insulating layer 132, and the third interlayer insulating layer 143. The tenth sensing contact hole RCT10" may be a hole exposing the fifth sensing connection electrode RCE5" penetrating the first organic layer 160. The fifth sensing connection electrode RCE5" may be connected to the first electrode RS31" of the first sub-transistor SRT31" through the ninth sensing contact hole RCT9", and the $q^{th}$ sensing line RLq may be connected to the fifth sensing connection electrode RCE5" through the tenth sensing contact hole RCT10".

The thirteenth sensing contact hole RCT13" may be a hole exposing the gate electrode RG31" of the first sub-transistor RT31" penetrating the first interlayer insulating layer 141, the second interlayer insulating layer 142, the second gate insulating layer 132, and the third interlayer insulating layer 143. A fourteenth sensing contact hole RCT14" may be a hole exposing the first line unit GBL1 of the $k^{th}$ scan bias line GBLk penetrating the first interlayer insulating layer 141, the second interlayer insulating layer 142, the second gate insulating layer 132, and the third interlayer insulating layer 143. The second line unit GBL2 of the $k^{th}$ scan bias line GBLk may be connected to the gate electrode RG31" of the first sub-transistor RT31" through the thirteenth sensing contact hole RCT13", and may be connected to first line unit GBL1 of the $k^{th}$ scan bias line GBLk through the fourteenth sensing contact hole RCT14".

As shown in FIG. 24, the driving transistor DT, the first transistor ST1, and the fourth to sixth transistors ST4 to ST6 of the first pixel driving unit PDU1 may be formed of a P-type MOSFET including the first active layer ACT1 having a silicon semiconductor while the second transistor ST2 and the third transistor ST3 may be formed of an N-type MOSFET including the second active layer ACT2 having an oxide semiconductor. For this reason, the first sensing transistor RT1 and the third sensing transistor RT3" of the sensing driving unit PSDU may be formed of a P-type MOSFET including the first active layer ACT1, and the second sensing transistor RT2" of the sensing driving unit PSDU may be formed of an N-type MOSFET including the second active layer ACT2 without adding a separate process. Therefore, it is possible to reduce a decrease in the finger-print sensing ability due to the off-leakage current of the second sensing transistor RT2".

Since an embodiment of the display panel cut along line A-A', an embodiment of the display panel cut along line B-B', an embodiment of the display panel cut along line C-C', and an embodiment of the display panel cut along D-D' of FIGS. 26 and 27 are substantially the same as those described with reference to FIGS. 13 to 15, a description thereof will be omitted.

Figure 31:
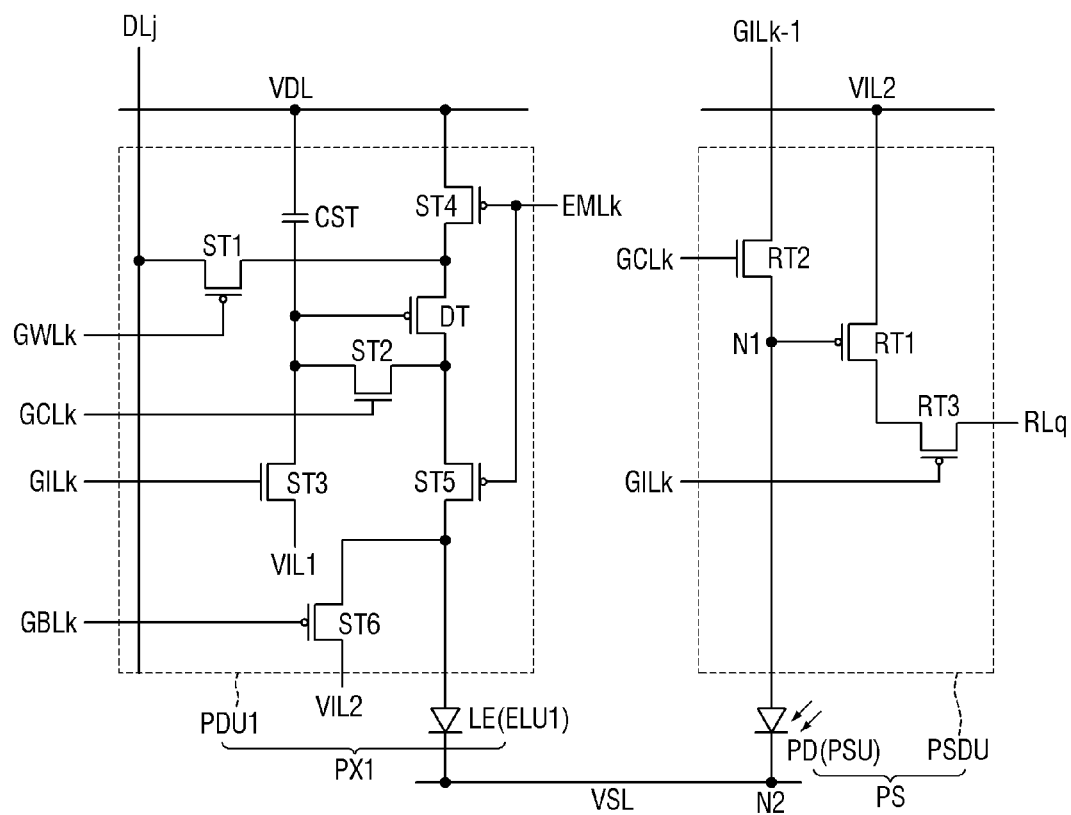
FIG. 31 is a schematic diagram of an equivalent pixel of a display pixel and a light sensing pixel according to one or more embodiments.

FIG. 31 is a schematic diagram of an equivalent circuit of a display pixel and a light sensing pixel according to one or more embodiments.

The embodiment of FIG. 31 is different from the embodiment of FIG. 9 in that the first electrode of the first sensing transistor RT1 may be connected to the second initialization line VIL2 instead of the first power supply line VDL. In FIG. 31, a description overlapping with the embodiment of FIG. 9 will be omitted.

Referring to FIG. 31, since the first electrode of the first sensing transistor RT1 is connected to the second initialization line VIL2, during the sensing period SEN, the sensing current of the first sensing transistor RT1 according to the voltage of the first node N1 may flow from the second initialization line VIL2 to which the first electrode of the first sensing transistor RT1 is connected to the $q^{th}$ sensing line RLq.

Figure 32:
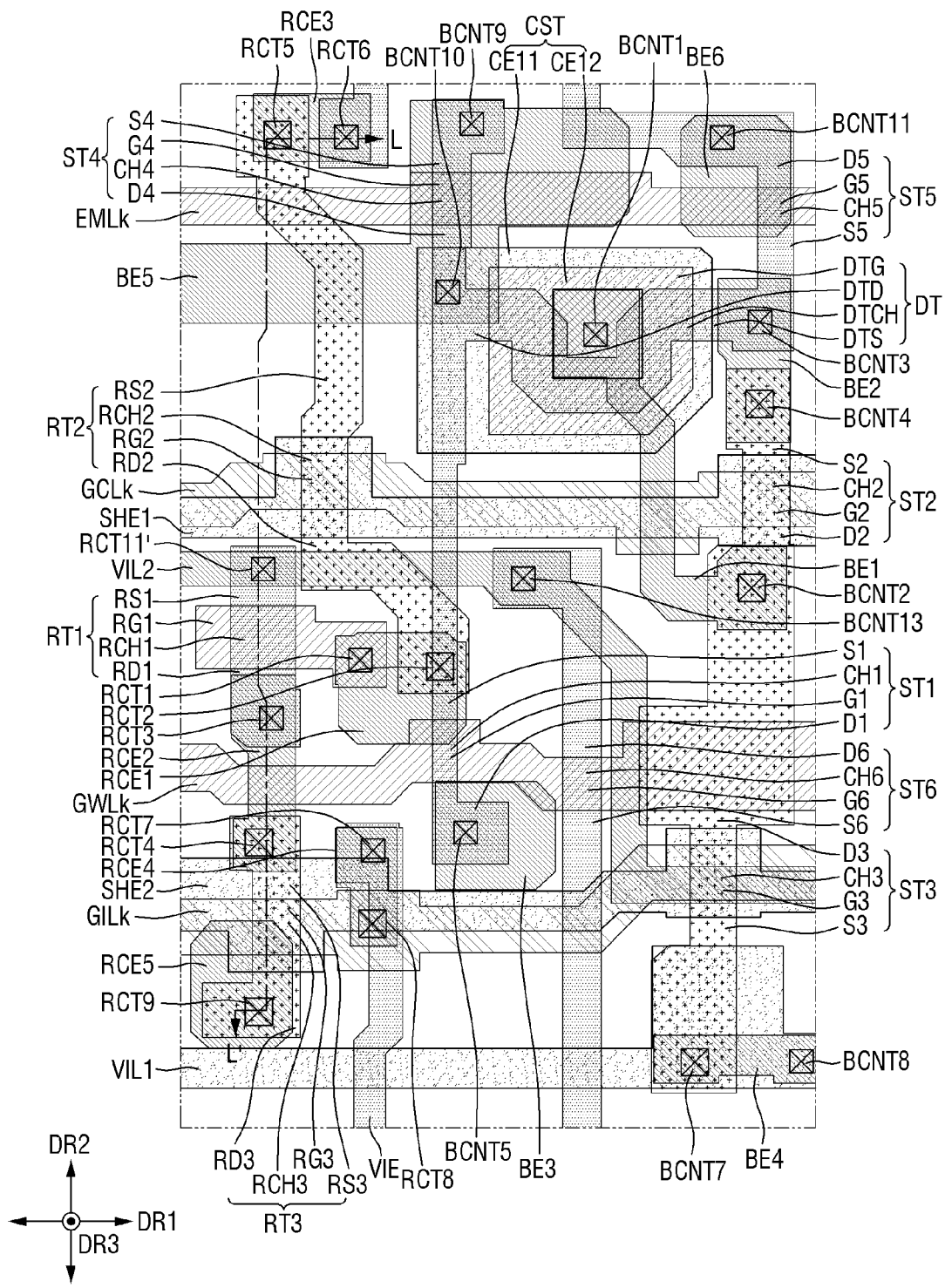
FIG. 32 is a layout diagram illustrating a first active layer, a first gate layer, a second gate layer, a second active layer, a third gate layer, and a first source-drain layer of the first sub-pixel and the light sensing pixel according to one or more embodiments.
Figure 33:
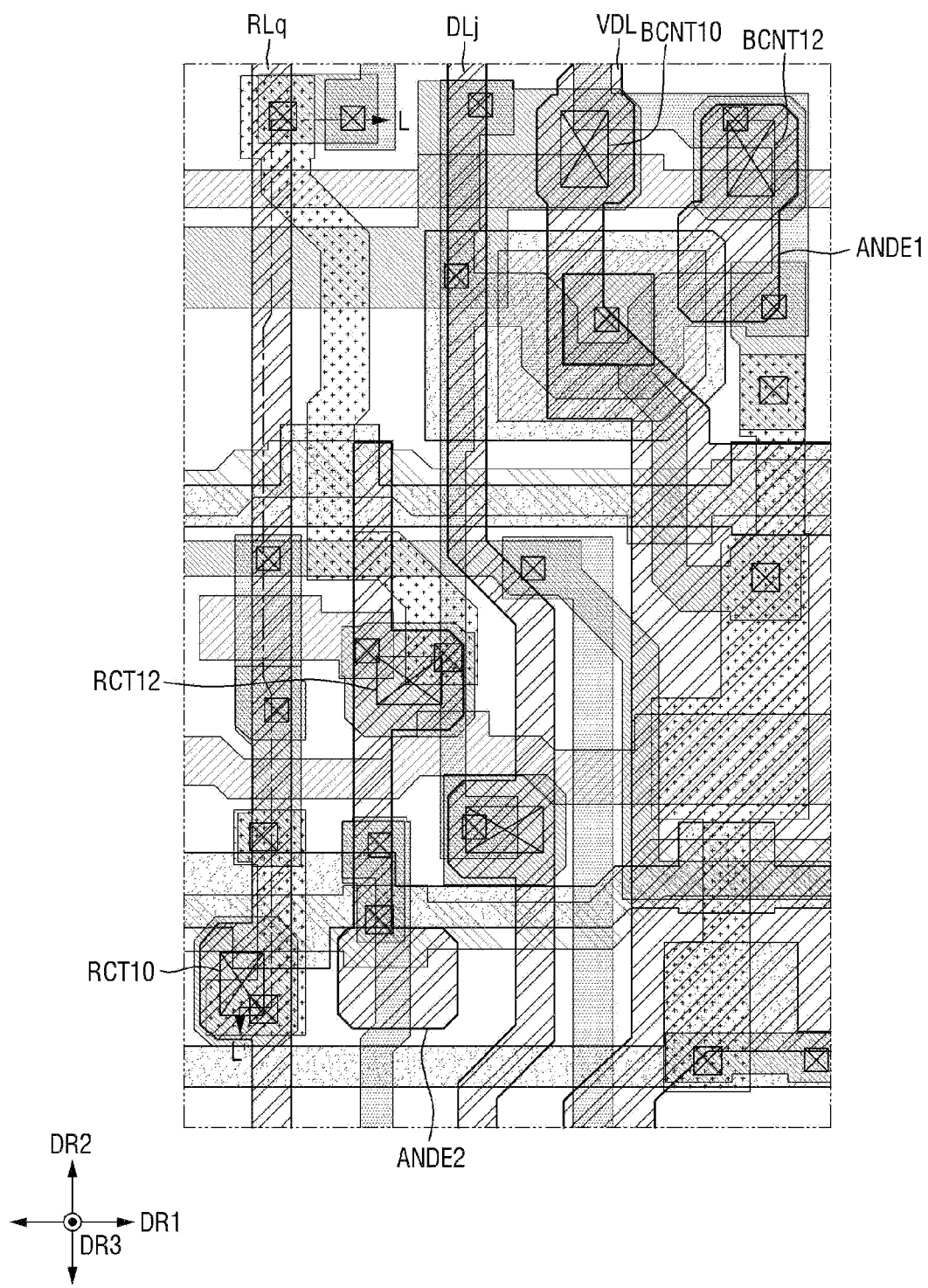
FIG. 33 a layout diagram illustrating a first active layer, a first gate layer, a second gate layer, a second active layer, a third gate layer, a first source-drain layer, and a second source-drain layer of the first sub-pixel and the light sensing pixel according to one or more embodiments.

FIG. 32 is a layout diagram illustrating a first active layer, a first gate layer, a second gate layer, a second active layer, a third gate layer, and a first source-drain layer of the first sub-pixel and the light sensing pixel according to one or more embodiments. FIG. 33 a layout diagram illustrating a first active layer, a first gate layer, a second gate layer, a second active layer, a third gate layer, a first source-drain layer, and a second source-drain layer of the first sub-pixel and the light sensing pixel according to one or more embodiments. FIG. 34 is a schematic cross-sectional view illustrating an embodiment of the display panel taken along line L-L' of FIGS. 32 and 33.

FIGS. 32 to 34 are different from the embodiments of FIGS. 11, 12 and 17 in that the first electrode RS1 of the first sensing transistor RT1 may be connected to the second initialization line VIL2 through the eleventh sensing contact hole RCT11'. The eleventh sensing contact hole RCT11' may be a hole exposing the first electrode RS1 of the first sensing transistor RT1 penetrating the gate insulating layers 131 and 132 and the interlayer insulating layers 141, 142, and 143.

Although FIGS. 31 to 34 illustrate that the first electrode of the first sensing transistor RT1 is connected to the second initialization line VIL2, the embodiment of the specification may not be limited thereto. For example, the first electrode of the first sensing transistor RT1 may be connected to the first initialization line VIL1. Since the first electrode of the first sensing transistor RT1 is extended from the second direction DR2 to the first initialization line VIL1, it may overlap the first shielding electrode SHE1, the scan control line GCLk, the light emitting line EMLk and the third sensing connection electrode RCE3.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising: display pixels each including a light emitting part including a light emitting element and a pixel driver applying a driving current to the light emitting element; and light sensing pixels each including a light sensing part including an optical element and a sensing driver, the sensing driver applying a sensing current to a sensing line according to a photocurrent of the optical element, wherein the sensing driver comprises: a first sensing transistor controlling the sensing current flowing through the sensing line according to a voltage of a first electrode of the optical element; and a second sensing transistor initializing the first electrode of the optical element to a first level voltage, wherein a channel layer of the first sensing transistor and a channel layer of the second sensing transistor are made of different materials, the channel layer of the first sensing transistor is overlapped by a gate electrode of the first sensing transistor in plan view that controls an amount of the sensing current, and the channel layer of the second sensing transistor is overlapped by a gate electrode of the second sensing transistor in plan view.

2. The display device of claim 1, wherein
the channel layer of the first sensing transistor is made of polysilicon, and
the channel layer of the second sensing transistor is made of an oxide semiconductor.

3. The display device of claim 1, wherein
the first sensing transistor is formed of a P-type MOSFET, and
the second sensing transistor is formed of an N-type MOSFET.

4. The display device of claim 1, wherein
the sensing driver further comprises a third sensing transistor applying the sensing current of the first sensing transistor to the sensing line, and
a channel layer of the third sensing transistor and the channel layer of the second sensing transistor are made of a same material.

5. The display device of claim 4, wherein the channel layer of the third sensing transistor is formed of an oxide semiconductor.

6. The display device of claim 4, wherein the third sensing transistor is formed of an N-type MOSFET.

7. The display device of claim 4, further comprising:
scan write lines to which scan write signals are respectively applied;
scan initialization lines to which scan initialization signals are respectively applied; and
scan control lines to which scan control signals are respectively applied,
wherein the second sensing transistor electrically connects the first electrode of the optical element to a $k\text{-}1^{th}$ scan initialization line among the scan initialization lines according to a $k^{th}$ scan control signal of a $k^{th}$ (k is a positive integer of 2 or more) scan control line.

8. The display device of claim 7, wherein the third sensing transistor electrically connects a first electrode of the first sensing transistor to the sensing line according to a $k^{th}$ scan initialization signal of a $k^{th}$ scan initialization line among the scan initialization lines.

9. The display device of claim 8, wherein the pixel driver comprises:
a driving transistor controlling the driving current according to a voltage of a gate electrode of the driving transistor;
a first transistor applying a data voltage of a data line to a first electrode of the driving transistor according to a $k^{th}$ scan write signal of a $k^{th}$ scan write line among the scan write lines;
a second transistor electrically connecting the gate electrode of the driving transistor and a second electrode of the driving transistor according to the $k^{th}$ scan control signal of the k scan control line; and
a third transistor applying a first initialization voltage of a first initialization line to the gate electrode of the driving transistor according to the $k^{th}$ scan initialization signal of the $k^{th}$ scan initialization line.

10. The display device of claim 1, wherein
the sensing driver further comprises a third sensing transistor applying the sensing current of the first sensing transistor to the sensing line, and
a channel layer of the third sensing transistor and the channel layer of the first sensing transistor are made of a same material.

11. The display device of claim 10, wherein the channel layer of the third sensing transistor is made of polysilicon.

12. The display device of claim 10, wherein the third sensing transistor is formed of a P-type MOSFET.

13. The display device of claim 10, further comprising:
scan write lines to which scan write signals are respectively applied;
scan initialization lines to which scan initialization signals are respectively applied;
scan control lines to which scan control signals are respectively applied; and
light emitting lines to which light emitting signals are respectively applied, wherein
the second sensing transistor electrically connects the first electrode of the optical element to a k-1$^{th}$ scan initialization line among the scan initialization lines according to a k$^{th}$ scan control signal of a k$^{th}$ (k is a positive integer greater than or equal to 2) scan control line among the scan control lines, and
the third sensing transistor electrically connects a first electrode of the first sensing transistor to the sensing line according to a k+1$^{th}$ light emitting signal of a k+1$^{th}$ light emitting line among the light emitting lines.

14. The display device of claim 13, wherein the pixel driver comprises:
a driving transistor controlling the driving current according to a voltage of a gate electrode of the driving transistor;
a first transistor applying a data voltage of a data line to a first electrode of the driving transistor according to a k$^{th}$ scan write signal of a k$^{th}$ scan write line among the scan write lines;
a second transistor electrically connecting the gate electrode of the driving transistor and a second electrode of the driving transistor according to the k$^{th}$ scan control signal of the k$^{th}$ scan control line;
a third transistor applying a first initialization voltage of a first initialization line to the gate electrode of the driving transistor according to a k$^{th}$ scan initialization signal of a k$^{th}$ scan initialization line among the scan initialization lines; and
a fourth transistor electrically connecting the first electrode of the driving transistor to a first power supply line to which a first power voltage is applied according to a k$^{th}$ light emitting signal of a k$^{th}$ light emitting line among the light emitting lines.

15. The display device of claim 10, further comprising:
scan write lines to which scan write signals are respectively applied;
scan initialization lines to which scan initialization signals are respectively applied;
scan control lines to which scan control signals are respectively applied; and
scan bias lines to which scan bias signals are respectively applied, wherein
the second sensing transistor electrically connects the first electrode of the optical element to a k+1$^{th}$ scan initialization line among the scan initialization lines according to a k+1$^{th}$ scan control signal of a k+1$^{th}$ (k is a positive integer greater than or equal to 2) scan control line among the scan control lines, and
the third sensing transistor electrically connects a first electrode of the first sensing transistor to the sensing line according to a k$^{th}$ scan bias signal among the scan bias lines.

16. The display device of claim 15, wherein the pixel driver comprises:
a driving transistor controlling the driving current according to a voltage of a gate electrode of the driving transistor;
a first transistor applying a data voltage of a data line to a first electrode of the driving transistor according to a k$^{th}$ scan write signal of a k$^{th}$ scan write signal among the scan write lines;
a second transistor electrically connecting the gate electrode of the driving transistor and a second electrode of the driving transistor according to a k$^{th}$ scan control signal of a k$^{th}$ scan control line among the scan control lines;
a third transistor applying a first initialization voltage of a first initialization line to the gate electrode of the driving transistor according to a k$^{th}$ scan initialization signal of a k$^{th}$ scan initialization line among the scan initialization lines; and
a fourth transistor applying a second initialization voltage of a second initialization line to a first electrode of the light emitting element according to the k$^{th}$ scan bias signal.

17. The display device of claim 1, wherein the sensing driver of one of the light sensing pixels is disposed on a side of the pixel driver of one of the display pixels.

18. The display device of claim 17, further comprising:
scan write lines, scan initialization lines, scan control lines, and light emitting lines extending in a first direction; and
data lines and sensing lines extending in a second direction intersecting the first direction, wherein
the sensing driver and the pixel driver overlap one of the scan write lines, one of the scan initialization lines, one of the scan control lines, and one of the light emitting lines in a third direction intersecting the first direction and the second direction,
the sensing driver overlaps one of the sensing lines in the third direction, and
the pixel driver overlaps one of the data lines in the third direction.

19. The display device of claim 1, wherein the sensing driver of one of the light sensing pixels is disposed on a side of the pixel driver of each of two display pixels that are adjacent to each other in an extension direction of the sensing line.

20. The display device of claim 19, further comprising:
scan write lines, scan initialization lines, scan control lines, and light emitting lines extending in a first direction; and
data lines and sensing lines extending in a second direction intersecting the first direction,
wherein the sensing driver overlaps two of the scan write lines, two of the scan initialization lines, two of the scan control lines, and two of the light emitting lines in a third direction intersecting the first direction and the second direction.

21. The display device of claim 1, wherein
the gate electrode of the first sensing transistor is directly connected to the first electrode of the optical element, and
the first electrode of the optical element is an anode.

22. The display device of claim 1, wherein
the first sensing transistor is formed of a P-type MOSFET with the channel layer of the first sensing transistor being made of polysilicon, and the second sensing transistor is formed of an N-type MOSFET with the channel layer of the second sensing transistor is made of an oxide semiconductor.

\* \* \* \* \*